(12) United States Patent
Terai et al.

(10) Patent No.: US 9,172,039 B2
(45) Date of Patent: Oct. 27, 2015

(54) METHODS OF FABRICATING MEMORY DEVICES

(71) Applicant: Samsung Electronics Co., Ltd., Suwon-si (KR)

(72) Inventors: Masayuki Terai, Suwon-si (KR); In-Gyu Baek, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/449,425

(22) Filed: Aug. 1, 2014

(65) Prior Publication Data

US 2015/0194603 A1 Jul. 9, 2015

(30) Foreign Application Priority Data

Jan. 3, 2014 (KR) .................. 10-2014-0000870

(51) Int. Cl.
*H01L 21/336* (2006.01)
*H01L 45/00* (2006.01)
*H01L 27/24* (2006.01)

(52) U.S. Cl.
CPC ............ *H01L 45/16* (2013.01); *H01L 27/2436* (2013.01); *H01L 45/1253* (2013.01)

(58) Field of Classification Search
USPC .......................................... 438/258; 365/148
See application file for complete search history.

(56) References Cited

U.S. PATENT DOCUMENTS

| | | | |
|---|---|---|---|
| 7,381,616 B2 | 6/2008 | Hsu | |
| 8,179,739 B2 | 5/2012 | Hanzawa et al. | |
| 8,467,229 B2 * | 6/2013 | Ikeda et al. | 365/148 |
| 2010/0096613 A1 * | 4/2010 | Morikawa et al. | 257/4 |
| 2010/0265757 A1 * | 10/2010 | Otsuka | 365/148 |
| 2012/0112156 A1 | 5/2012 | Park et al. | |
| 2012/0286232 A1 | 11/2012 | Lambertson et al. | |
| 2014/0242764 A1 * | 8/2014 | Scheuerlein | 438/268 |
| 2014/0254242 A1 * | 9/2014 | Siau | 365/148 |

FOREIGN PATENT DOCUMENTS

JP       2011-071380       4/2011

* cited by examiner

*Primary Examiner* — Asok K Sarkar
(74) *Attorney, Agent, or Firm* — Myers Bigel Sibley & Sajovec, PA

(57) ABSTRACT

Provided is a method of fabricating a memory device. The method includes defining a cell region and a driving region on a substrate, forming driving transistors on the driving region, forming a first bit line in the cell region, a first unit memory cell disposed on an upper surface of the first bit line, a word line disposed on upper surfaces of the first unit memory cells, and a second unit memory cell disposed on an upper surface of the word line, forming a planarization layer configured to fill between the second unit memory cells, and including second bit line grooves on the upper surfaces of the first bit lines, bit line contact vias in the second bit line grooves, floating electrode grooves on upper surfaces of ends of the word lines, and a first floating contact via and a second floating contact via in each of the floating electrode grooves, simultaneously forming second bit lines in the second bit line grooves, bit line contact electrodes in the bit line contact vias, floating electrodes in the floating electrode grooves, first floating contact electrodes in the first floating contact vias, and second floating contact electrodes in the second floating contact vias.

15 Claims, 56 Drawing Sheets

METHODS OF FABRICATING MEMORY DEVICES

REFERENCE TO PRIORITY APPLICATION

This application claims priority under 35 U.S.C. §119 to Korean Patent Application No. 10-2014-0000870 filed on Jan. 3, 2014, the disclosure of which is hereby incorporated herein by reference in its entirety.

BACKGROUND

1. Field

Embodiments of the inventive concept relate to a method of fabricating a variable resistance memory device that is a non-volatile memory device.

2. Description of Related Art

A variable resistance memory device may include a cell region which performs operations of reading and writing data, and a peripheral region located around the cell region and in which a driving unit is formed (e.g., in a driving region) to selectively drive each cell region.

When unit memory cells are formed in the cell region in a vertical direction, word lines and bit lines which are connected to each of the memory cells and located at different heights are electrically connected to driving transistors formed on the same plane through contact electrodes having different heights from each other.

Here, when contact electrodes are formed to connect the bit lines and the word lines with the driving transistors, various techniques are being proposed to reduce the number of mask processes.

SUMMARY

Embodiments of the inventive concept provide a method of fabricating a memory device capable of reducing the number of processes and steps for fabricating a memory device and improving a process yield. Other embodiments of the inventive concept provide a method of fabricating a memory device which forms contact electrodes that electrically connect signal lines (bit lines and word lines) located at different heights from each other to driving transistors formed on the same plane, and the signal lines located at the uppermost layer in a single process to reduce the number of processes. Other embodiments of the inventive concept provide a method of fabricating a memory device including a dual damascene process in order to form contact electrodes and the uppermost signal lines in a single process.

In accordance with an aspect of the inventive concept, a method of fabricating a memory device may include defining a cell region and a driving region on a substrate, forming driving transistors in the driving region, forming a first bit line in the cell region, a first unit memory cell disposed on an upper surface of the first bit line, a word line disposed on upper surfaces of the first unit memory cells, and a second unit memory cell disposed on an upper surface of the word line, forming a planarization layer configured to fill between the second unit memory cells, and including second bit line grooves on the upper surfaces of the first bit lines, bit line contact vias in the second bit line grooves, floating electrode grooves on upper surfaces of an ends of the word lines, and a first floating contact via and a second floating contact via in each of the floating electrode grooves, simultaneously forming second bit lines in the second bit line grooves, bit line contact electrodes in the bit line contact vias, floating electrodes in the floating electrode grooves, first floating contact electrodes in the first floating contact vias, and second floating contact electrodes in the second floating contact vias.

In another embodiment, the forming of the driving transistor may include forming first driving transistors that are spaced from an end of the second bit line, forming second driving transistors that are spaced from an end of the word lines, and forming third driving transistors that are spaced from the first driving transistors in a horizontal direction and adjacent to an end of the first bit lines. In another embodiment, each of the first driving transistor, the second driving transistor, and the third driving transistor may include an active pattern, a gate electrode, a first source/drain electrode, and a second source/drain electrode.

In still another embodiment, the bit line contact electrode may be formed to connect the second bit line with the first source/drain electrode of the first driving transistor, the first floating contact electrode may be formed to connect the floating electrode with the word line, and the second floating contact electrode may be formed so that the floating electrode is in contact with the first source/drain electrode of the second driving transistor.

In yet another embodiment, the forming of the first unit memory cell may include forming a first diode and a first variable resistance device connected in series between the first bit line and the word line, and the forming of the second unit memory cell comprises forming a second variable resistance device and a second diode connected in series between the word line and the second bit line.

In yet another embodiment, the forming of the first bit lines, the first diodes, the first variable resistance devices, and the word lines may include stacking a first metal layer, a first impurity layer, a second impurity layer, a first electrode layer, a first resistance layer, and a second electrode layer on the substrate, forming the first bit lines in the cell region extending into a first direction and spaced in a second direction by patterning a first metal layer, forming first preliminary vertical structures stacked on the upper surfaces of the first bit lines, and including a first preliminary impurity pattern, a second preliminary impurity pattern, a first preliminary electrode pattern, a first preliminary variable resistance pattern, and a second preliminary electrode pattern. The first preliminary impurity pattern, a second preliminary impurity pattern, a first preliminary electrode pattern, a first preliminary variable resistance pattern, and a second preliminary electrode pattern are formed by patterning the first impurity layer, the second impurity layer, a first electrode layer, the first resistance layer, and the second electrode layer. Additional steps include stacking a second metal layer, a third impurity layer, a fourth impurity layer, a third electrode layer, a second resistance layer, and a fourth electrode layer on upper surfaces of the first preliminary vertical structures, forming the word lines which vertically cross the first bit lines and the first preliminary vertical structures by patterning the second metal layer, forming a second preliminary vertical structures including the first preliminary impurity pattern, the second preliminary impurity pattern, a third preliminary electrode pattern, a second preliminary variable resistance pattern, and a fourth preliminary electrode pattern stacked on each of the upper surfaces of the word lines. A third preliminary electrode pattern, a second preliminary variable resistance pattern, and a fourth preliminary electrode pattern are formed by patterning the third impurity layer, the fourth impurity layer, the third electrode layer, the second resistance layer, and the fourth electrode layer. An end of the word line is exposed by removing a part of the second preliminary vertical structure on an upper surface of one end of the word line. The first diode including a first impurity pattern and a second impurity pat-”

tern and the first variable resistance device including a first electrode, a first variable resistor and a second electrode are formed by patterning the first preliminary vertical structure.

In yet another embodiment, the forming of the second variable resistance device and the second diode may include forming a first planarization layer which fills between the second preliminary vertical structures, forming a second bit line mask pattern the same shape as the first bit lines on an upper surface of the second preliminary vertical structures, and forming a floating electrode mask pattern in which a part thereof corresponds to the exposed end of the word line, and forming the second diode including a third impurity pattern and a fourth impurity pattern, and the second variable resistance device including a third electrode, a second variable resistor and a fourth electrode by patterning the second preliminary vertical structure the same shape as the second bit line mask pattern.

In yet another embodiment, the forming of the planarization layer including the second bit line groove, the floating electrode groove, the bit line contact via, the first floating contact via, and the second floating electrode via may include forming a planarization layer which fills between second memory cells including the second variable resistance device and the second diode, and between the second bit line mask pattern and the floating electrode mask pattern, and has a surface the same as surfaces of the bit line mask pattern and the floating electrode mask pattern, forming the second bit line groove in the planarization layer by removing the second bit line mask pattern, and forming the floating electrode groove in the planarization layer by removing the floating electrode mask patterns, and forming a second bit line contact via which passes through the planarization layer on a bottom of the second bit line groove, and forming a first floating contact via and a second floating contact via which pass through the planarization layer on a bottom of the floating electrode groove.

In yet another embodiment, the second bit line mask pattern and the floating electrode mask pattern may include silicon nitride, and the planarization layer may include silicon oxide.

In accordance with another aspect of the inventive concept, a method of fabricating a memory device may include defining a cell region, a driving region and a peripheral region in a substrate; forming first driving transistors, second driving transistors and third driving transistors, each of which includes an active pattern, a gate electrode, a first source/drain electrode, and a second source/drain electrode, on the same plane in the driving region, forming first bit lines in which an end thereof is a first source/drain electrode of the first driving transistor, word lines in which an end thereof is spaced from a first source/drain electrode of the second driving transistor, the first unit memory cells disposed between the first bit lines and the word lines, and the second unit memory cells disposed between the word lines and second bit lines in the cell region, forming a planarization layer configured to expose a surface of the second unit memory cells, and including second bit line grooves corresponding to upper surfaces of the first bit lines and floating electrode grooves which covers an upper surface of an end of the word line and an upper surface of the first source/drain electrode of the second driving transistor, forming a bit line contact via which passes through a planarization layer bottoms of the second bit line grooves, and a first floating contact via and a second floating contact via which pass through a planarization layer a bottom of the floating electrode groove, and forming second bit lines which fill the second bit line grooves, bit line contacts which fill the bit line contact vias, floating electrodes which fill the floating electrode grooves, and first floating contact electrodes and second floating contact electrodes which fill the first floating electrode vias and the second floating electrode vias, respectively.

In an embodiment, the second bit line and a second bit line contact electrode may be formed as one body, and the floating electrode, a first floating contact electrode and the second floating contact electrode may be formed as one body. In another embodiment, the method may further include forming a second bit line barrier under the second bit line, forming a second bit line contact barrier under the second bit line contact electrode, forming a floating electrode barrier under the floating electrode and a first floating contact barrier under the first floating contact electrode, and forming a second floating contact barrier under the second floating contact electrode. In still another embodiment, the floating electrode barrier, the first floating contact barrier, and the second floating contact barrier may be formed as one body. In yet another embodiment, the method may further include forming a word line barrier under the word line.

Details of other embodiments are included in the detailed description and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIGS. 4A to 19A, 4B to 19B, and 4C to 19C are process cross-sectional views taken along lines I-I', II-II', III-III' in FIG. 2, respectively, and illustrated according to a process sequence in accordance with an embodiment of the inventive concept;

DETAILED DESCRIPTION OF THE EMBODIMENTS

Figure 1A:
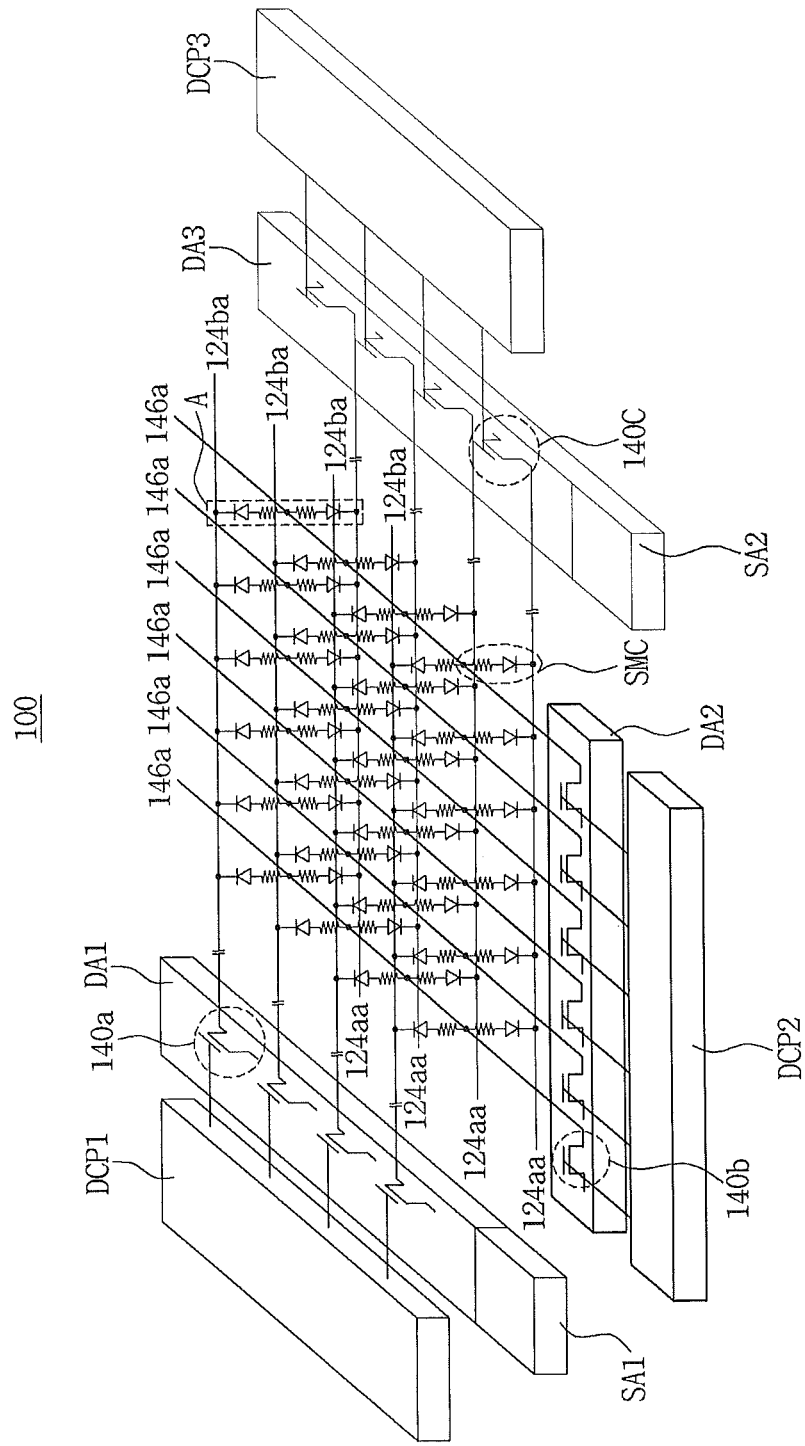
FIG. 1A is an equivalent circuit diagram illustrated a part of a memory device in accordance with an embodiment of the inventive concept.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concept to those skilled in the art. In the drawings, the sizes and relative sizes of layers and regions may be exaggerated for clarity.

The terminology used herein to describe embodiments of the invention is not intended to limit the scope of the invention. The articles "a," "an," and "the" are singular in that they have a single referent; however, the use of the singular form in the present document should not preclude the presence of more than one referent. In other words, elements of the invention referred to in the singular may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that, although the terms first, second, A, B, etc. may be used herein in reference to elements of the invention, such elements should not be construed as limited by these terms. For example, a first element could be termed a second element, and a second element could be termed a first element, without departing from the scope of the present invention. Herein, the term "and/or" includes any and all combinations of one or more referents.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Embodiments are described herein with reference to cross-sectional illustrations that are schematic illustrations of idealized embodiments and intermediate structures. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
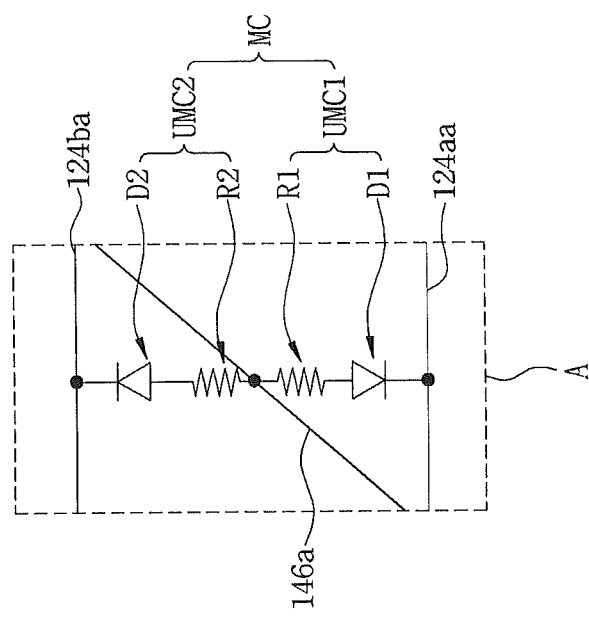
FIG. 1B is an enlarged equivalent circuit diagram of a portion A of FIG. 1A.

FIG. 1A is an equivalent circuit diagram illustrated a part of a memory device in accordance with an embodiment of the inventive concept. FIG. 1B is an enlarged equivalent circuit diagram of a portion A of FIG. 1A. Referring to FIGS. 1A and 1B, a memory device 100 in accordance with an embodiment of the inventive concept may include first bit lines 124*aa*, second bit lines 124*ba*, word lines 146*a*, stacked memory cells MC, driving units DA1, DA2 and DA3, SA (sense amplifier) units SA1 and SA2, and decoders DCP1, DCP2 and DCP3.

The first bit lines 124*aa* and the second bit lines 124*ba* which are vertically spaced may be formed to overlap in a two-dimensional view. The first and second bit lines 124*aa* and 124*ba* may be formed to extend in a first direction and to be spaced in a second direction. The word lines 146*a* may be formed to be located between the first bit lines 124*aa* and the second bit lines 124*ab*, and to vertically cross the first and second bit lines 124*aa* and 124*ba*.

The stacked memory cells MC may include first unit memory cells UMC1 and second unit memory cells UMC2 with reference to FIG. 1B. The first unit memory cells UMC1 may be located between the first bit lines 124*aa* and the word lines 146*a*, and the second unit memory cells UMC2 may be located between the word lines 146*a* and the second bit lines 124*ba*.

The first unit memory cell UMC1 may include a first diode D1 and a first variable resistance device R1 connected in series. The second unit memory cell UMC2 may include a second diode D2 and a second variable resistance device R2 connected in series.

One side of the first unit memory cell UMC1 and one side of the second unit memory cell UMC2 may be connected to the same word line 146*a*.

The other sides of the first unit memory cells UMC1 which are not connected to the word lines 146*a* may be connected to the first bit lines 124*aa*, and the other sides of second unit memory cells UMC2 which are not connected to the word lines 146*a* may be connected to the second bit lines 124*ba*.

The driving units DA1, DA2 and DA3 may include a first driving unit DA1, a second driving unit DA2, and a third driving unit DA3. The SA units SA1 and SA2 may include a first SA unit SA1 and a second SA unit SA2. The decoders DCP1, DCP2 and DCP3 may include a first decoder DCP1, a second decoder DCP2, and a third decoder DCP3.

The first driving unit DA1 may include first driving transistors 140*a*, and be merged with a first SA unit SA1. The first decoder DCP1 may be located adjacent to the first driving unit DA1. The first decoder DCP1 may be electrically connected to the first driving unit DA1.

The first driving transistors 140*a* may be located at one end of each of the second bit lines 124*ba*.

The second driving unit DA2 may include second driving transistors 140*b*. The second decoder DCP2 may be located close to the second driving unit DA2. The second decoder DCP2 may be electrically connected to the second driving unit DA2.

The second driving transistors 140*b* may be located at one end of each of the word lines 146*a*.

The third driving unit DA3 may include third driving transistors 140*c*. The third decoder DCP3 may be located close to the third driving unit DA3, and electrically connected to the third driving unit DA3.

The third driving transistors 140*c* may be located at one end of each of the first bit lines 124*aa*.

The memory device 100 configured as described above may perform write and read operations as below.

Referring to FIG. 1A, to perform a write operation to a memory cell SMC selected among the unit memory cells UMC1 and UMC2, for example, the first memory cells UMC1 electrically connected to the first bit line 124*aa* and the word line 146*a*, a voltage (Vwrite) is applied to the word line 146*a* connected to the selected memory cell SMC, and a ground voltage (0V) is applied to the first bit line 124*aa* connected to the selected memory cell SMC.

Here, a first inhibit voltage (Vinhibit1) may be applied to the word lines 146*a* which are not connected to the selected memory cell SMC, a second inhibit voltage (Vinhibit2) may be applied to the remaining first bit lines 124*aa* and the second bit lines 124*ba* which are not connected to the selected memory cell SMC.

The first inhibit voltage (Vinhibit1) applied to the remaining word lines 146*a* which are not connected to the selected memory cell SMC may be 'Vwrite/4', and the second inhibit voltage (Vinhibit2) applied to the remaining first bit lines 124*aa* and the second bit lines 124*ba* which are not connected to the selected memory cell SMC may be 'Vwrite*3/4'.

Otherwise, to perform a read operation on all cells, a read voltage is applied to all word lines 146*a*, and a ground voltage (0V) is applied to the first bit lines 124*aa* and the second bit lines 124*ba*.

Here, read data of each of the bit lines 124*aa* and 124*ba* is amplified in the first SA unit SA1 electrically connected to the first bit lines 124*aa* and the second SA unit SA2 electrically connected to the second bit lines 124*ba*.

Here, the read voltage may be a lower voltage than the write voltage.

As described above, the driving units DA1, DA2 and DA3 may be electrically connected to the bit lines 124*aa* and 124*ba* and the word lines 146*a*, respectively, in the memory device 100 which performs the read and write operations.

The first driving transistor 140*a*, the second driving transistor 140*b*, and the third driving transistors 140*c* which are included in the driving units DA1, DA2 and DA3, respectively, may be directly formed on a substrate 102.

The first driving transistor 140*a*, second driving transistor 140*b*, third driving transistor 140*c* may be formed on the substrate 102 in advance before the unit memory cells DMC1 and UMC2, the bit lines 124*aa* and 124*ba*, and the word lines 146*a* are formed.

Hereinafter, plan and cross-sectional configurations of the memory device 100 including the driving transistors 140*a*, 140*b* and 140*c* will be described with reference to FIGS. 2, 3A, 3B, and 3C.

Figure 2:
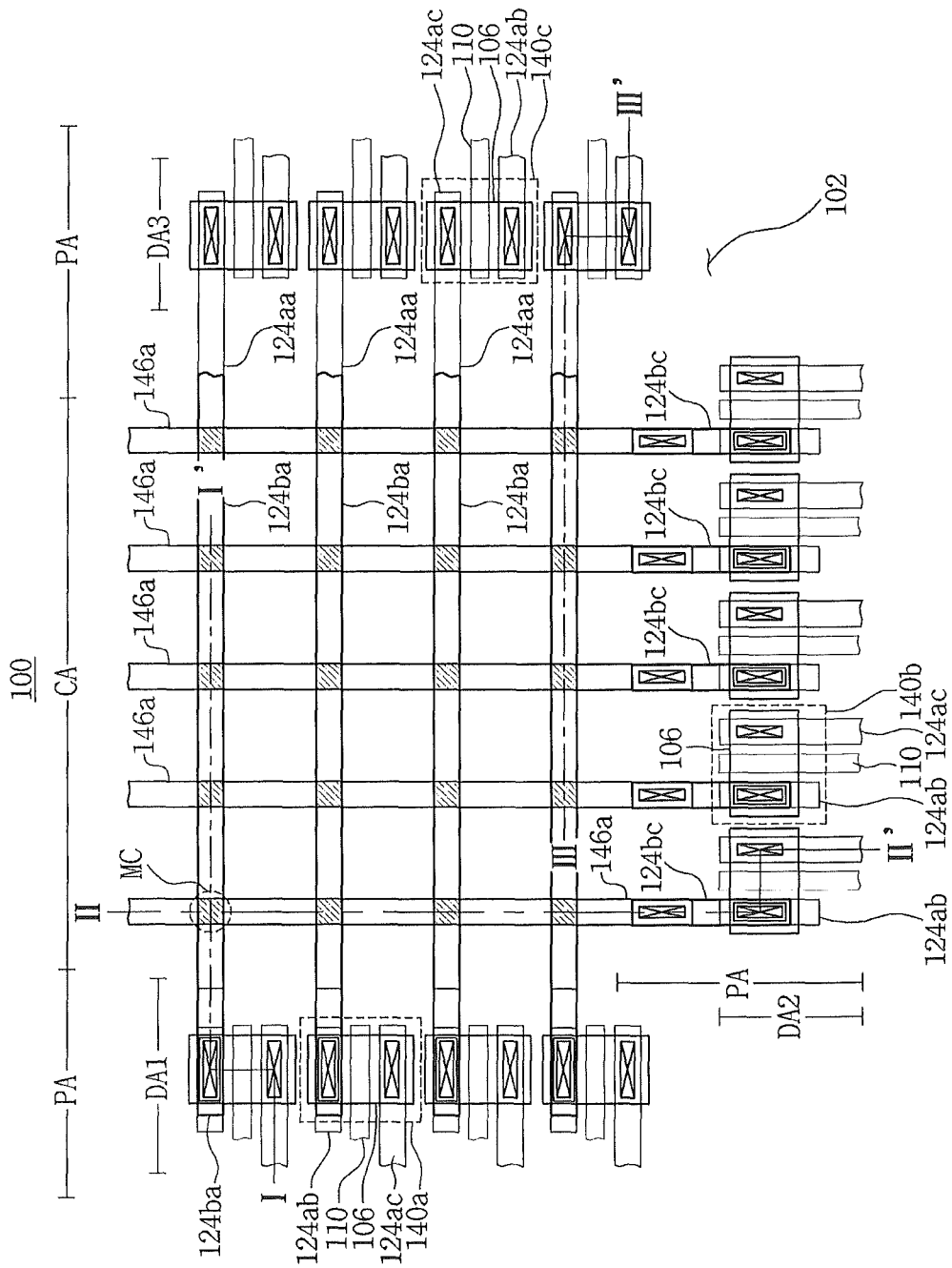
FIG. 2 is a plan view illustrating a part of a memory device in accordance with an embodiment of the inventive concept.
Figure 3A:
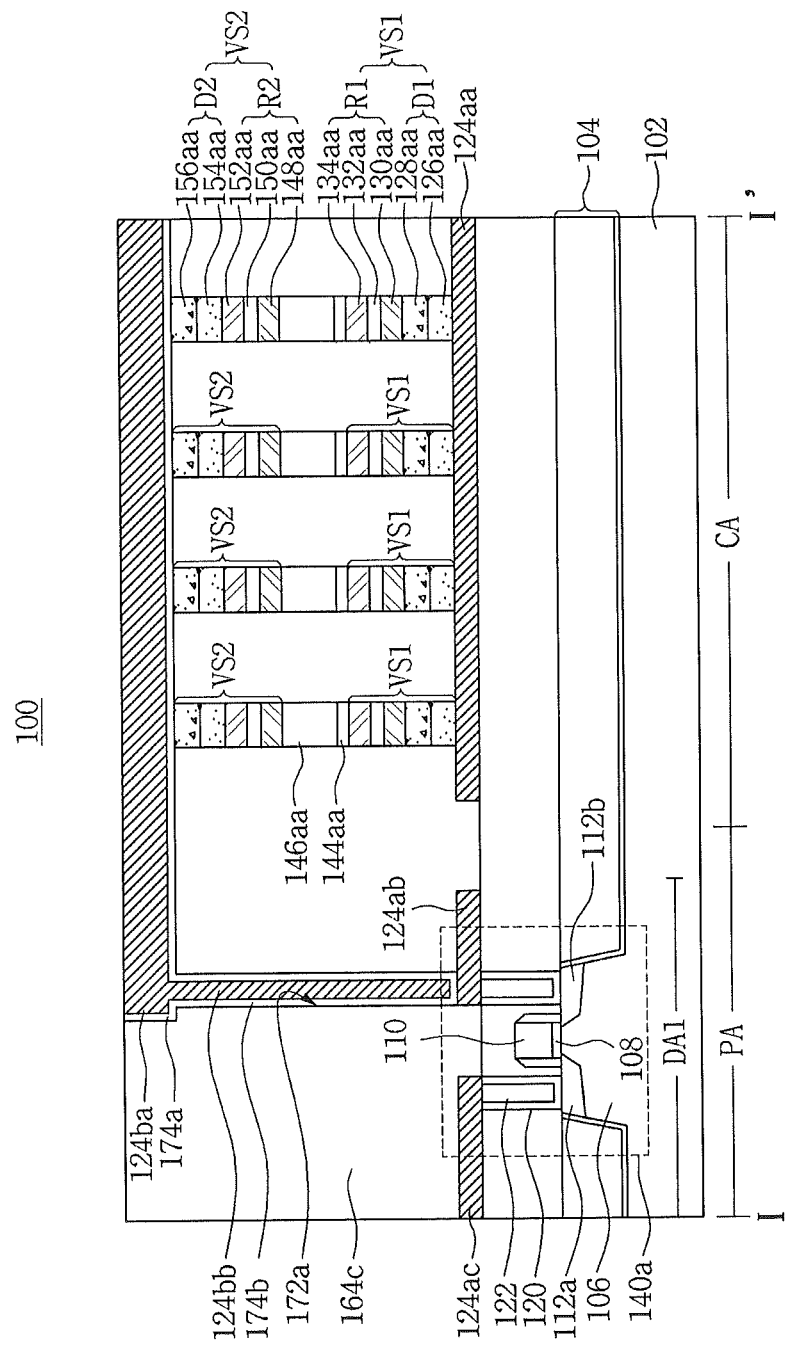
FIGS. 3A, 3B and 3C are cross-sectional views taken along lines I-I', II-II', III-III' in FIG. 2.
Figure 3B:
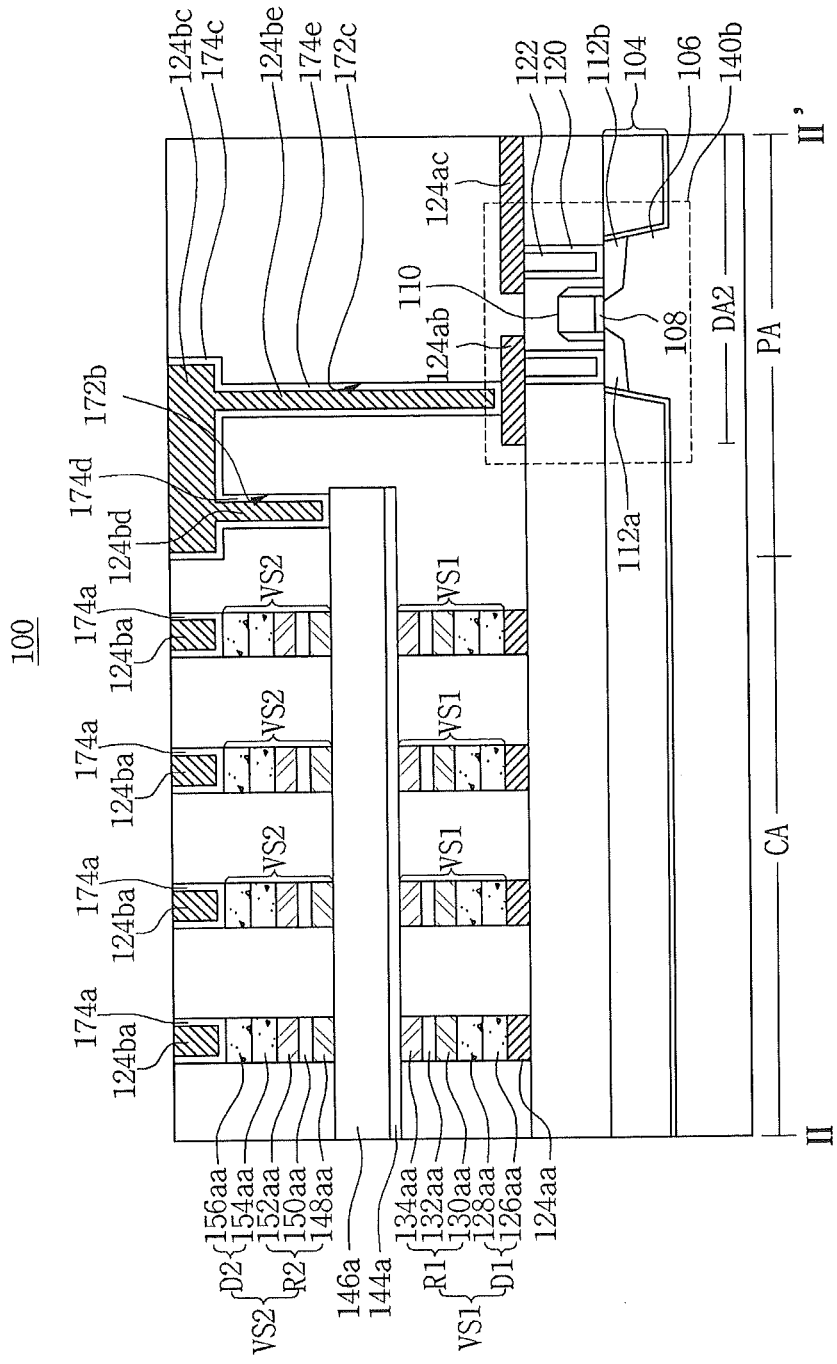
Figure 3C:
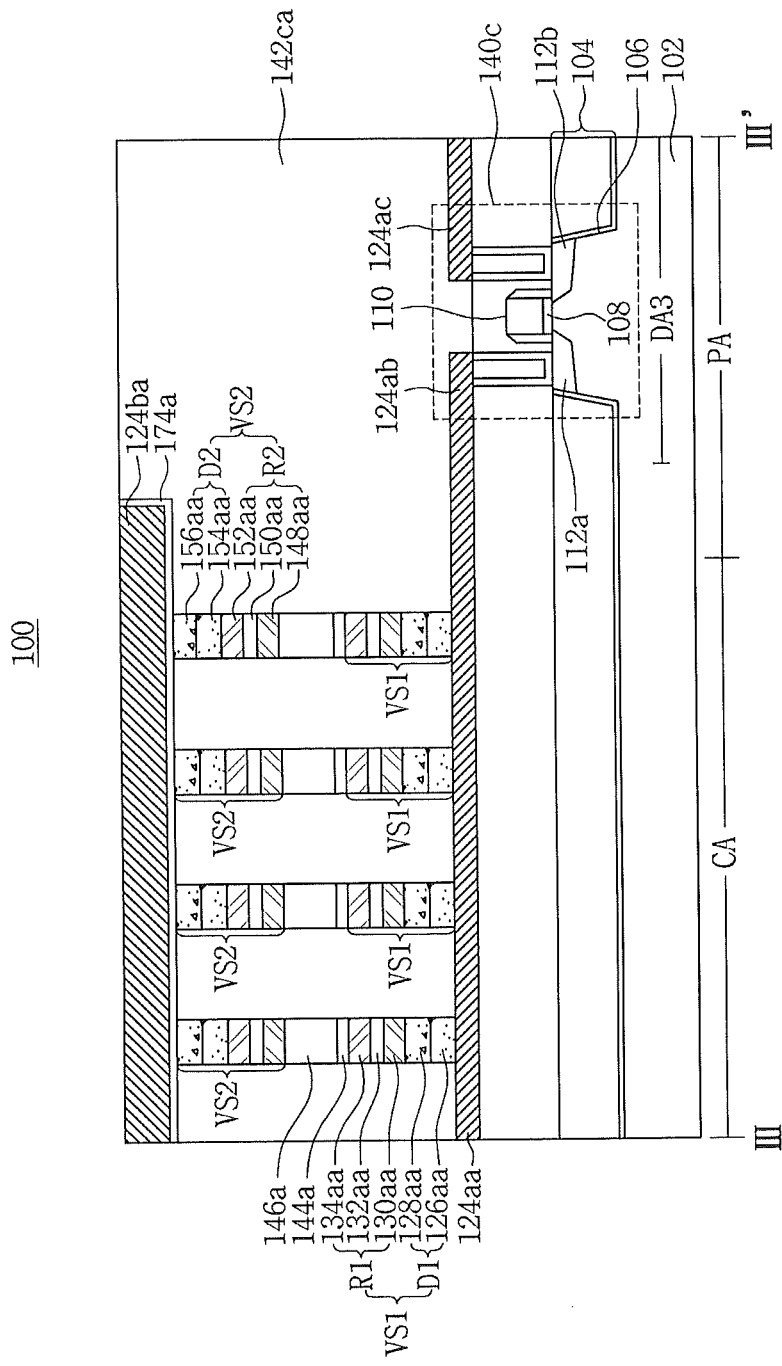

FIG. 2 is a plan view illustrating a part of a memory device in accordance with an embodiment of the inventive concept, and FIGS. 3A, 3B, and 3C are cross-sectional views taken along lines I-I', in FIG. 2.

Referring to FIGS. 2, 3A, 3B, and 3C, the memory device 100 according to the embodiment of the inventive concept may include a substrate 102 including a cell region CA, driving regions DA1, DA2 and DA3, and peripheral regions PA, first bit lines 124*aa*, second bit lines 124*ba*, word lines 146*a*, and stacked memory cell MC which are formed in the cell region CA, and driving transistors 140*a*, 140*b*, and 140*c* formed in the driving regions DA1, DA2, and DA3.

In addition, word line barriers 144*a* formed under the word line 146*a* and second bit line barriers 174*a* formed under the second bit line 124*ba* may be further included.

The stacked memory cells MC may be formed on every point in which the first and second bit lines 124*aa* and 124*ba* cross the word lines 146*a*.

More specifically, first unit memory cells UMC1 and second unit memory cells UMC2 may be formed under and on the word lines 146*a*, respectively.

Each of the first unit memory cells UMC1 may include a first diode D1 and a first variable resistance device R1. Each of the second unit memory cells UMC2 may include a second diode D2 and a second variable resistance device R2.

The first diode D1 may include a first N-type impurity pattern 126*aa* and a first P-type impurity pattern 128*aa* which are stacked. The first variable resistance device R1 may include a first electrode 130*aa*, a first variable resistor 132*aa*, and a second electrode 134*aa* which are stacked.

The second diode D2 may include a second P-type impurity pattern 154*aa* and a second N-type impurity pattern 156*aa* which are stacked. The second variable resistance device R2 may include a third electrode 148*aa*, a second variable resistor 150*aa* and a fourth electrode 152*aa* which are stacked.

The first N-type impurity pattern 126*aa* of the first diode D1 may be electrically connected to the first bit line 124*aa*. The second N-type impurity pattern 156*aa* of the second diode D2 may be electrically connected to the second bit line 124*ba*.

The second electrode 134*aa* of the first variable resistance device R1 and the third electrode 148*aa* of the second variable resistance device R2 may be electrically connected to the word line 146*a*.

The driving regions DA1, DA2 and DA3 may include a first driving region DA1 adjacent to an end of the second bit line 124*ba*, a second driving region DA2 adjacent to an end of the word line 146*a*, and a third driving region DA3 adjacent to an end of the first bit line 124*aa*.

The memory device 100 according to the embodiment of the inventive concept may include first driving transistors 140*a*, bit line contact vias 172*a*, and bit line contact electrodes 124*bb* that fill the bit line contact vias 172*a* which are formed in the first driving region DA1.

Furthermore, the memory device 100 may include second driving transistors 140*b*, floating electrodes 124*bc*, first floating contact vias 172*b*, second floating contact vias 172*c*, first floating contact electrodes 124*bd* which fill first floating contact vias 172*b*, and second floating contact electrodes 124*be* that fill the second floating contact vias 172*c* which are formed in the second driving region DA2.

Further, the memory device 100 may include third driving transistors 140*c* formed in the third driving region DA3.

Each of the first driving transistors 140*a*, the second driving transistors 140*b*, and the third driving transistors 140*c* may include an active pattern 106, a gate insulating layer 108, a gate electrode 110, a first source/drain region 112*a*, a second source/drain region 112*b*, a first source/drain electrode 124*ab* electrically connected to the first source/drain region 112*a*, and a second source/drain electrode 124*ac* electrically connected to the second source/drain region 112*b*.

Here, the first source/drain electrode 124*ab* of the third driving transistor 140*c* may be one end of the first bit line 124*aa*.

The bit line contact electrodes 124*bb* of the first driving region DA1 may be electrically connected to the first source/drain electrodes 124*ab* and the second bit lines 124*ba* of the first driving transistors 140*a*.

The first floating contact electrodes 124*bd* of the second driving region DA2 may be electrically connected to the floating electrode 124*bc* and the word lines 146*a*, and the second floating contact electrodes 124*be* may be electrically connected to the floating electrode 124*bc* and the first source/drain electrodes 124*ab* of the second driving transistors 140*b*.

The bit line contact electrodes 124*bb* and the second bit lines 124*ba* may be formed as one body. In addition, the floating contact electrodes 124*bc*, the first floating contact electrodes 124*bd*, and the second floating contact electrodes 124*be* may be formed as one body.

The memory device 100 according to the embodiment of the inventive concept may further include second bit line barriers 174*a* disposed under the second bit lines 124*ba*, bit line contact barriers 174*b* disposed between the bit line contact electrodes 124*bb* and the bit line contact vias 172*b*, floating electrode barriers 174*c* disposed under the floating electrodes 124*bc*, first floating contact barriers 174*d* disposed between first floating contact electrodes 124*bd* and the first floating contact vias 172*b*, second floating contact barriers 174*e* disposed between the second floating contact electrodes 124*be* and the second floating contact vias 172*c*.

The second bit line barriers 174*a* and the bit line contact barriers 174*b* may be formed as one body. In addition, the floating electrode barriers 174*c*, the first floating contact barriers 174*d*, and the second floating contact barriers 174*e* may be formed as one body.

In configurations as described above, The method of fabricating the memory device according to the embodiment of the inventive concept may include forming the second bit lines 124*ba*, the bit line contacts 124*bb*, the floating electrodes 124*bc*, the first floating contact electrodes 124*bd*, and the second floating contact electrodes 124*be* in a single process.

Thus, hereinafter, the method of fabricating the memory device 100 according to the embodiment of the inventive concept will be described with reference to process views.

FIGS. 4A to 19A, 4B to 19B, and 4C to 19C are process cross-sectional views taken along lines I-I', II-II', III-III' in FIG. 2, respectively, and illustrated according to a process sequence in accordance with an embodiment of the inventive concept.

Figure 4A:
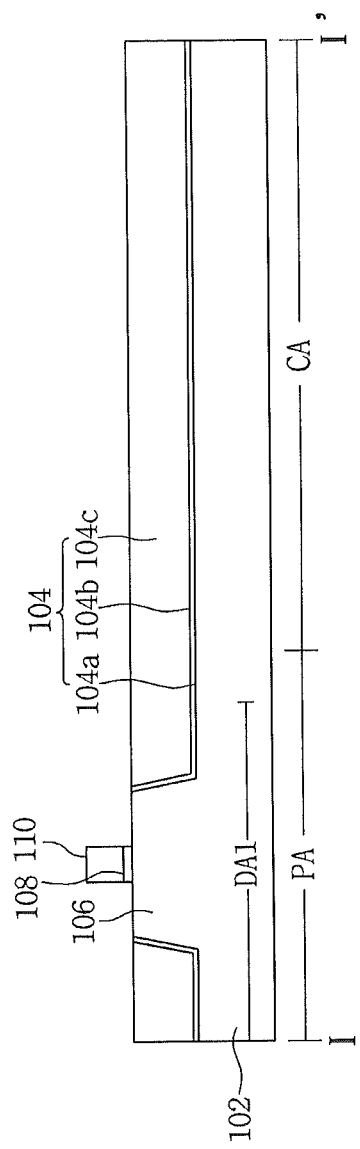
Figure 4B:
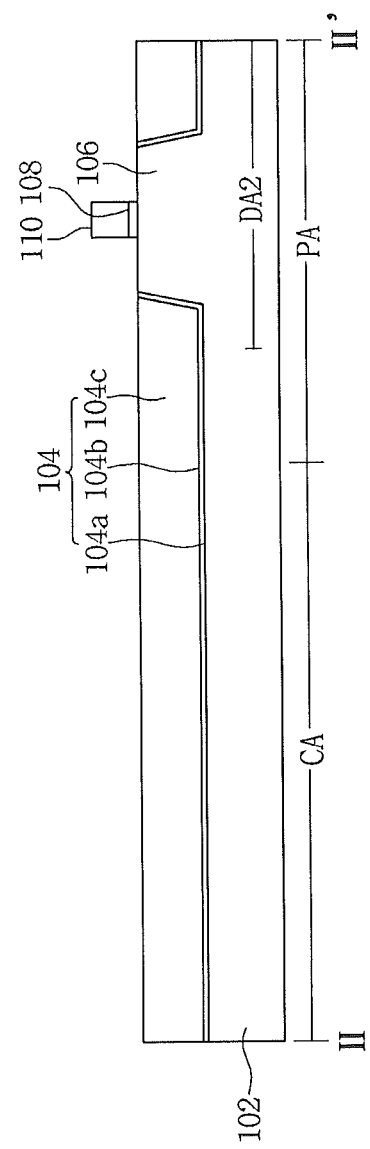
Figure 4C:
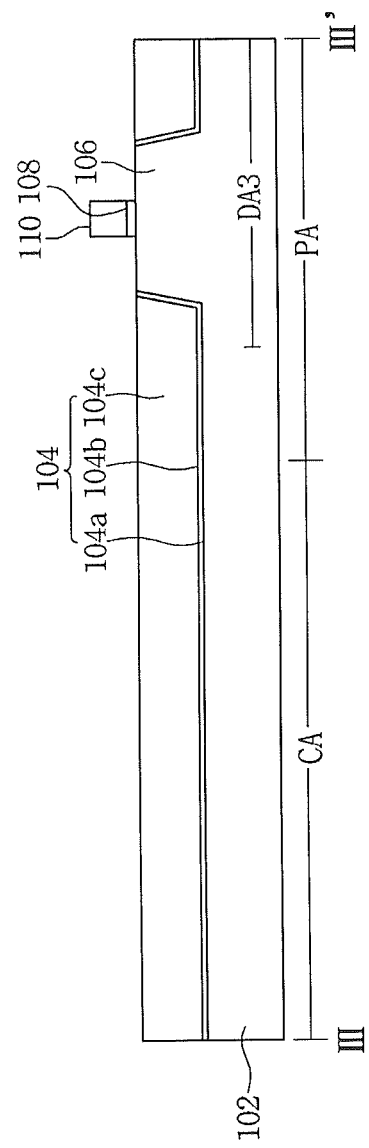

Referring to FIGS. 4A, 4B, and 4C, the method of fabricating the memory device 100 according to the embodiment of the inventive concept may include forming shallow-trench-isolation (STI) regions 104, active patterns 106, gate insulating layers 108, and gate electrodes 110 in a peripheral region PA of a substrate 102.

The substrate 102 may include a cell region CA and the peripheral region PA. The peripheral region PA may include driving regions DA1, DA2 and DA3 and be defined around the cell region CA.

The substrate 102 may include a silicon substrate.

The peripheral region PA may include a first driving region DA1, a second driving region DA2, and a third driving region DA3.

The first driving region DA1 and the third driving region DA3 may be spaced in a horizontal direction. The second driving region DA2 may be located in a perpendicular direction with respect to the first driving region DA1 and the third driving region DA3.

The STI regions 104 and the active patterns 106 may be formed in the first driving region DA1, the second driving region DA2, and the third driving region DA3.

The STI regions 104 may be disposed between the active patterns 106 to isolate the active patterns 106.

The forming of the STI regions 104 may include forming a trench 104*a* by partly recessing the substrate 102, forming a liner 104*b* which covers an inner wall of the trench 104*a*, and forming an insulating layer pattern 104*c* which covers an upper surface of the liner 104*b* and fills the trench 104*a*. The liner 104*b* may have a stacked shape of a silicon oxide layer and a silicon nitride layer. In a case, the liner 104*b* may be omitted.

The insulating layer pattern 104*c* may include silicon oxide.

The active patterns 106 may be spaced apart from each other in a vertical direction in the first driving region DA1 and the third driving region DA3, and in a horizontal direction in the second driving region DA2.

The gate insulating layers 108 and the gate electrodes 110 may be formed on upper surfaces of the active patterns 106 formed in the first driving region DA1, the second driving region DA2, and the third driving region DA3.

The gate insulating layer 108 may include a silicon oxide layer, and the gate electrode 110 may include a conductive metal layer or polysilicon layer.

Figure 5A:
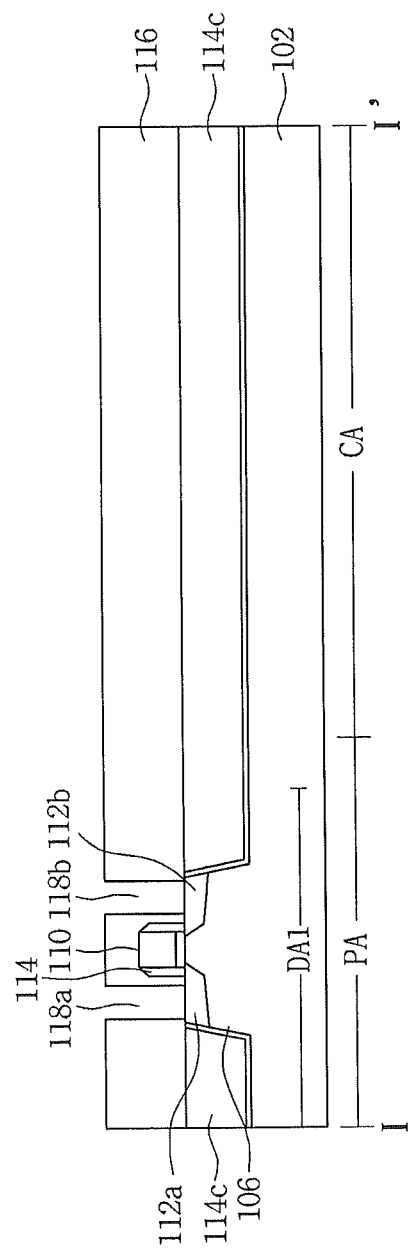
Figure 5B:
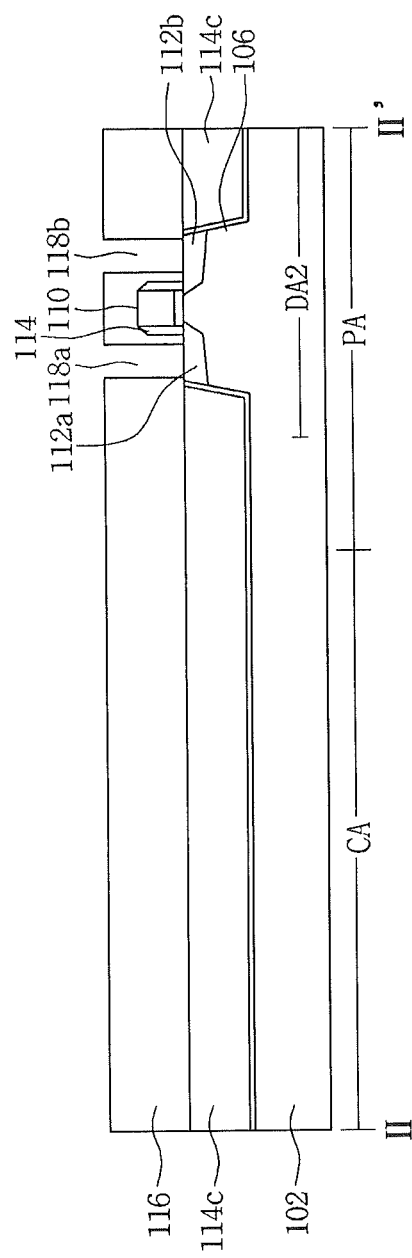
Figure 5C:
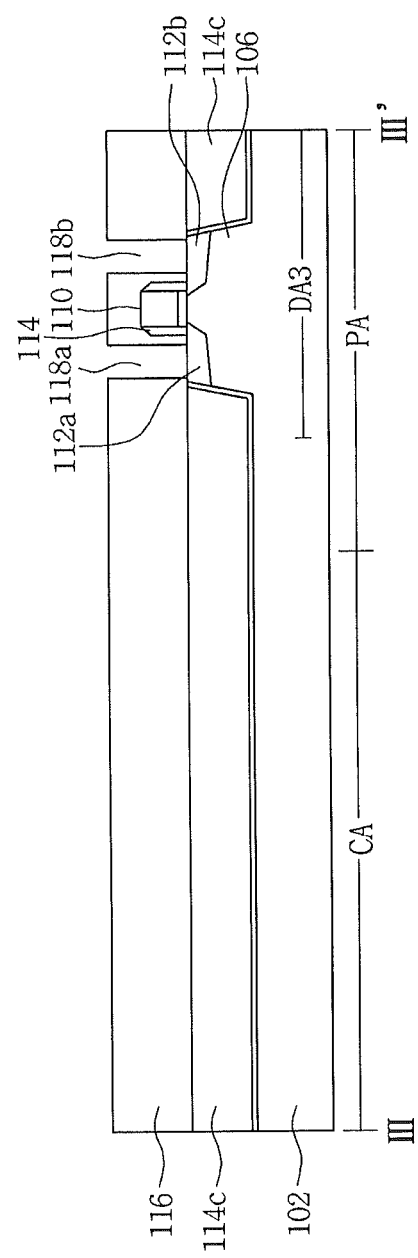

Referring to FIGS. 5A, 5B, and 5C, the method of fabricating the memory device 100 according to the embodiment of the inventive concept may include forming first source/drain regions 112*a*, second source/drain regions 112*b*, a protection layer 116, first source/drain vias 118*a*, and second source/drain vias 118*b*.

The forming of the first and second source/drain regions 112*a* and 112*b* may include implanting impurities into surfaces of the active patterns 106 exposed to both sides of the gate electrodes 110.

The impurities may include an N-type or P-type impurity. The impurities may be implanted to a certain depth from the surface of the active pattern 106.

The forming of the protection layer 116 may include forming an insulating layer on the entire surface of the substrate 102 in which the gate electrodes 110 are formed. The protection layer 116 may include silicon oxide.

The forming of the first and second source/drain vias 118*a* and 118*b* may include photo-etching the protection layer 116.

The first and second source/drain vias 118*a* and 118*b* may pass through the protection layer 116. The bottoms of the first source/drain vias 118*a* and the second source/drain vias 118*b* may be surfaces of the first source/drain regions 112*a* and the second source/drain regions 112*b*, respectively, which are formed in each of the first driving region DA1, the second driving region DA2, and the third driving region DA3.

The method of fabricating the memory device 100 according to the embodiment of the inventive concept may further include forming gate sidewall spacers 114 which covers sidewalls of the gate electrodes 110 after forming the source/drain region 112.

The gate sidewall spacers 114 may include silicon nitride.

Figure 6A:
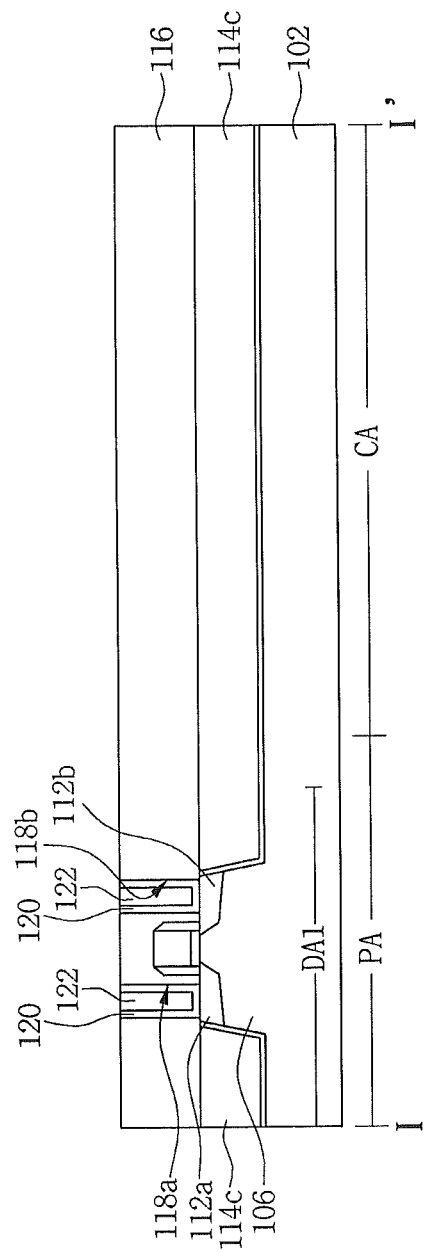
Figure 6B:
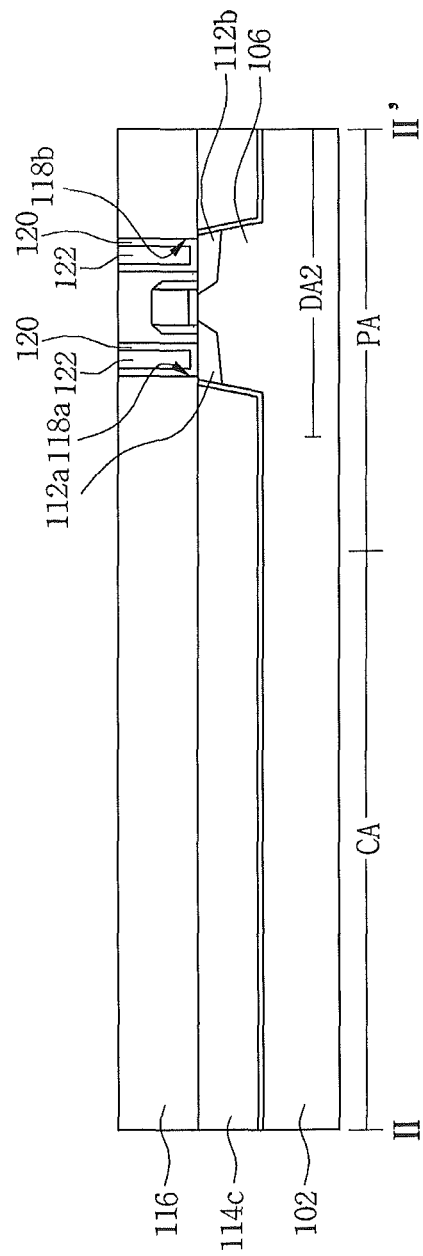
Figure 6C:
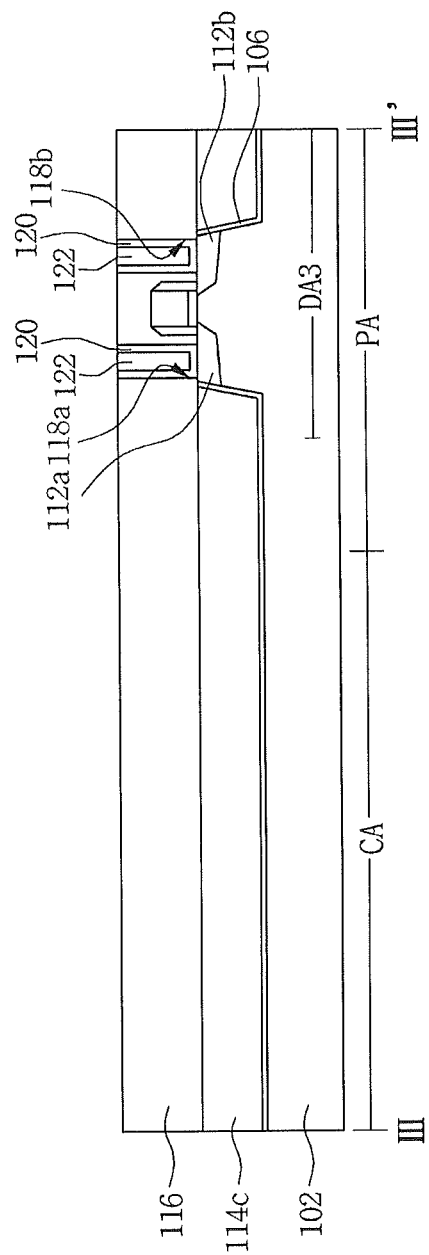

Referring to FIGS. 6A, 6B, and 6C, the method of fabricating the memory device 100 according to the embodiment of the inventive concept may include forming contact electrode barriers 120 and contact electrodes 122 in the first driving region DA1 and the second driving region DA2.

The contact electrode barriers 120 may cover inner walls of the first and second source/drain vias 118*a* and 118*b*. The contact electrodes 122 may cover surfaces of the contact electrode barriers 120 and fill the first and second source/drain vias 118*a* and 118*b*.

The contact electrode barriers 120 may include titanium nitride (TiN), and the contact electrodes 122 may include tungsten (W).

Figure 7A:
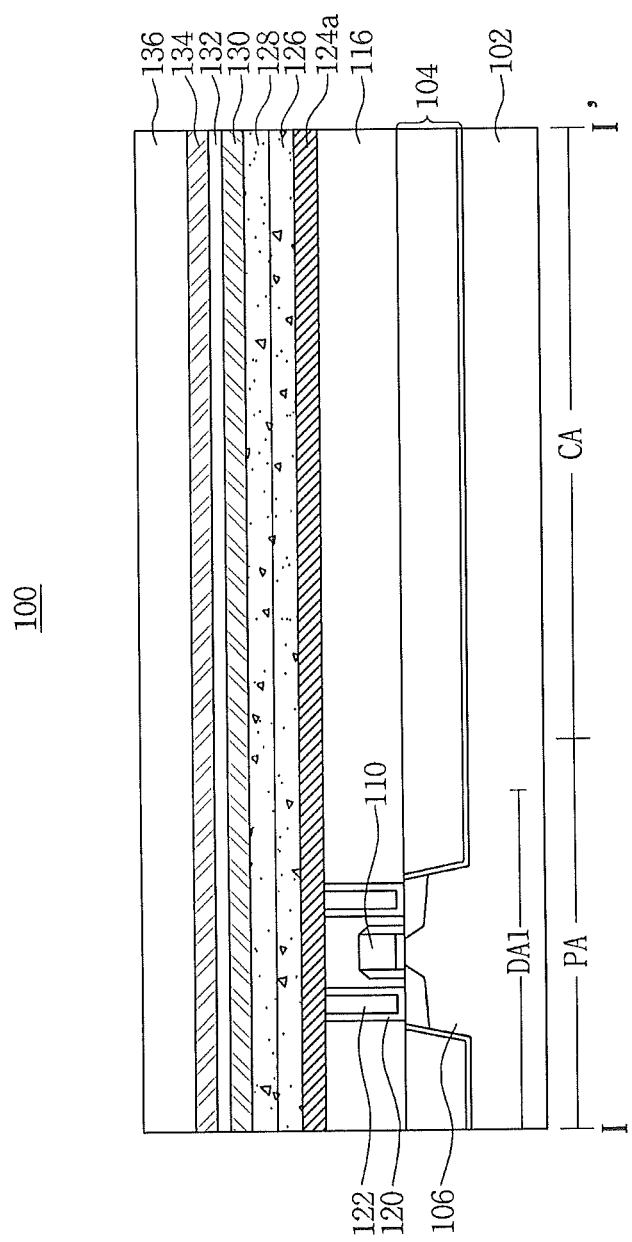
Figure 7B:
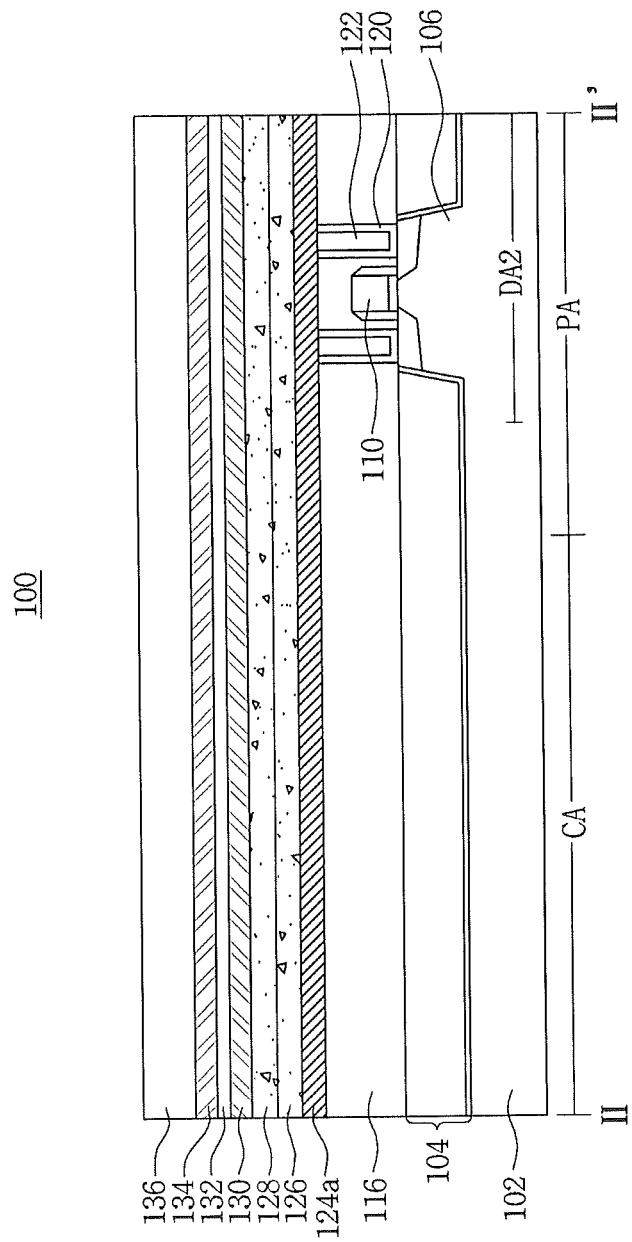
Figure 7C:
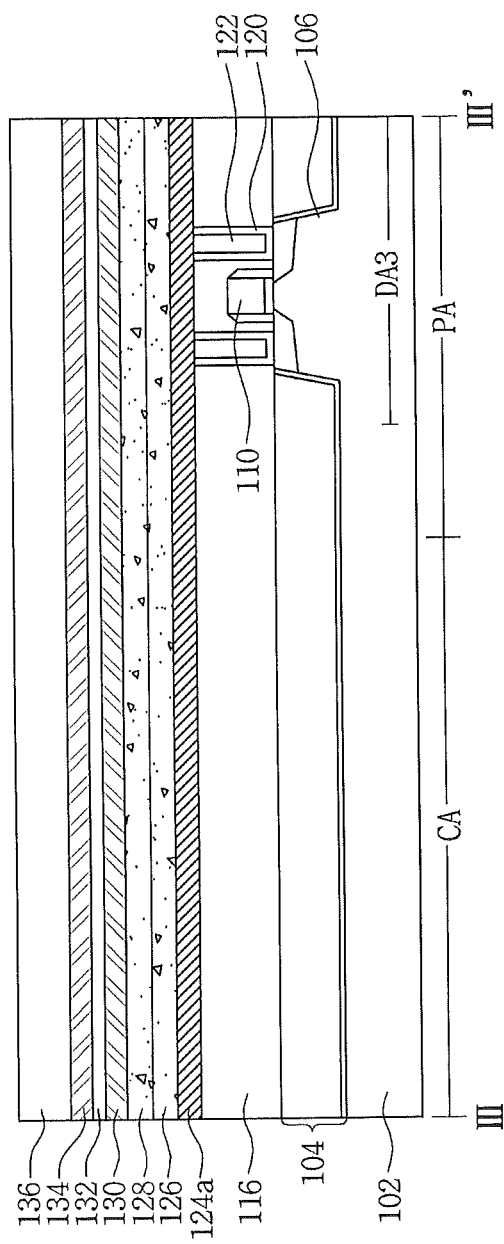

Referring to FIGS. 7A, 7B, and 7C, the method of fabricating the memory device 100 according to the embodiment of the inventive concept may include forming a first metal layer 124*a*, a first impurity layer 126, a second impurity layer 128, a first electrode layer 130, a first resistance layer 132, a second electrode layer 134, and a first hard mask layer 136 on the protection layer 116.

The first metal layer 124a may be formed on an upper surface of a substrate 102. The first metal layer 124a may include tungsten (W), aluminum (Al), titanium nitride (TiN), and tungsten nitride (WN).

The first impurity layer 126 and the second impurity layer 128 may include an N-type impurity layer or P-type impurity layer. The first impurity layer 126 and the second impurity layer 128 may have opposite types of impurities.

The N-type impurity layer may include N-type impurities, and the P-type impurity layer may include P-type impurities.

The forming of the first impurity layer 126 and the second impurity layer 128 may include doping high concentration N-type impurities or high concentration P-type impurities into an intrinsic amorphous silicon layer using an ion diffusion process or ion implantation process. For example, the first impurity layer 126 may include an N-type impurity layer, and the second impurity layer 128 may include a P-type impurity layer.

The ion diffusion process may include a method which diffuses high concentration ions into the intrinsic amorphous silicon layer in an in-situ environment, and the ion implantation process may include a method which implants ions in a plasma state into the intrinsic amorphous silicon layer in a vacuum state. For example, the ion doping process in accordance with embodiments of the inventive concept may include the ion implantation process.

The N-type impurity may include a group V element such as phosphorus (P), arsenic (As), or antimony (Sb). The P-type impurity may include a group III element such as boron (B), indium (In), or gallium (Ga).

The intrinsic amorphous silicon layer may be further included between the first impurity layer 126 and the second impurity layer 128.

The first electrode layer 130 and the second electrode layer 134 may include platinum (Pt), ruthenium (Ru), ruthenium oxide (RuOx). Iridium (Ir). Iridium oxide (IrOx), titanium nitride (TiN), tungsten (W), tantalum (Ta), or tantalum nitride (TaN). In another embodiment, the first electrode layer 130 or the second electrode layer 134 may include polysilicon.

The first resistance layer 132 may include hafnium oxide (HfOx), titanium oxide (TiOx), nickel oxide (NiOx), zirconium oxide (ZrOx), aluminum oxide (AlOx), silicon oxide (SiOx), niobium oxide (NbOx), or tungsten oxide (WOx).

The first hard mask layer 136 may include silicon nitride and silicon oxide.

In the above-described process, silicide combined of metal and silicon may be formed on interfaces between the first metal layer 124a and the first impurity layer 126, and between the first electrode layer 130 and the second impurity layer 128.

Referring to FIGS. 8A, 8B, 8C, and 2, the method of fabricating the memory device 100 according to the embodiment of the inventive concept may include forming first hard mask patterns 136a, first preliminary vertical structures PVS1, first bit lines 124aa, first stacked structures SS1, second stacked structures SS2, first source/drain electrodes 124ab, and second source/drain electrodes 124ac.

The forming of the first hard mask patterns 136a may include patterning the first hard mask layer 136 illustrated in FIGS. 7A to 7C.

The first hard mask patterns 136a may include first bit line mask patterns 136aa, first electrode mask patterns 136ab, and second electrode mask patterns 136ac.

The forming of the first preliminary vertical structures PVS1, the first bit lines 124aa, the first stacked structure SS1 and the second stacked structure SS2, the first source/drain electrodes 124ab, and the second source/drain electrodes 124ac may include patterning the first metal layer 124a, the first impurity layer 126, the second impurity layer 128, the first electrode layer 130, the first resistance layer 132 and the second electrode layer 134 using the first hard mask patterns 136a as a mask.

The first bit line mask patterns 136aa may be formed in the first driving region DA1. The first electrode mask patterns 136ab and the second electrode mask patterns 136ac may be formed over the active patterns 106 in the first driving region DA1, the second driving region DA2, and the third driving region DA3.

The first preliminary vertical structures PVS1 and the first bit lines 124aa may be formed in the same shape as the first bit line mask patterns 136aa under the first bit line mask patterns 136aa.

The first preliminary vertical structure PVS1 and the first bit lines 124aa may be formed over the cell region CA in a first direction, and spaced in a second direction perpendicular to the first direction.

The first preliminary vertical structures PVS1 may include a first preliminary N-type impurity pattern 126a, a first preliminary P-type impurity pattern 128a, a first preliminary electrode pattern 130a, a first preliminary variable resistance pattern 132a, and a second preliminary electrode pattern 134a which are sequentially stacked on each of the upper surfaces of the first bit lines 124aa.

The first stacked structures SS1 and the first source/drain electrodes 124ab may be formed under the first electrode mask patterns 136ab, and the second stacked structures SS2 and the second source/drain electrodes 124ac may be formed under the second electrode mask patterns 136ac.

The first stacked structures SS1 in the third driving region DA3 may be formed with the first preliminary vertical structures PVS1 as one body, and the first source/drain electrodes 124ab may be formed with the first bit lines 124aa as one body.

Accordingly, the first driving transistor 140a, the second driving transistor 140b, and the third driving transistor 140c, each of which includes the active pattern 106, the gate electrode 110, the first source/drain electrode 124ab, and the second source/drain electrode 124ac may be formed in the first driving region DA1, the second driving region DA2, and the third driving region DA3.

The first bit line mask patterns 136aa and the first and second electrode mask patterns 136ab and 136ac may be removed.

Figure 9A:
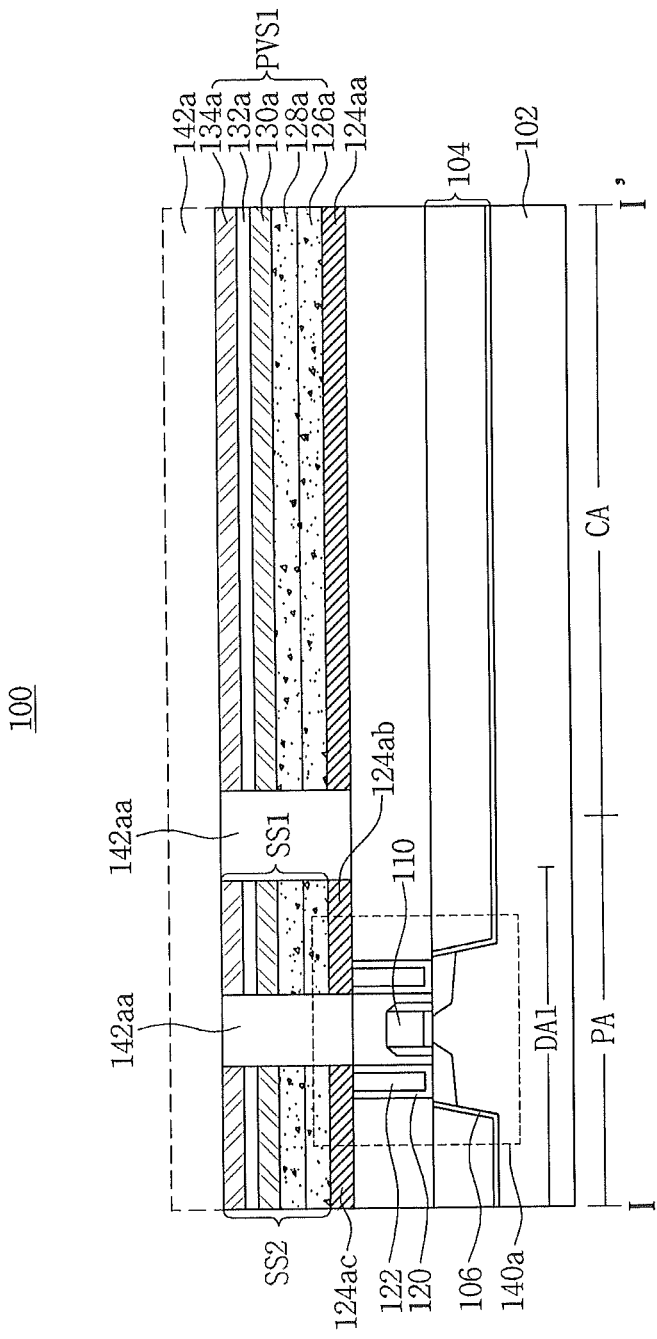
Figure 9B:
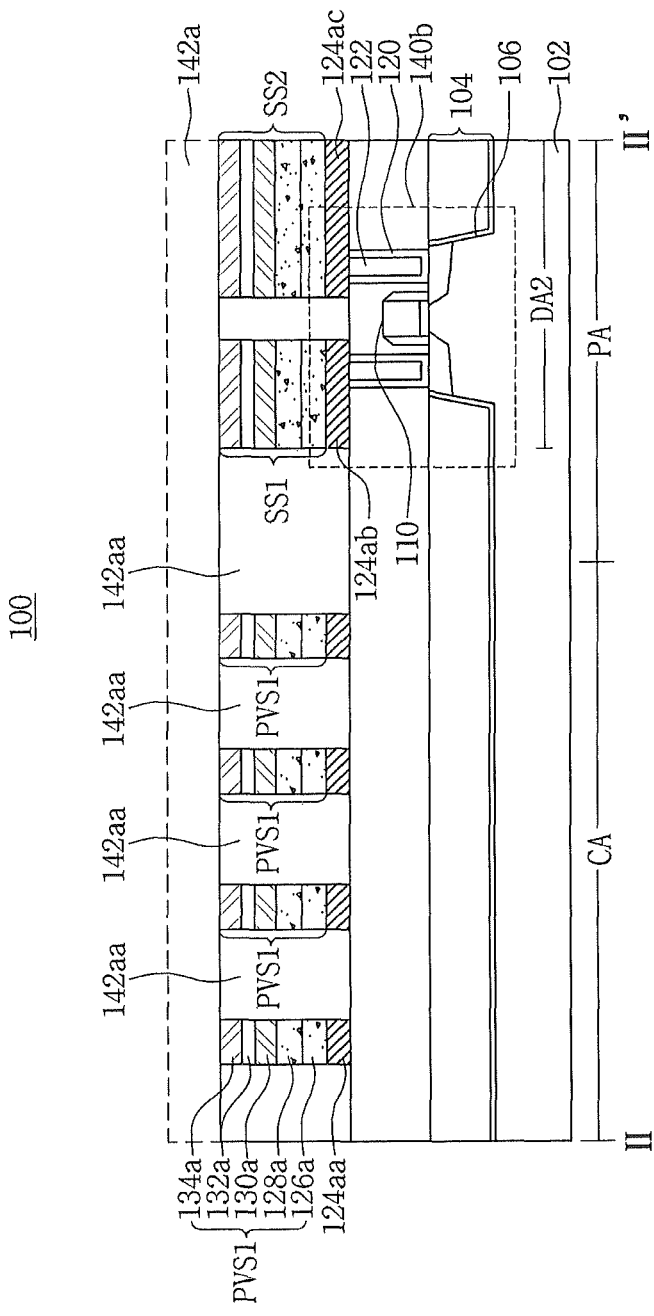
Figure 9C:
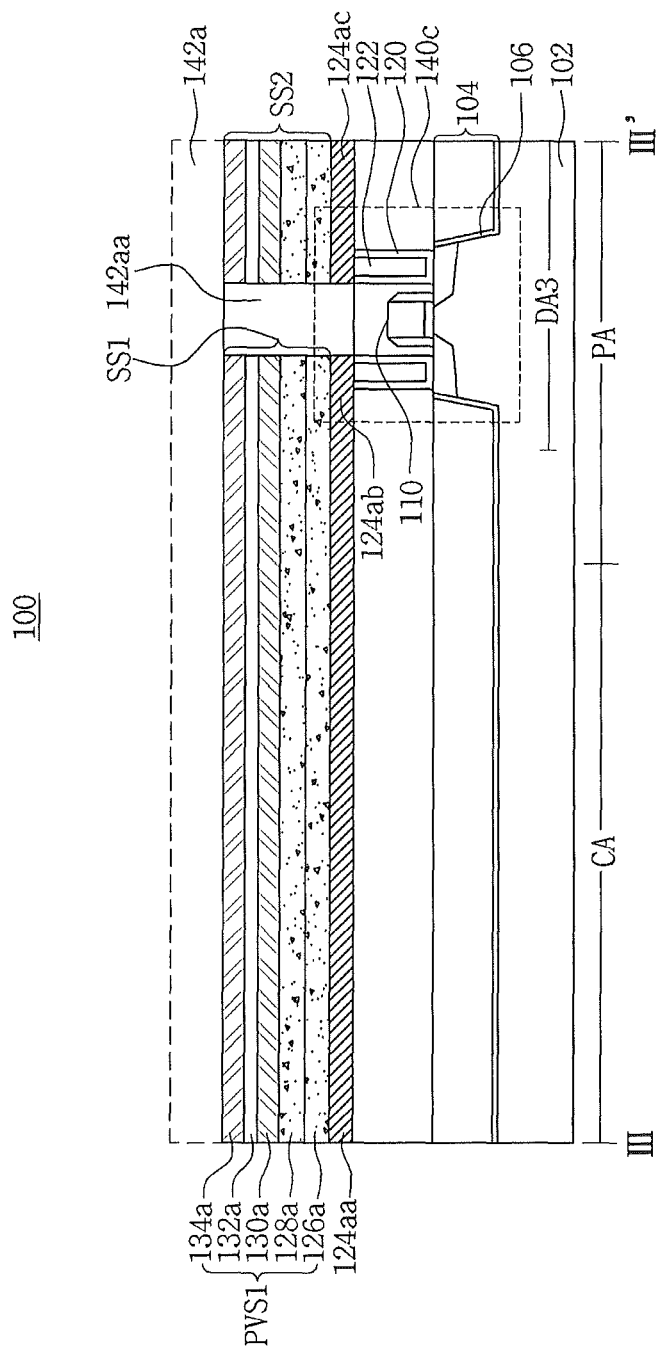

Referring to FIGS. 9A, 9B, and 9C, the method of fabricating the memory device 100 according to the embodiment of the inventive concept may include forming a first planarization layer 142aa.

Figure 8A:
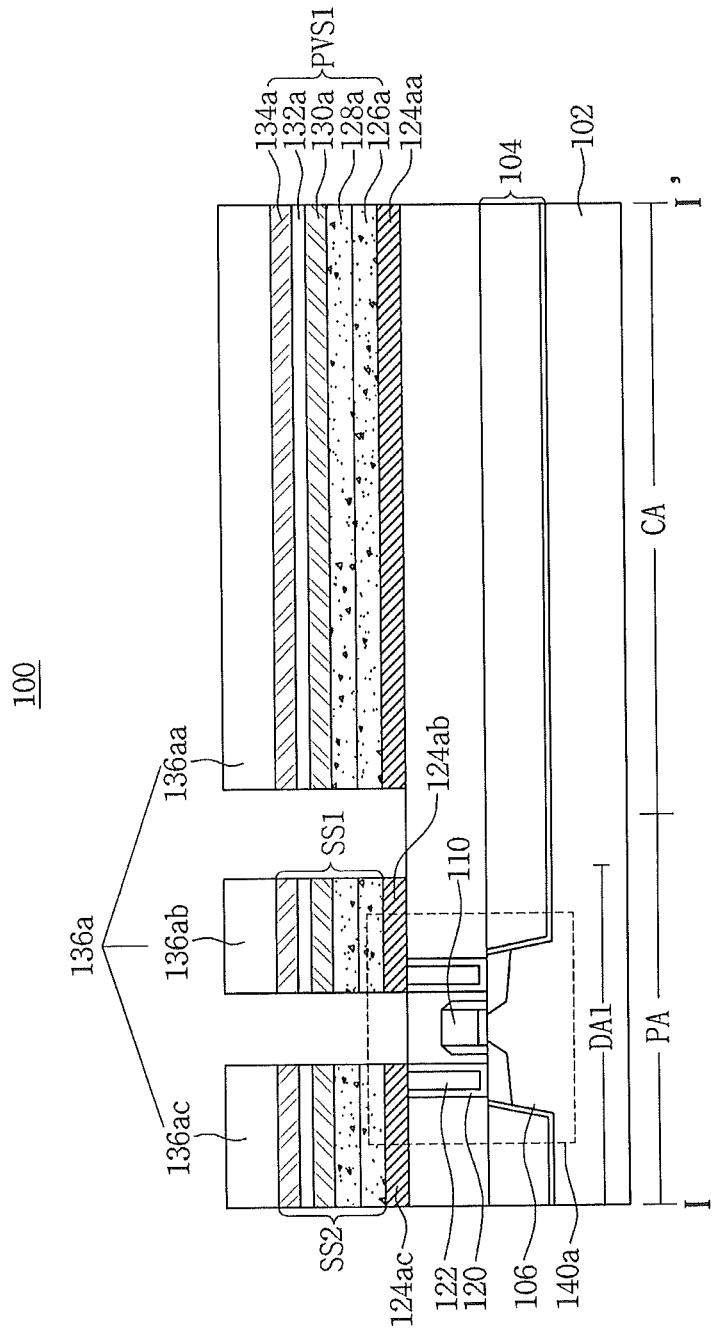
Figure 8B:
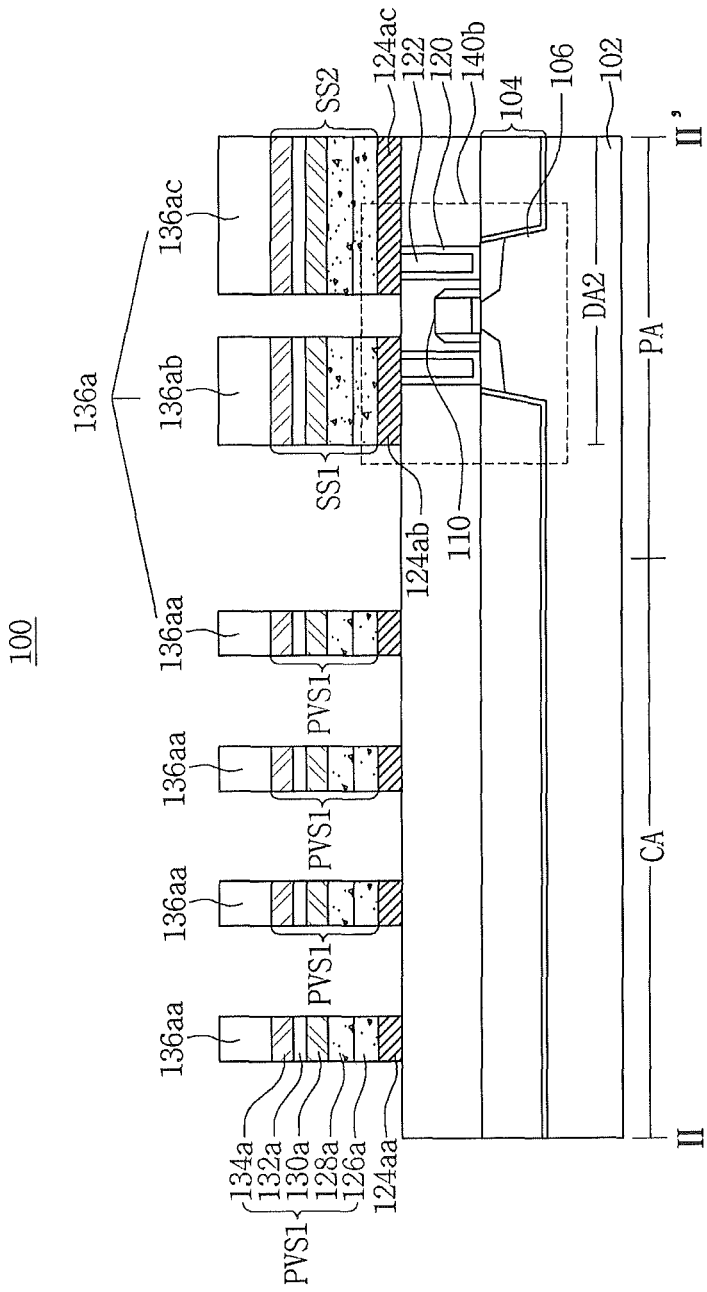
Figure 8C:
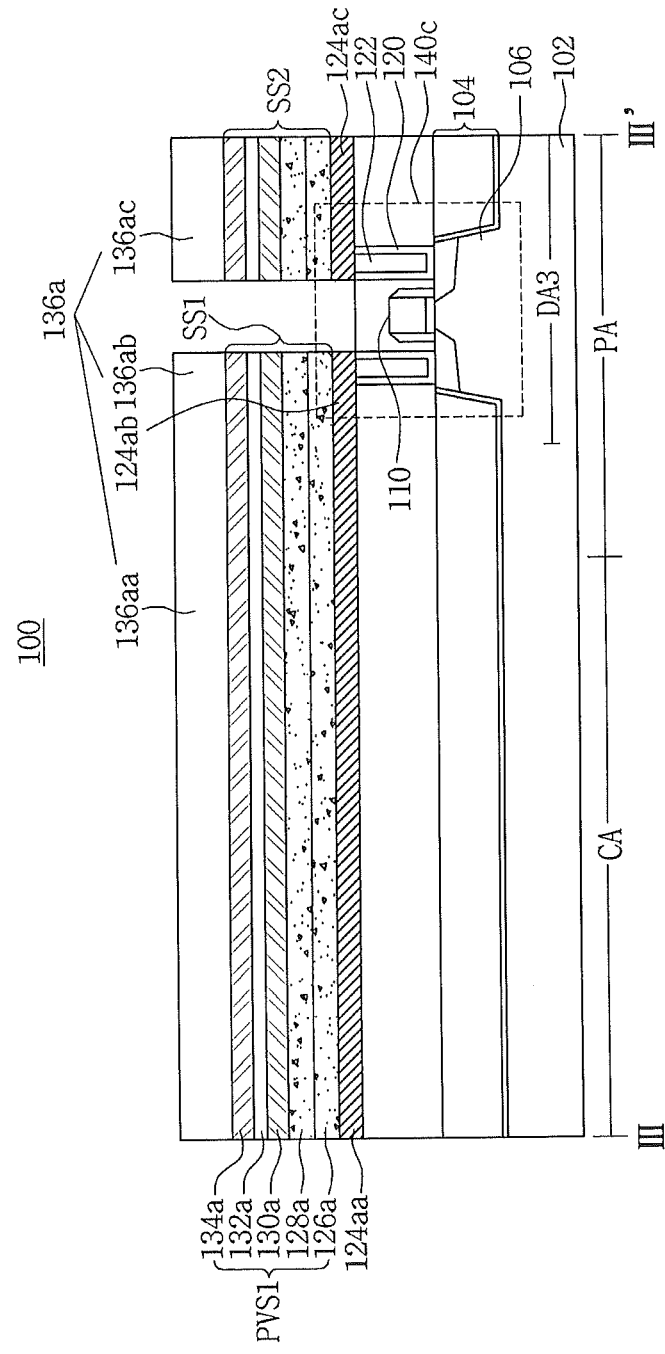

The forming of the first planarization layer 142aa may include forming a first planarization insulating layer 142a on the entire surface of the substrate 102 in which the first bit line mask patterns 136aa and the first and second electrode mask patterns 136ab and 136ac illustrated in FIGS. 8A to 8C are removed.

In addition, the forming of the first planarization layer 142aa may include performing a planarization process on the first planarization insulating layer 142a. The planarization process may include a chemical mechanical polishing (CMP) process. The first planarization layer 142aa may include a silicon oxide layer.

The first planarization layer 142aa may be at the same level as surfaces of the first preliminary vertical structures PVS1 and the first and second stacked structures SS1 and SS2.

Figure 10A:
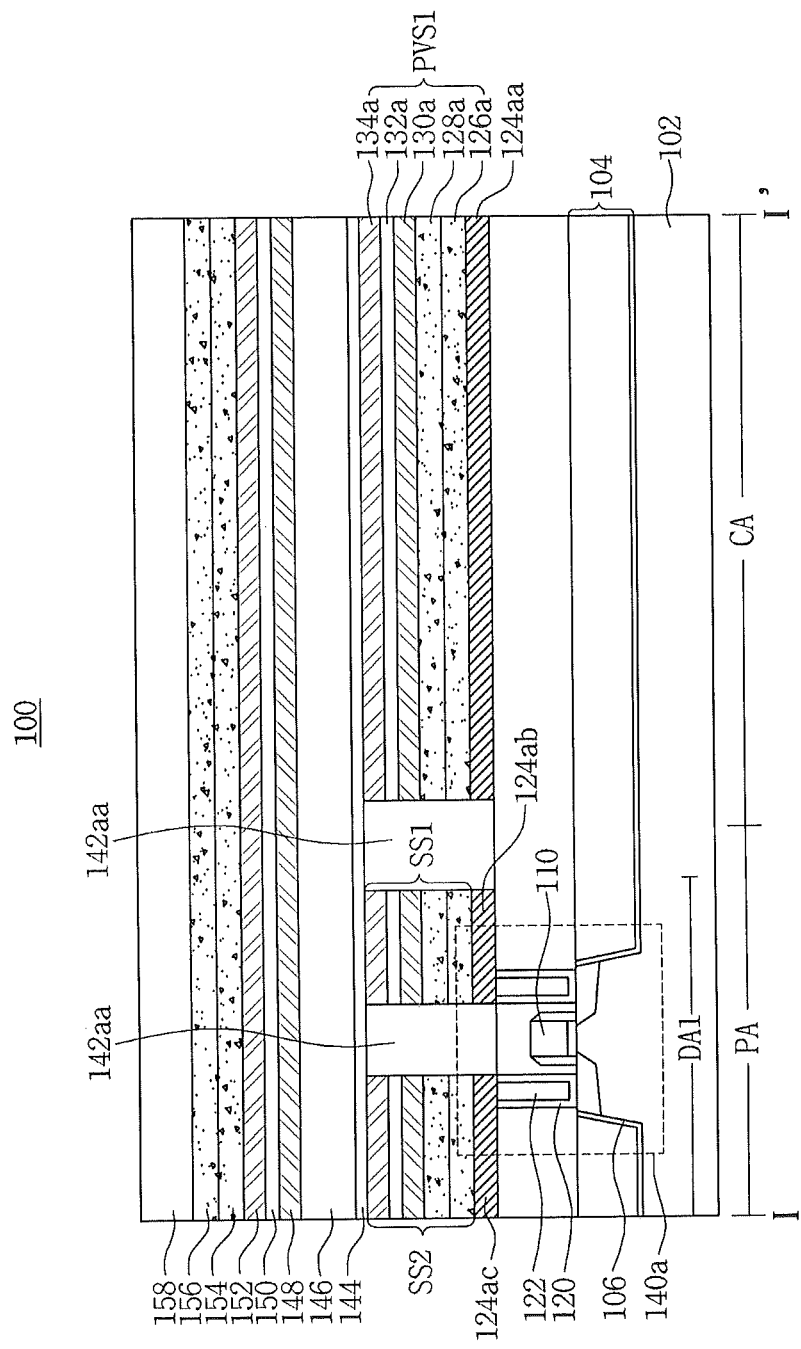
Figure 10B:
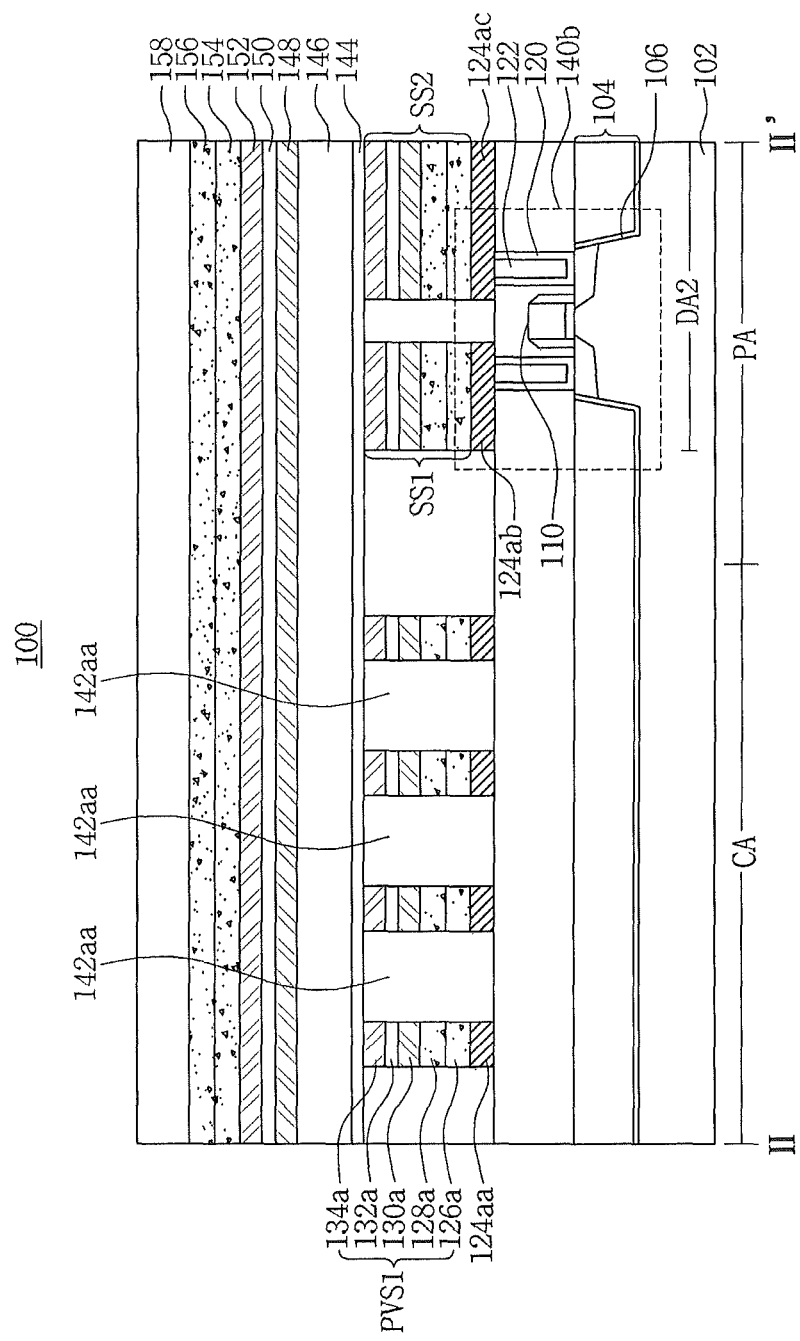
Figure 10C:
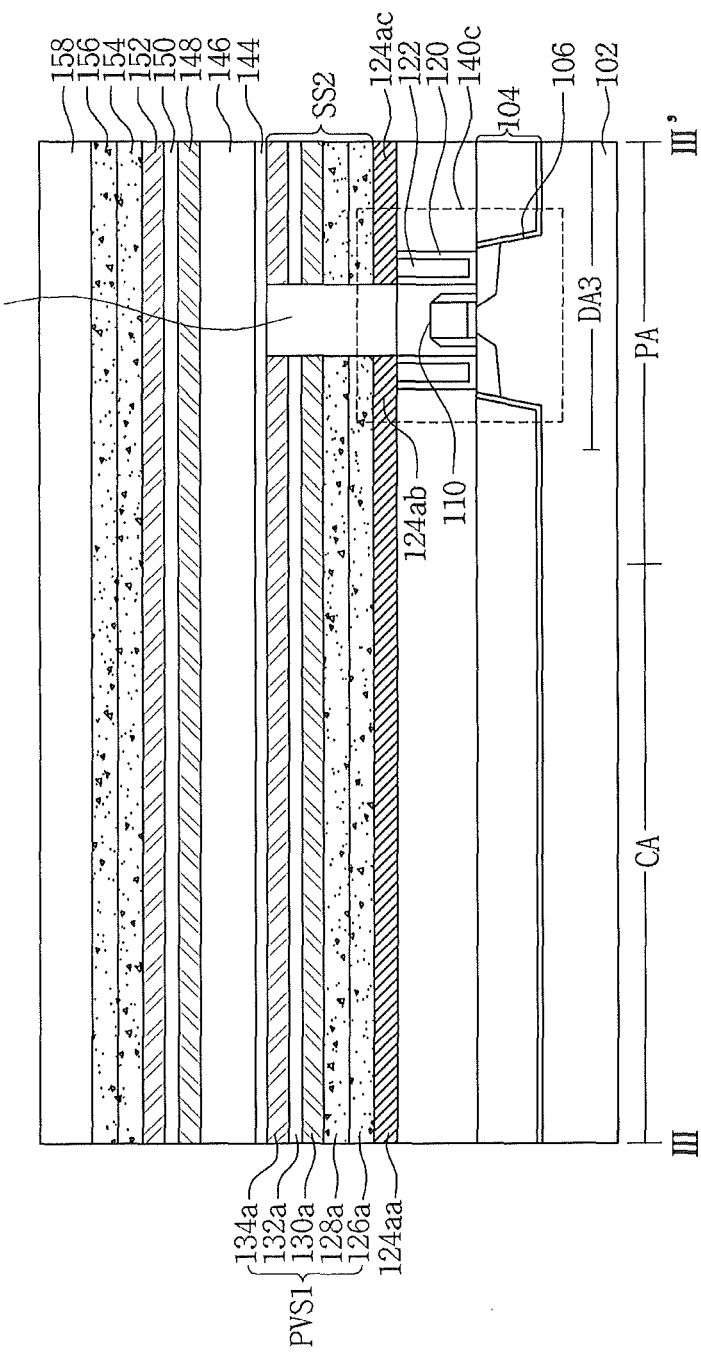

Referring to FIGS. 10A, 10B, and 10C, the method of fabricating the memory device 100 according to the embodiment of the inventive concept may include forming a first barrier metal layer 144, a second metal layer 146, a third electrode layer 148, a second resistance layer 150, a fourth electrode layer 152, a third impurity layer 154, a fourth impurity layer 156, and a second hard mask layer 158.

The first barrier metal layer 144 may include titanium nitride (TiN), and the second metal layer 146 may include titanium (Ti).

The third electrode layer 148 and the fourth electrode layer 152 may include platinum (Pt), ruthenium (Ru), ruthenium oxide (RuOx), Iridium (Ir), Iridium oxide (IrOx), titanium nitride (TiN), tungsten (W), tantalum (Ta), or tantalum nitride (TaN). In another embodiment, the third electrode layer 148 or the fourth electrode layer 152 may include polysilicon.

The second resistance layer 150 may include hafnium oxide (HfOx), titanium oxide (TiOx), nickel oxide (NiOx), zirconium oxide (ZrOx), aluminum oxide (AlOx), silicon oxide (SiOx), niobium oxide (NbOx), or tungsten oxide (WOx).

The third impurity layer 154 and the fourth impurity layer 156 may include an N-type impurity layer or P-type impurity layer. The third impurity layer 154 and the fourth impurity layer 156 may include opposite types of impurities. For example, the third impurity layer 154 may include a P-type impurity layer, and the fourth impurity layer 156 may include an N-type impurity layer.

The N-type impurity layer may include N-type impurities, and the P-type impurity layer may include P-type impurities.

An intrinsic amorphous silicon layer may be further included between the third impurity layer 154 and the fourth impurity layer 156.

The second hard mask layer 158 may include silicon nitride and silicon oxide.

In the above-described process, a silicide layer may be formed on an interface between the fourth electrode layer 152 and the third impurity layer 154.

Referring to FIGS. 11A, 11B, 11C, and 2, the method of fabricating the memory device 100 according to the embodiment of the inventive concept may include forming second hard mask patterns 158a, second preliminary vertical structures PVS2, word lines 146a, word line barriers 144a, and first vertical structures VS1.

The forming of the second hard mask patterns 158a may include patterning the second hard mask layer 158 illustrated in FIGS. 10C to 10C.

The forming of the word line barriers 144A, the word lines 146A and the second preliminary vertical structures PVS2 may include patterning the first barrier metal layer 144, the second metal layer 146, the third electrode layer 148, the second resistance layer 150, the fourth electrode layer 152, the third impurity layer 154, and the fourth impurity layer 156 which are illustrated in the FIGS. 10A to 10C using the second hard mask patterns 158a as a mask.

The second hard mask patterns 158a, the second preliminary vertical structures VS2, the word lines 146a, and the word line barriers 144a may be formed in the same shape.

The second preliminary vertical structures PVS2, the word lines 146a, and the word line barriers 144a may extend in a second direction which crosses the first bit lines 124aa, and be spaced in a first direction perpendicular to the second direction.

Each of the second preliminary vertical structures PVS2 may include a third preliminary electrode pattern 148a, a second preliminary variable resistance pattern 150a, a fourth preliminary electrode pattern 152a, a second preliminary P-type impurity pattern 154a, and a second preliminary N-type impurity pattern 156a.

The first vertical structures VS1 may be formed by patterning the first preliminary vertical structures PVS1 illustrated in FIGS. 10A to 10C.

The first vertical structures VS1 may be formed in an island shape in every region in which the word lines 146a cross the first bit lines 124aa.

The first vertical structures VS1 may be a first unit memory cell DMC1, and include a first diode D1 and a first variable resistance device R1 which are vertically connected in series. The first diode D1 may include a first N-type impurity pattern 126aa and a first P-type impurity pattern 128aa which are vertically stacked. The first variable resistance device R1 may include a first electrode 130aa, a first variable resistor 132aa, and a second electrode 134aa which are sequentially stacked.

Referring to FIG. 2, one end of the word line 146a may be spaced in a vertical direction with respect to the first source/drain electrode 124ab of the second driving transistor 140b in the second driving region DA2.

In addition, while performing the patterning process, the first and second stacked structures SS1 and SS2 illustrated in FIGS. 10A to 10C may be removed. Accordingly, surfaces of the first source/drain electrodes 124ab and the second source/drain electrodes 124ac of the first driving transistor 140a, the second driving transistor 140b and the third driving transistor 140c may be exposed.

While forming the first vertical structure VS1 and the second preliminary vertical structures PVS2, a surface of the first planarization layer 142aa may be recessed.

Here, the surfaces of the first source/drain electrode 124ab and the second source/drain electrode 124ac of each of the transistors 140a, 140b and 140c may be disposed at a lower location than a recessed surface of the first planarization layer 142aa by a difference of etch rates.

The second hard mask patterns 158a may be removed in the following process.

Figure 12A:
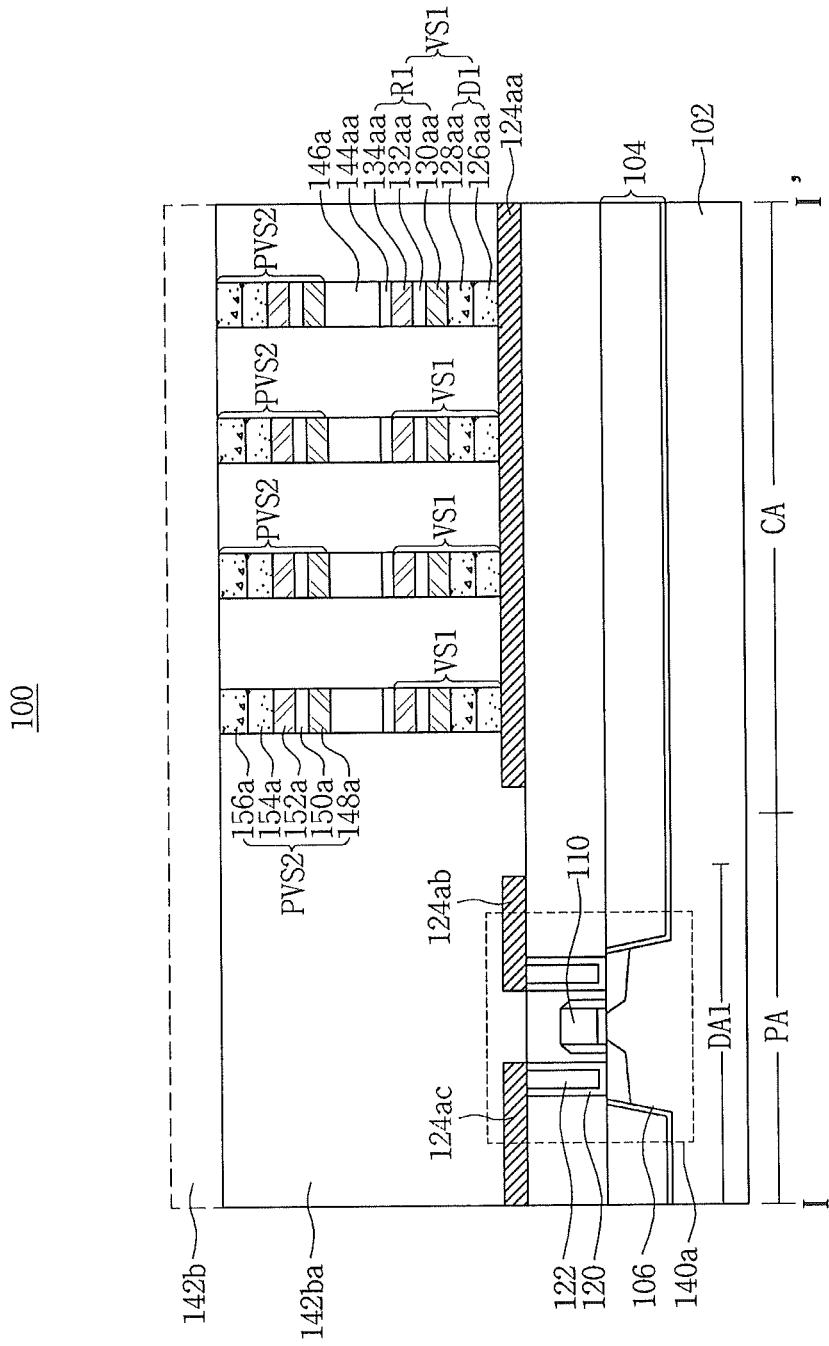
Figure 12B:
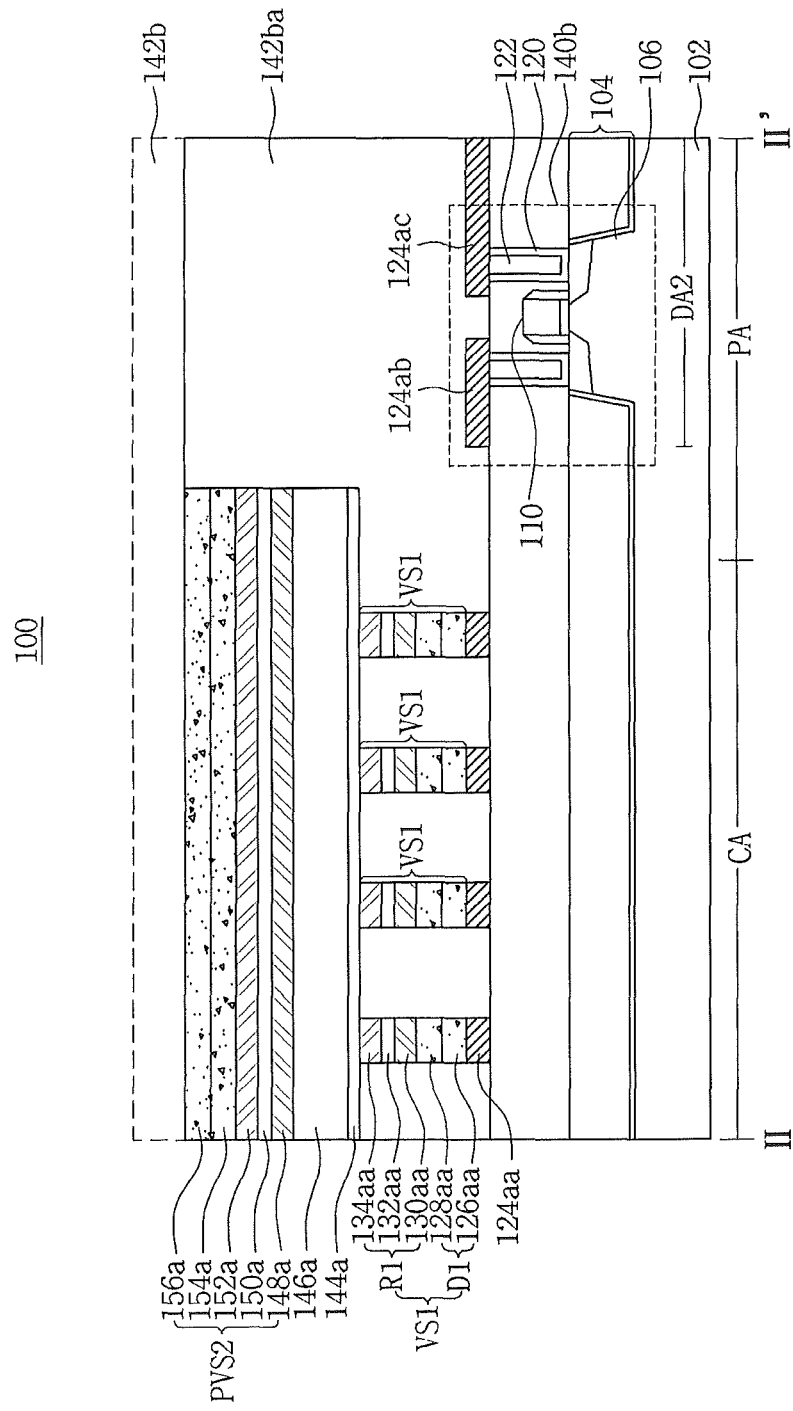
Figure 12C:
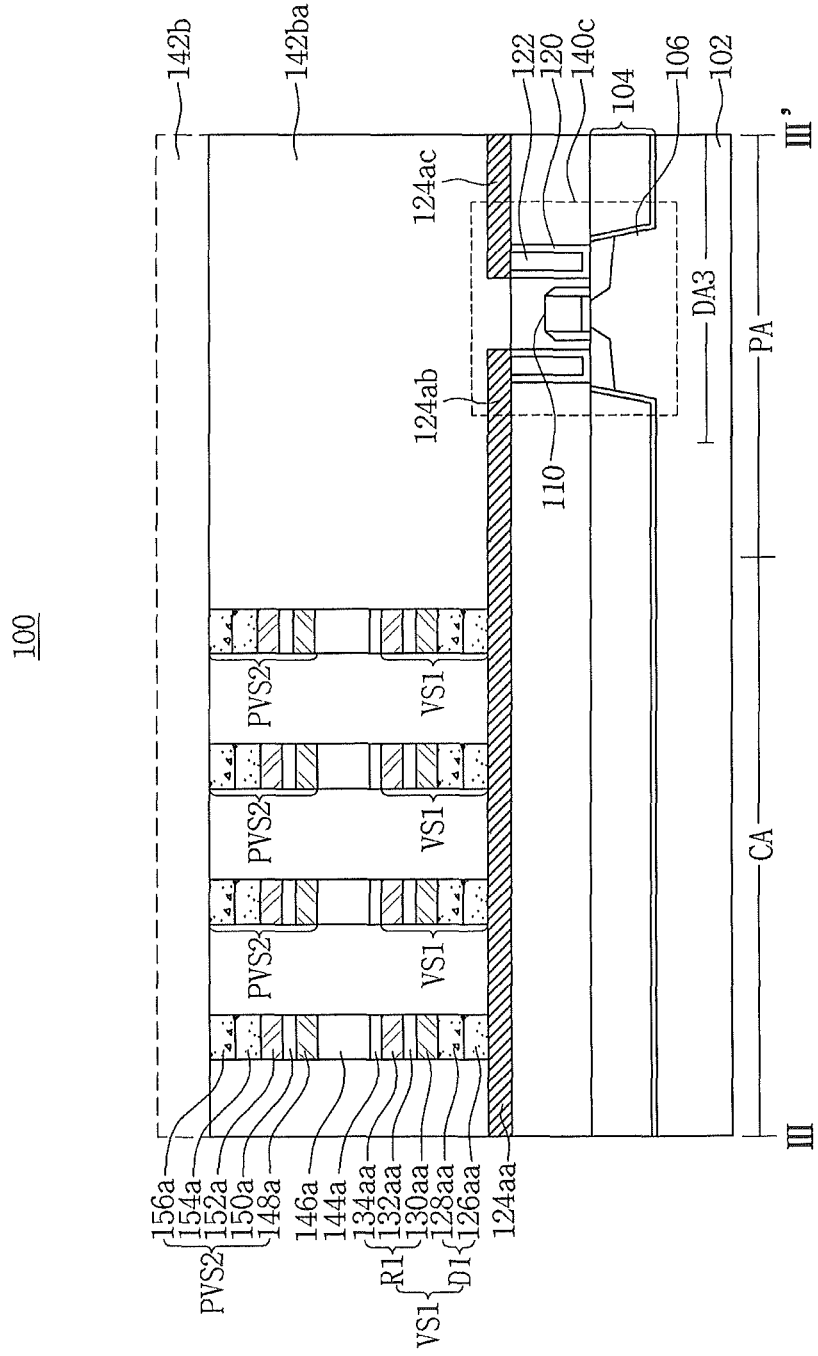

Referring to FIGS. 12A, 12b, 12C, the method of fabricating the memory device 100 according to the embodiment of the inventive concept may include forming a second planarization layer 142ba.

Figure 11A:
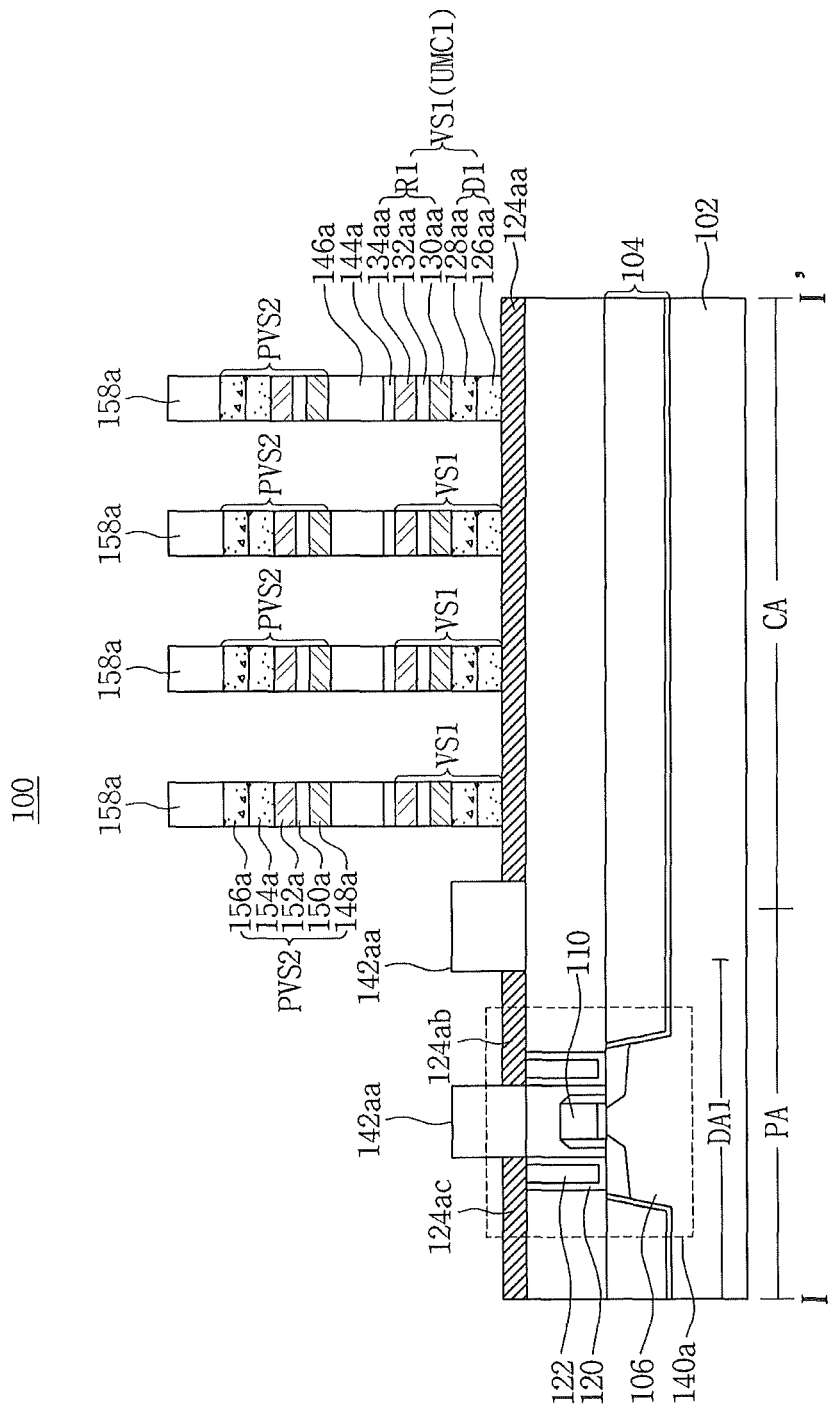
Figure 11B:
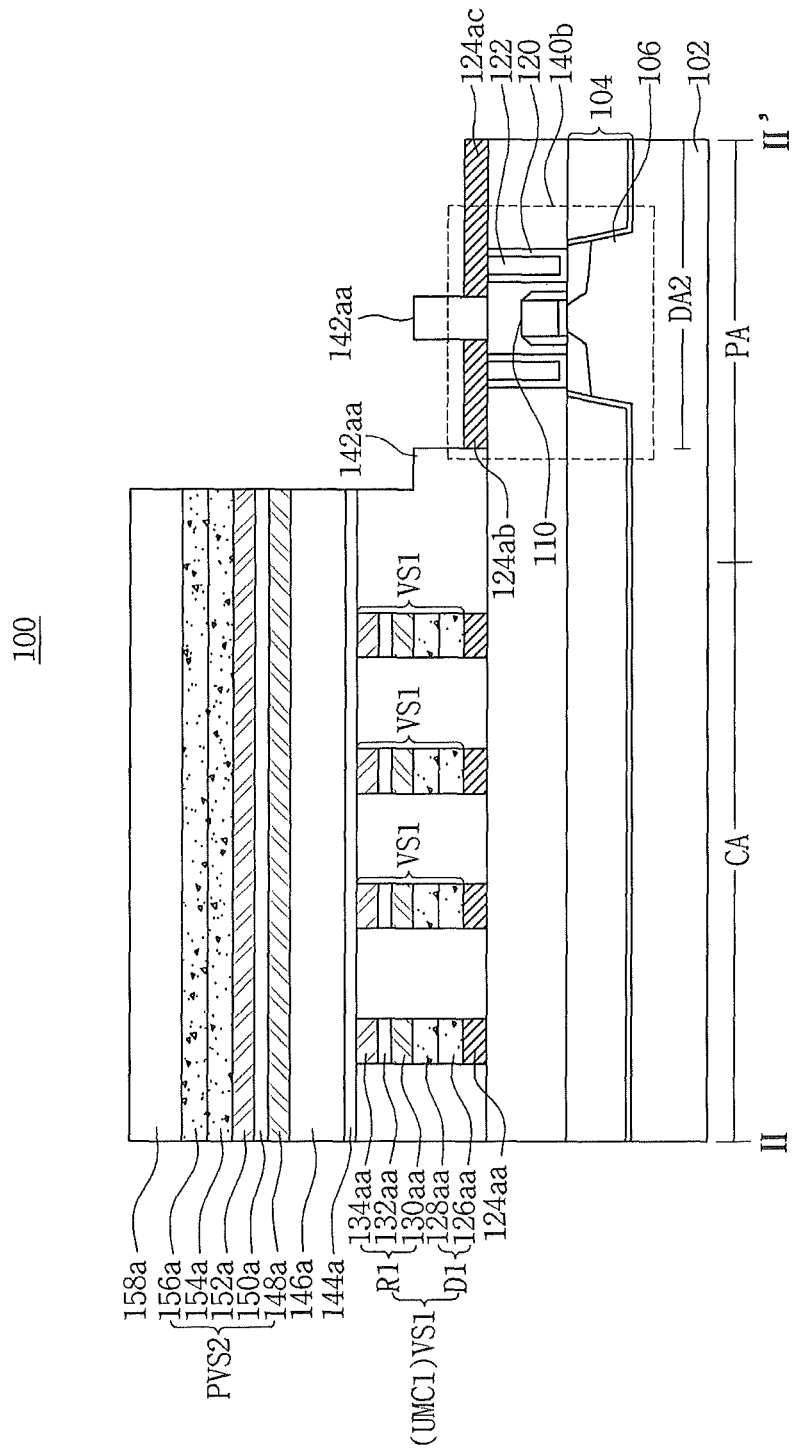
Figure 11C:
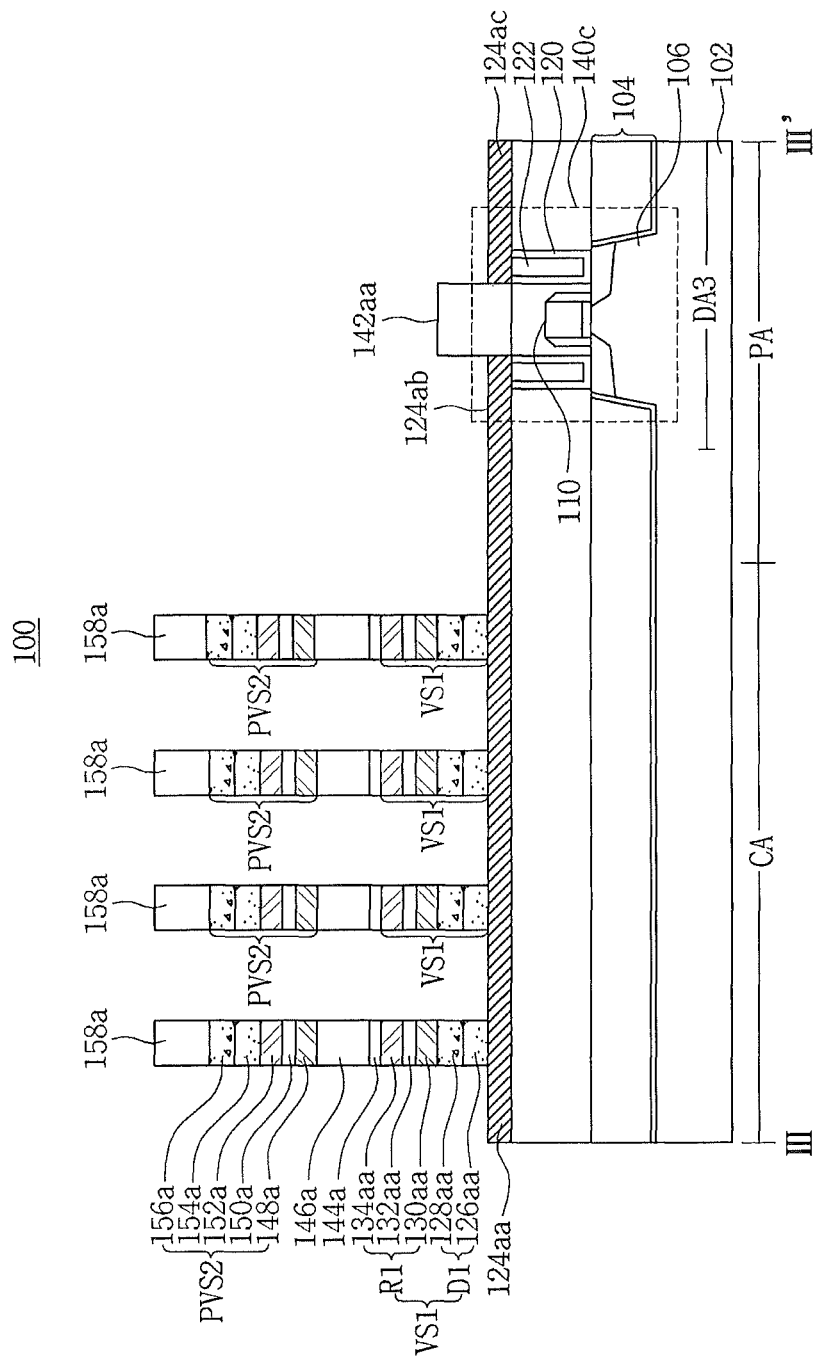

The forming of the second planarization layer 142ba may include forming a second planarization insulating layer 142b on the entire surface of the substrate 102 in which the second hard mask patterns 158a illustrated in the FIGS. 11A to 11C are removed.

Furthermore, the forming of the second planarization layer 142ba may include performing a planarization process on the second planarization insulating layer 142b. The planarization process may include a CMP process.

The second planarization layer 142ba may include a silicon oxide layer.

A surface of the second planarization layer 142ba may be at the same level as surfaces of the second preliminary vertical structures PVS2.

Figure 13A:
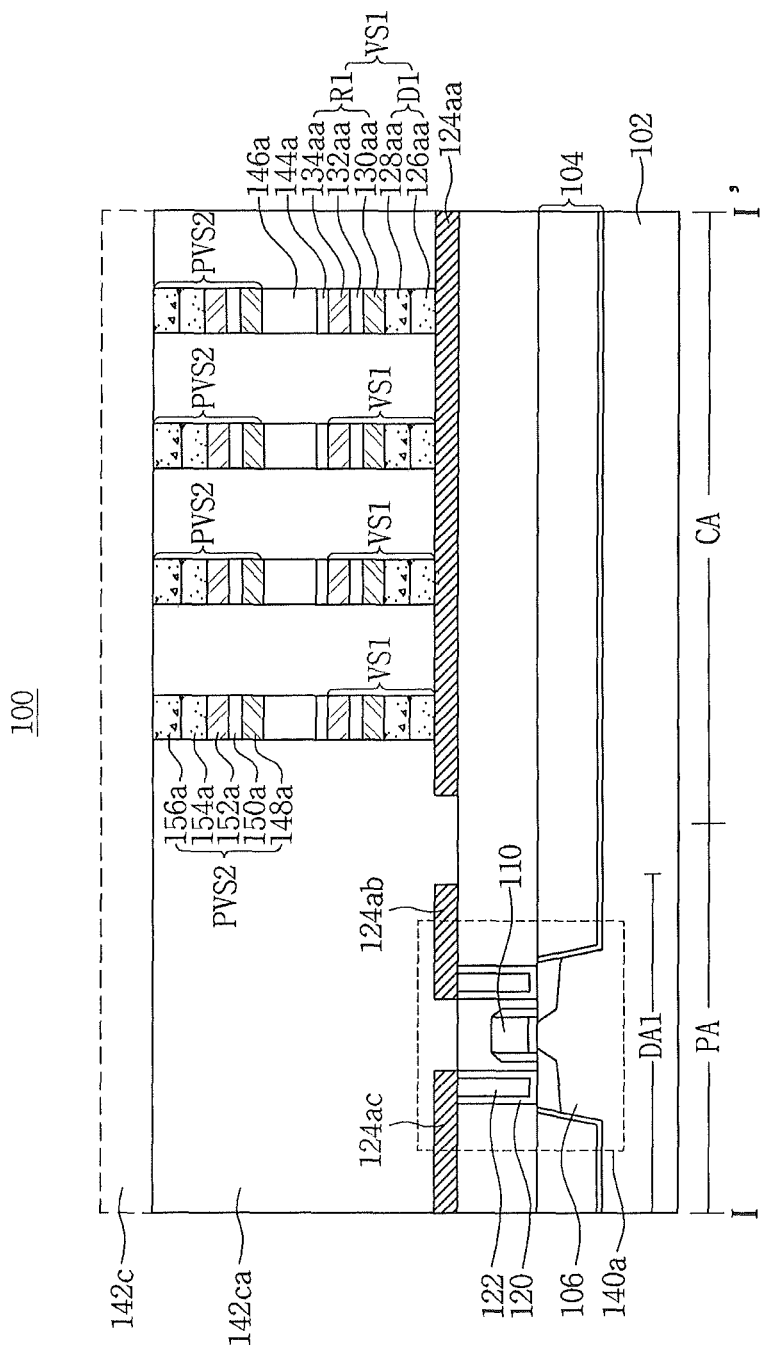
Figure 13B:
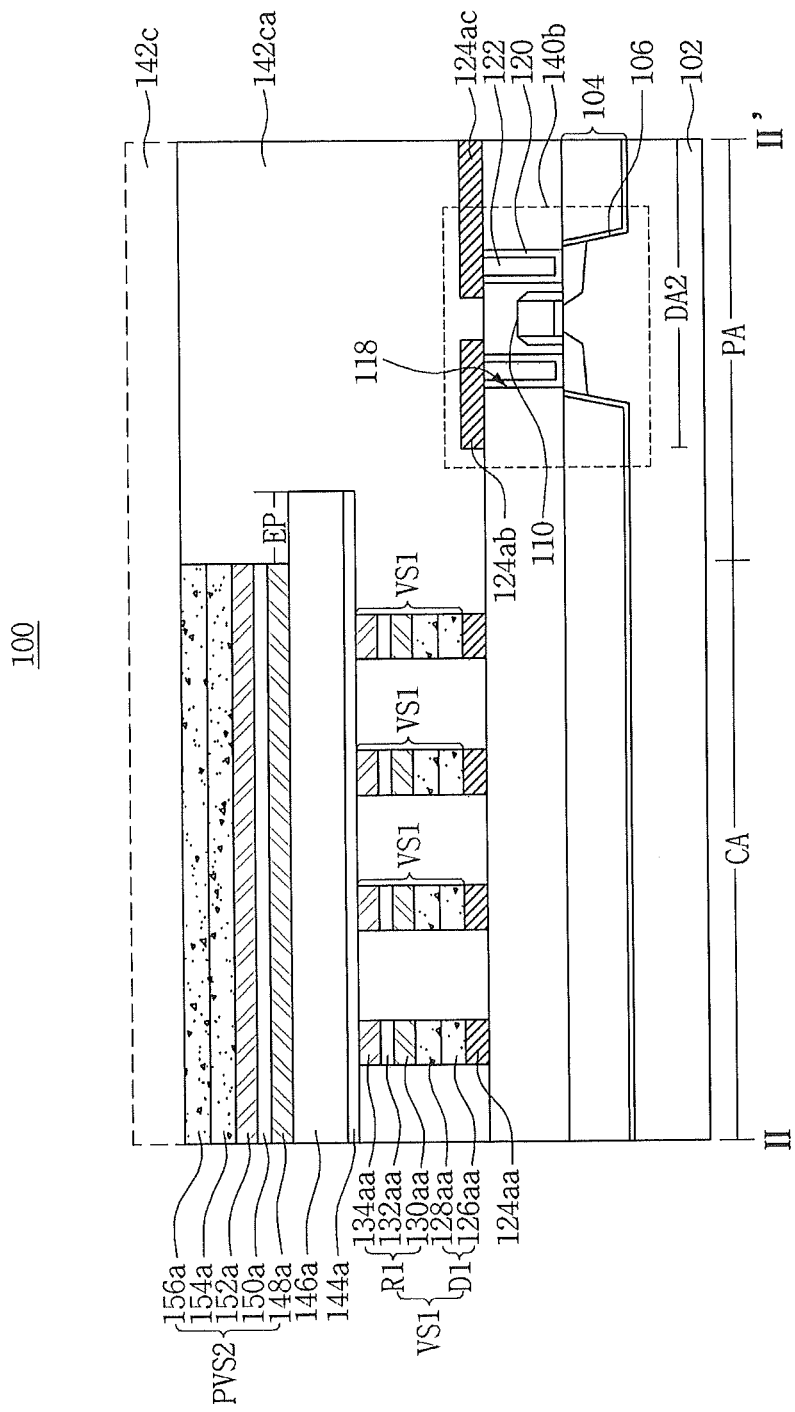
Figure 13C:
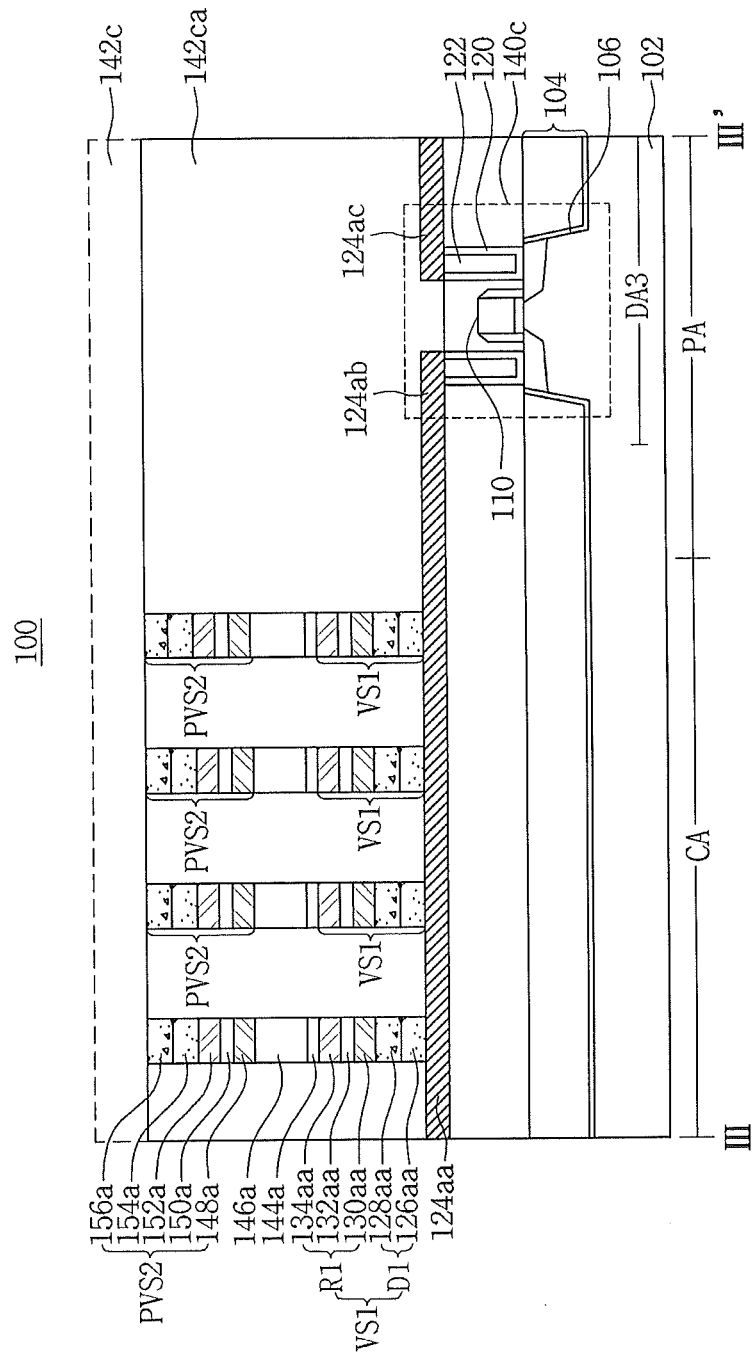

Referring to FIGS. 13A, 13B, and 13C, the method of fabricating the memory device 100 according to the embodiment of the inventive concept may include exposing an end EP of the word line 146a, and forming a third planarization layer 142ca.

The exposing of the end EP of the word line 146a may include removing a portion adjacent to the second driving region DA2 among the second preliminary vertical structures PVS2.

The forming of the third planarization layer 142ca may include forming a third planarization insulating layer 142c on the entire surface of the substrate 102.

In addition, the forming of the third planarization layer 142ca may include performing a planarization process on the third planarization insulating layer 142c. The planarization process may include a CMP process.

The third planarization layer 142ca may include silicon oxide.

Figure 14A:
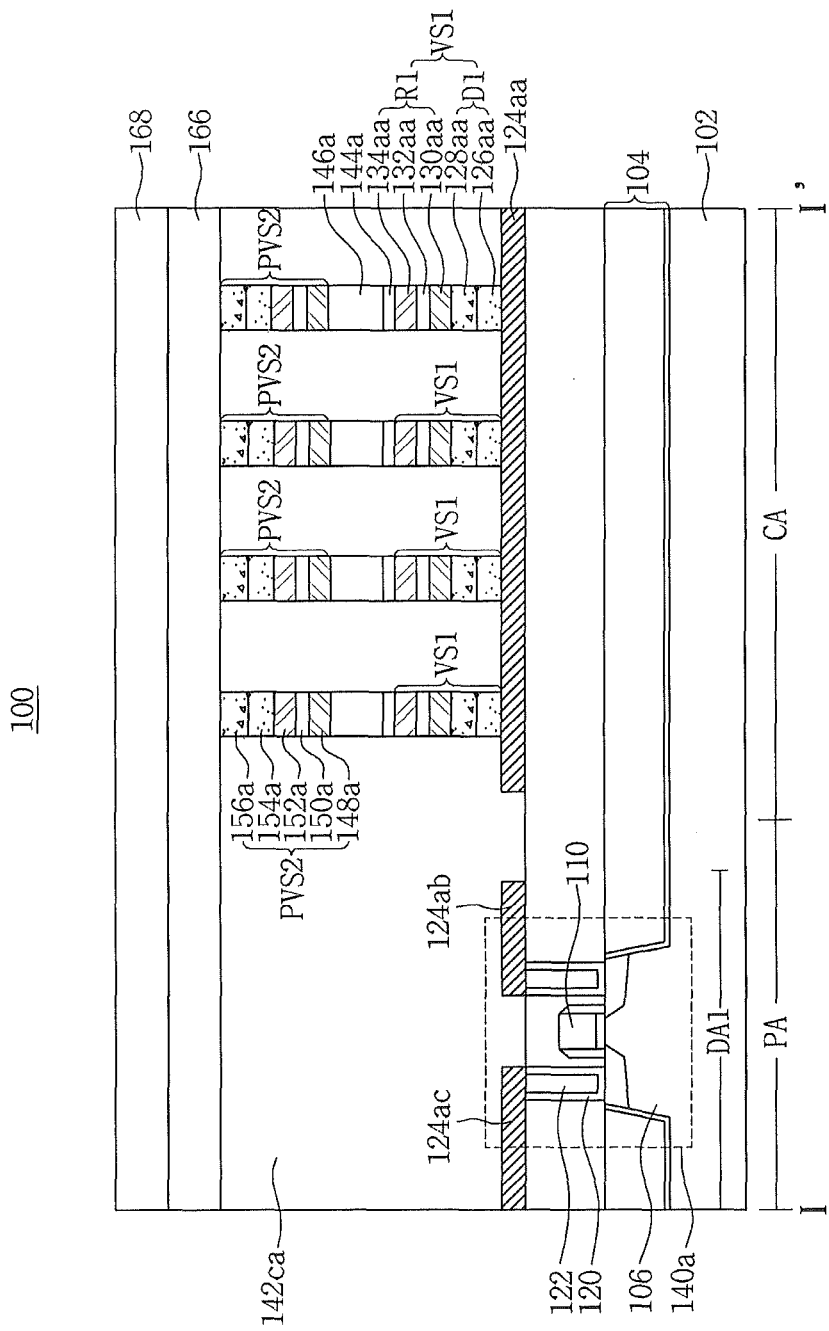
Figure 14B:
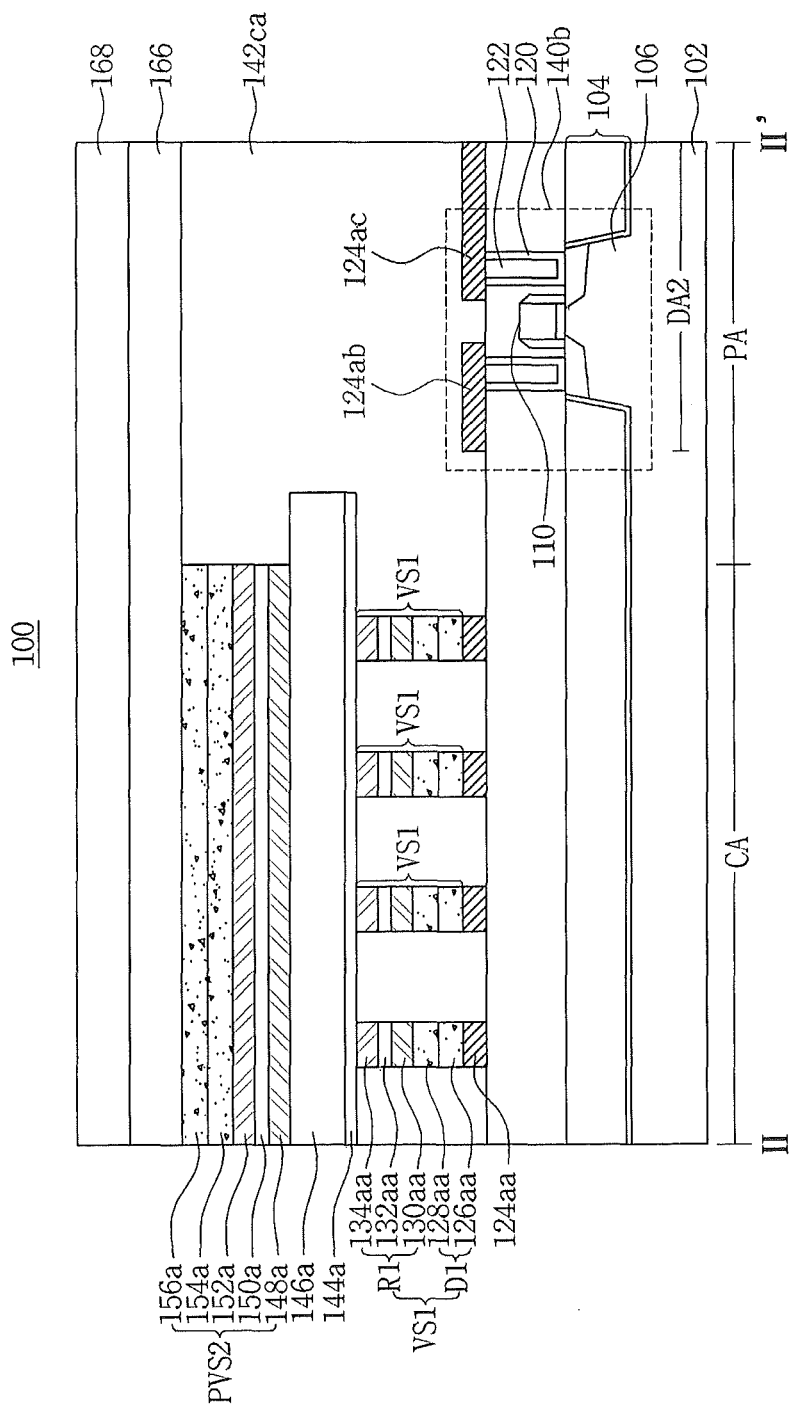
Figure 14C:
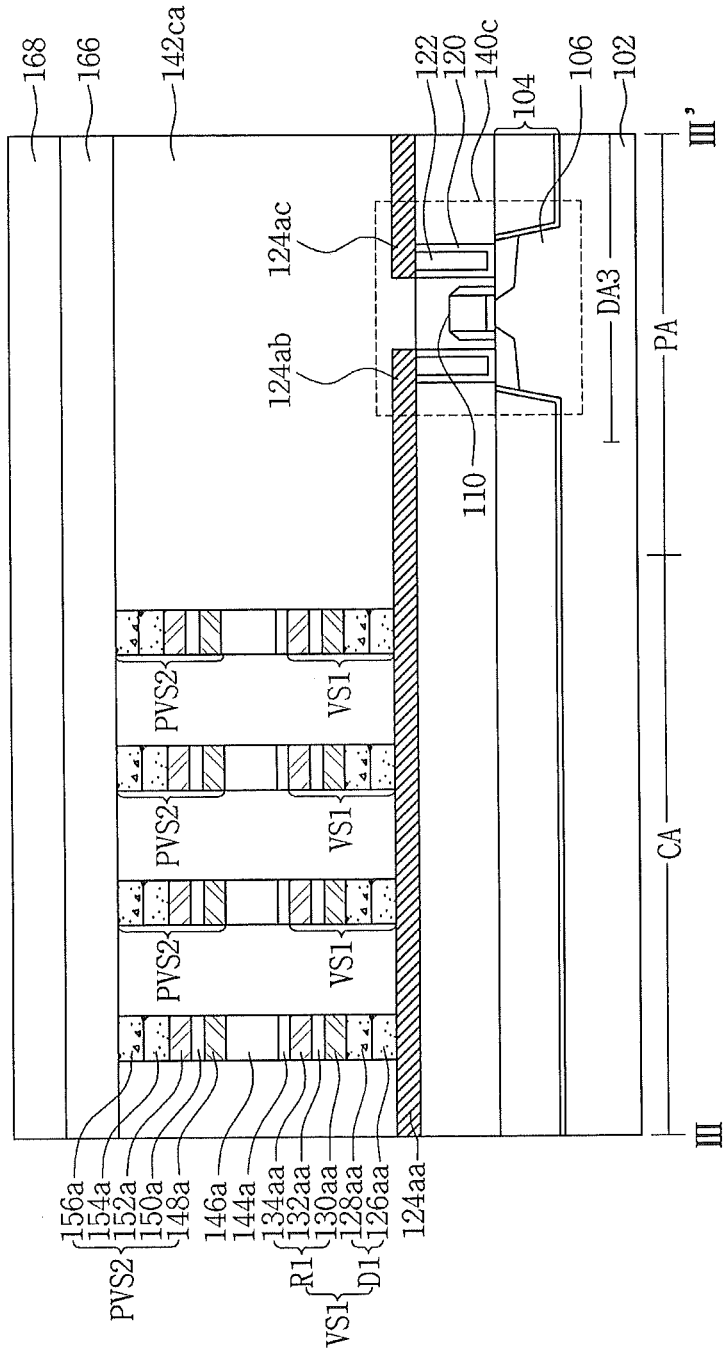
Figure 15A:
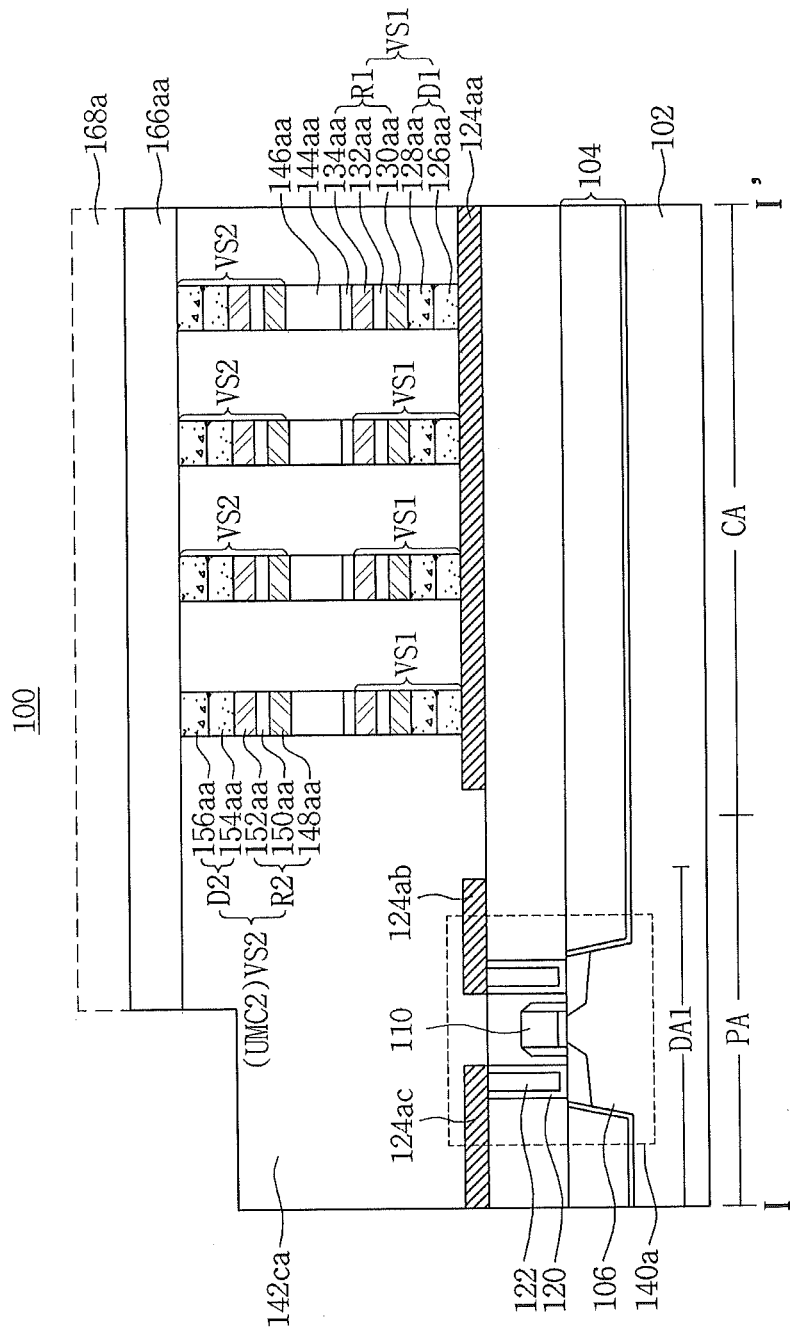
Figure 15B:
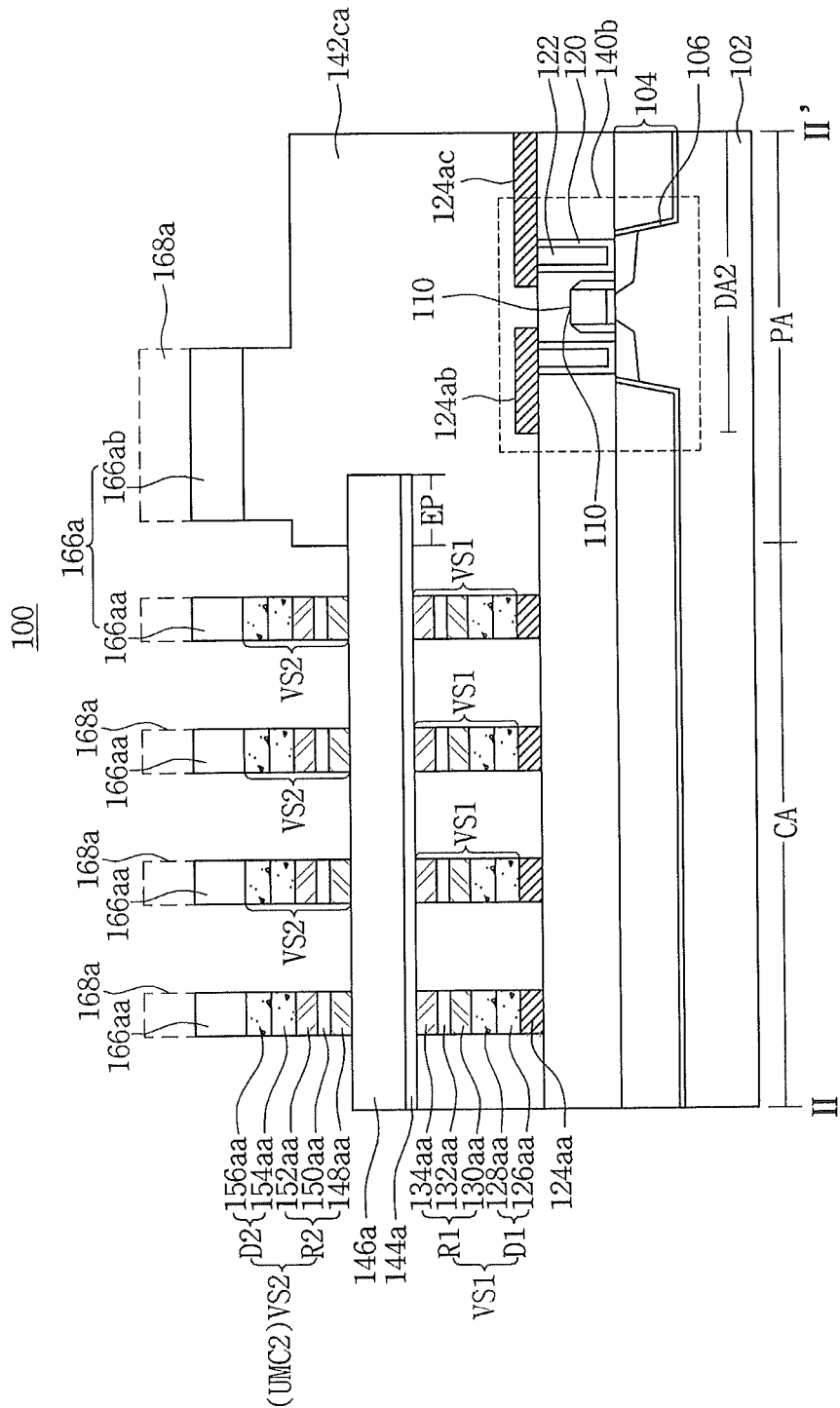
Figure 15C:
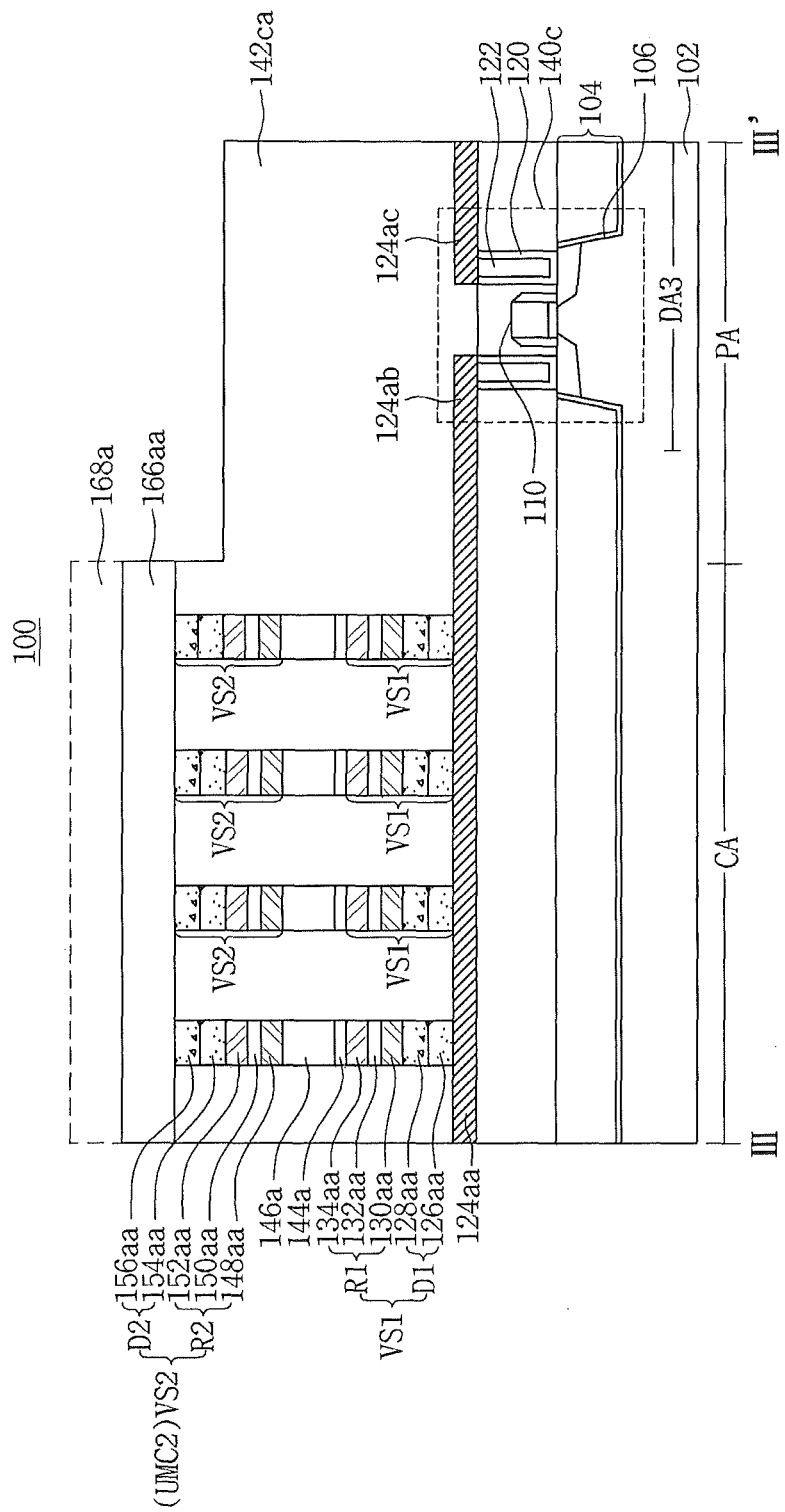

FIGS. 14A, 14b, and 14C, the method of fabricating the memory device 100 according to the embodiment of the inventive concept may include forming a third hard mask layer 166 and a fourth hard mask layer 168 on an upper surface of the third planarization layer 142ca.

The third hard mask layer 166 may include silicon nitride (SiNx), and the fourth hard mask layer 168 may include silicon oxide (SiO2).

Referring to FIGS. 15A, 15B, 15C, and 2, the method of fabricating the memory device 100 according to the embodiment of the inventive concept may include forming third hard mask patterns 166a, fourth hard mask patterns 168a, and second vertical structures VS2.

The fourth hard mask patterns 168a may be formed by a photo etching process. The third hard mask patterns 166a may be patterned using the fourth hard mask patterns 168a as a mask.

The third hard mask patterns 166a may include silicon nitride, and the fourth hard mask patterns 168a may include silicon oxide.

The silicon oxide layer has a small influence by etchants for patterning the silicon nitride layer. Accordingly, the third hard mask pattern 166a including silicon nitride may be patterned in a desired shape using the fourth hard mask pattern 168a including silicon oxide as a mask.

The third hard mask patterns 166a may include second bit line mask patterns 166aa and floating electrode mask patterns 166ab.

The second bit line mask patterns 166aa may be formed to overlap the first bit lines 124aa in a top view. Further, ends of the second bit line mask patterns 166aa may be located on an upper surface of first source/drain electrode 124ab of the first driving transistor 140a.

The floating electrode mask patterns 166ab may be located over the ends EP of the word lines 146a which are exposed in advance as described above, and the first source/drain electrodes 124ab of the second driving transistors 140b.

The forming of the second vertical structure VS2 may include patterning the second preliminary vertical structures PVS2a illustrated in FIGS. 14A to 14C using the second bit line mask patterns 166aa as a mask.

The second vertical structures VS2 may be a second unit memory cell UMC2, and include a second diode D2 and a second variable resistance device R2 which are vertically connected. The second diode D2 may include a second N-type impurity pattern 156aa and a second P-type impurity pattern 154aa which are vertically stacked. The second variable resistance device R2 may include a third electrode 148aa, a second variable resistor 150aa, and a fourth electrode 152aa which are sequentially stacked.

The fourth hard mask patterns 168a may be removed. While forming the second vertical structures VS2 and removing the fourth hard mask patterns 168a, a surface of the third planarization layer 142ca may be recessed.

Accordingly, a recessed surface of the third planarization layer 142ca may be disposed at a lower location than that of the third hard mask pattern 166a.

Figure 16A:
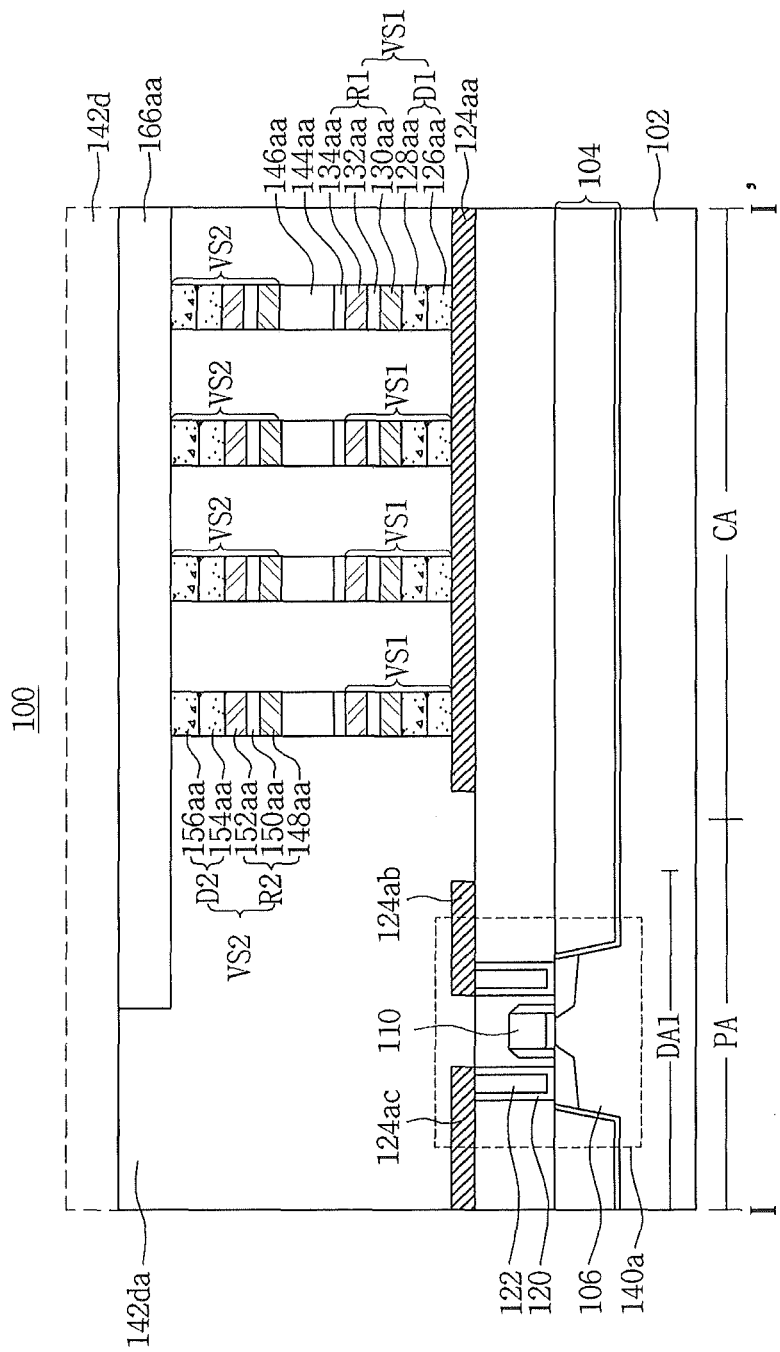
Figure 16B:
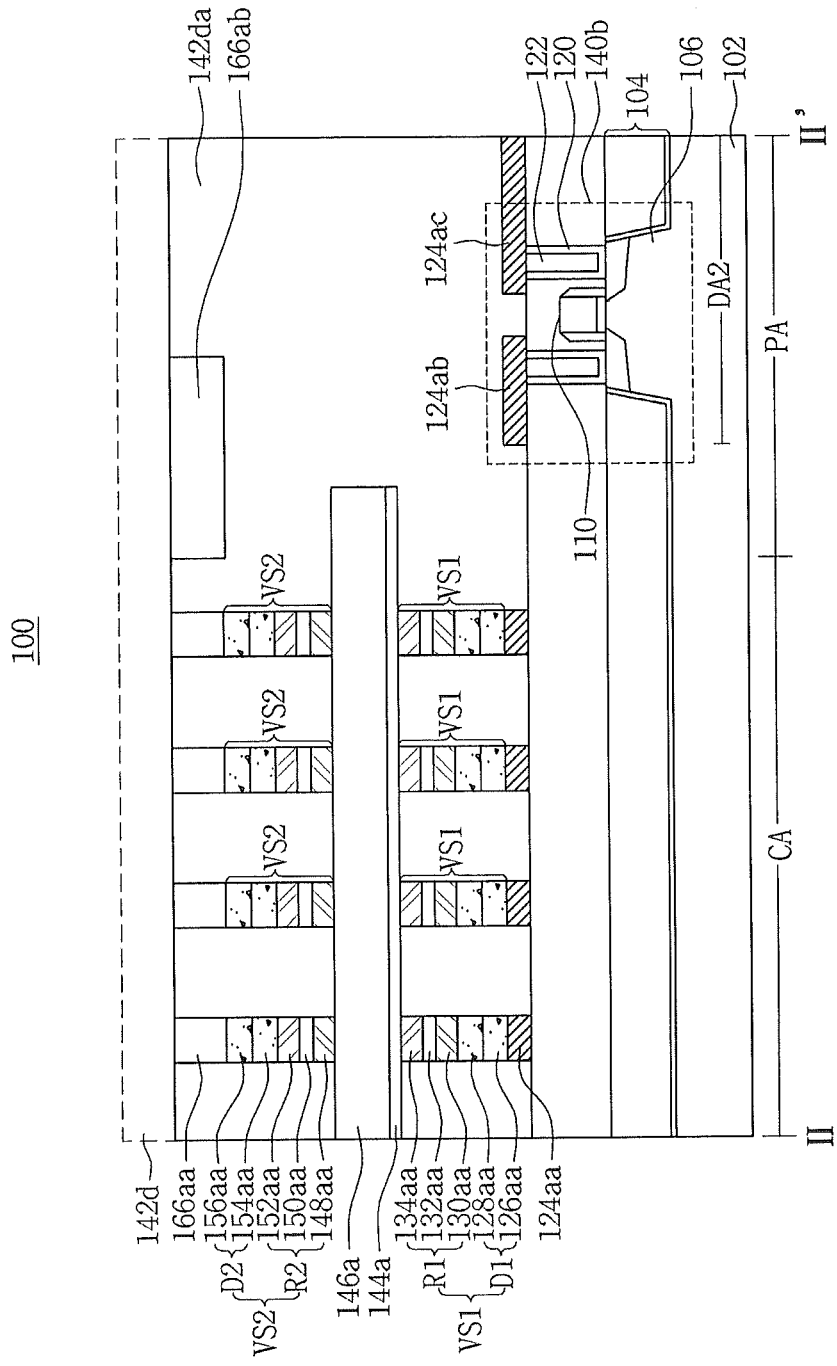
Figure 16C:
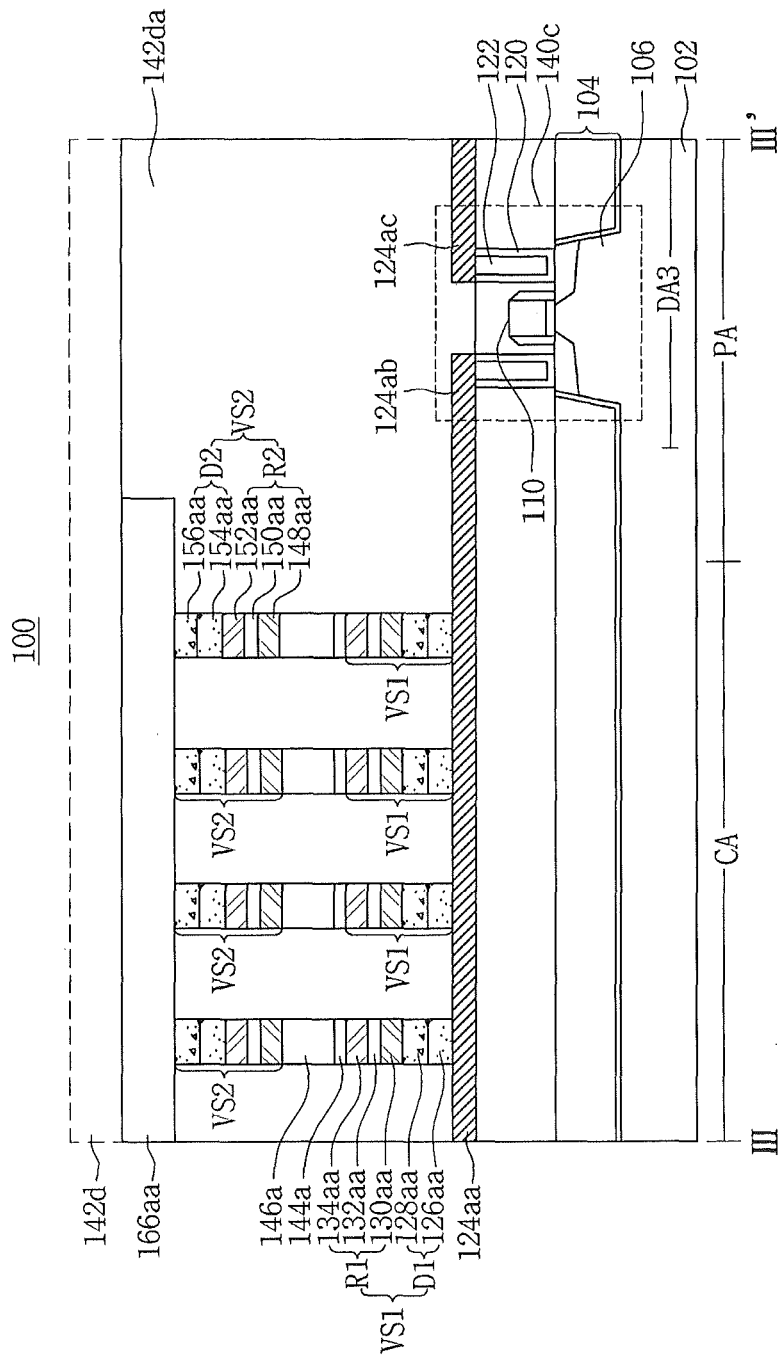

Referring to FIGS. 16A, 16b, and 16C, the method of fabricating the memory device 100 according to the embodiment of the inventive concept may include forming a fourth planarization layer 142da.

The forming of the fourth planarization layer 142da may include forming a fourth planarization insulating layer 142d on the entire surface of the substrate 102 in which the second bit line mask patterns 166aa, the first vertical structure VS1, and the second vertical structure VS2 are formed in the previous process.

The forming of the fourth planarization layer 142da may include performing a planarization process on the fourth planarization insulating layer 142d, The planarization process may include a CMP process.

The fourth planarization layer 142da may include silicon oxide.

A surface of the fourth planarization layer 142da may be at the same level as surfaces of the second bit line mask patterns 166aa and the floating electrode mask patterns 166ab.

Figure 17A:
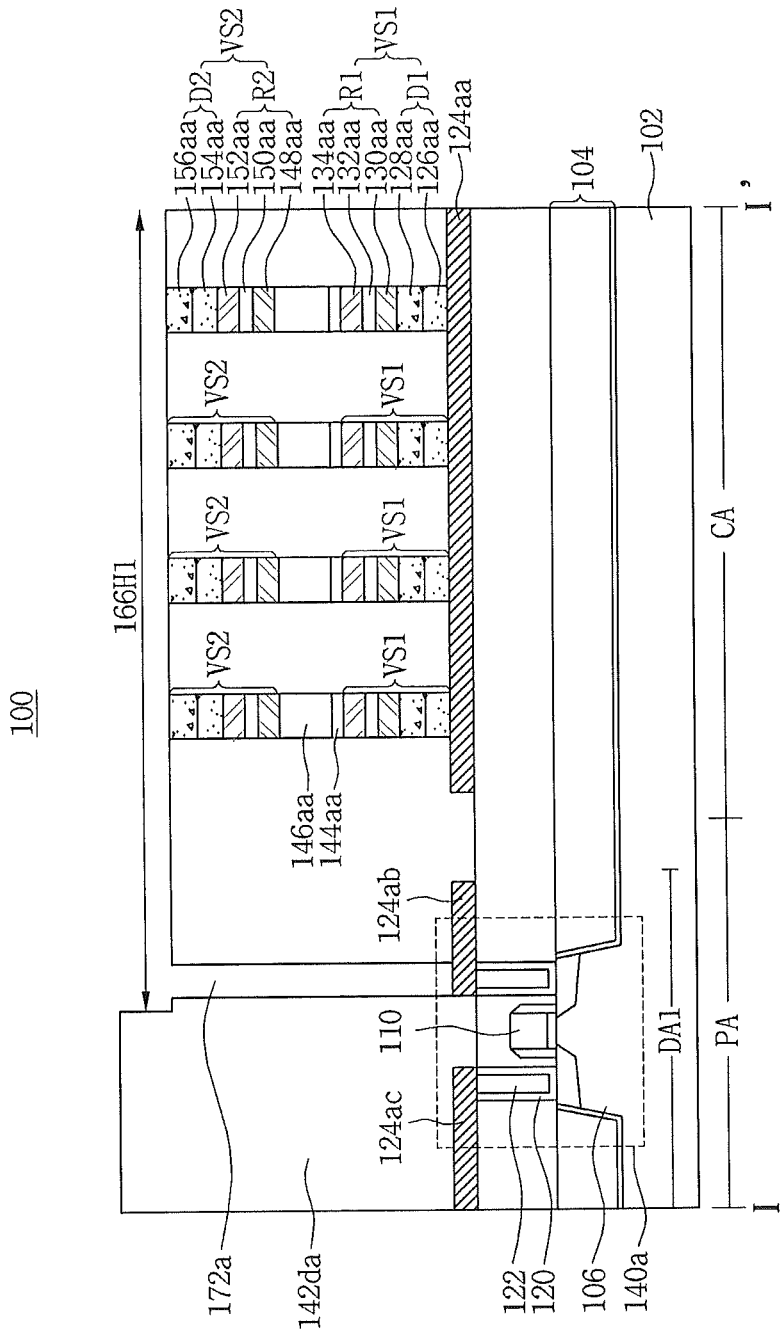
Figure 17B:
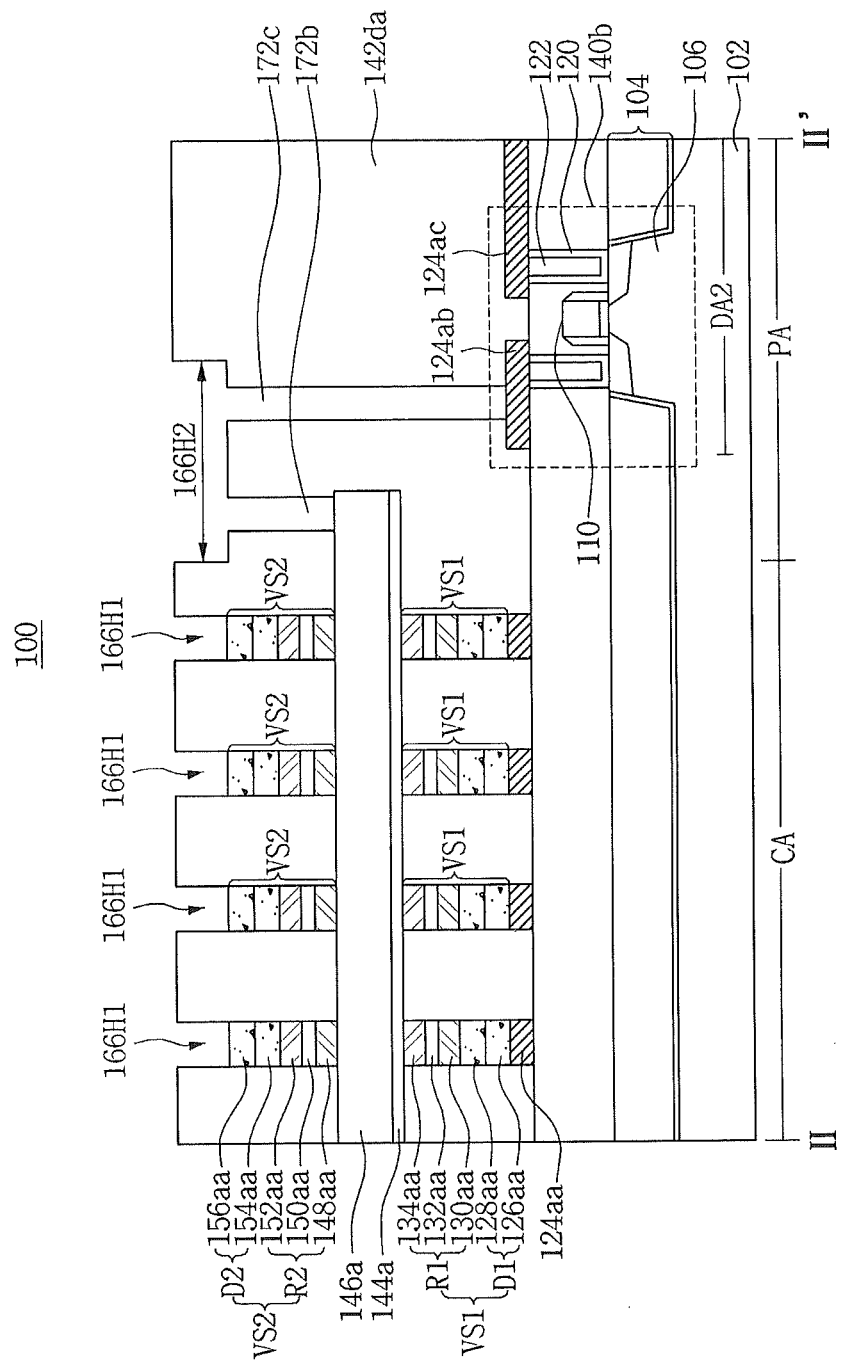
Figure 17C:
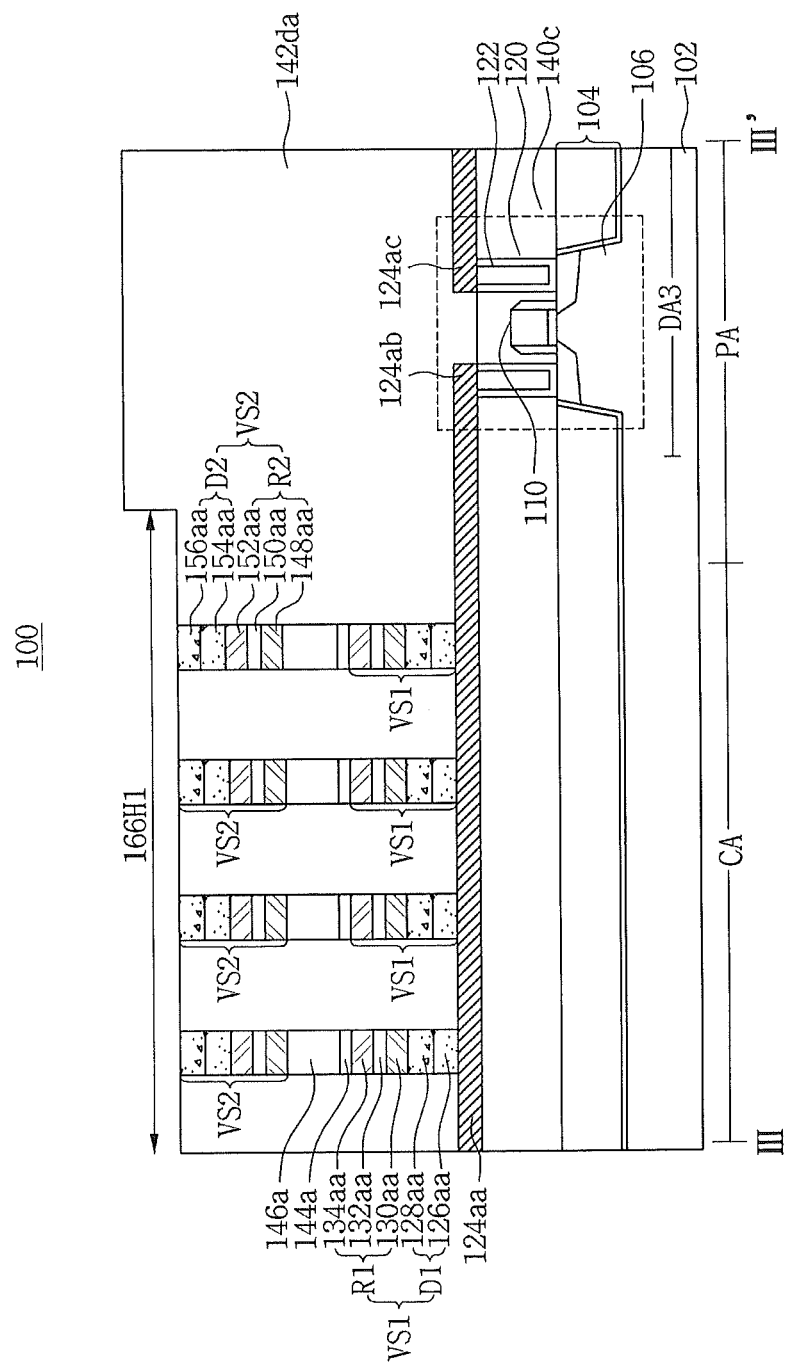

Referring to FIGS. 17A, 17B, and 17C, the method of fabricating the memory device 100 according to the embodiment of the inventive concept may include forming a second bit line groove 166H1, a floating electrode groove 166H2, a bit line contact via 172a, a first floating contact via 172b, and a second floating contact via 172c.

The forming of the second bit line groove 166H1 and the floating electrode groove 166H2 may include removing the second bit line mask patterns 166aa and the floating electrode mask patterns 166ab illustrated in FIGS. 16A to 16C.

The bottom of the second bit line groove 166H1 corresponding to the peripheral region PA may be a surface of the fourth planarization layer 164c, and the bottom of the second bit line groove 166H1 corresponding to the cell region CA may be surfaces of the second vertical structures VS2 and a surface of the fourth planarization layer 142da which fills spaces between the second vertical structures VS2.

The forming of the bit line contact vias 172a may include recessing the bottoms of the second bit line grooves 166H1. The forming of the first floating contact vias 172b and the second floating contact vias 172c may include recessing the bottoms of the floating electrode grooves 166H2.

The bit line contact vias 172a may be located an end of the second bit line grooves 166H1 corresponding to the first driving region DA1, and pass through the fourth planarization layer 142da. The bottoms of the bit line contact vias 172a may be a surface of the first source/drain electrode 124ab of the first driving transistor 140a.

The first floating contact vias 172b may be located between the word lines 146a and the floating electrode grooves 166H2, and the second floating contact vias 172c may be located between the floating electrode grooves 166H2 and the first source/drain electrodes 124ab of the second driving transistors 140b.

Each of the first and second floating contact vias 172b and 172c may pass through the fourth planarization layer 142da. The bottoms of the first floating contact vias 172b may be a surface of the word line 146a, and the bottoms of the second floating contact vias 172c may be a surface of the first source/drain electrode 124ab of the second driving transistor 140b.

Figure 18A:
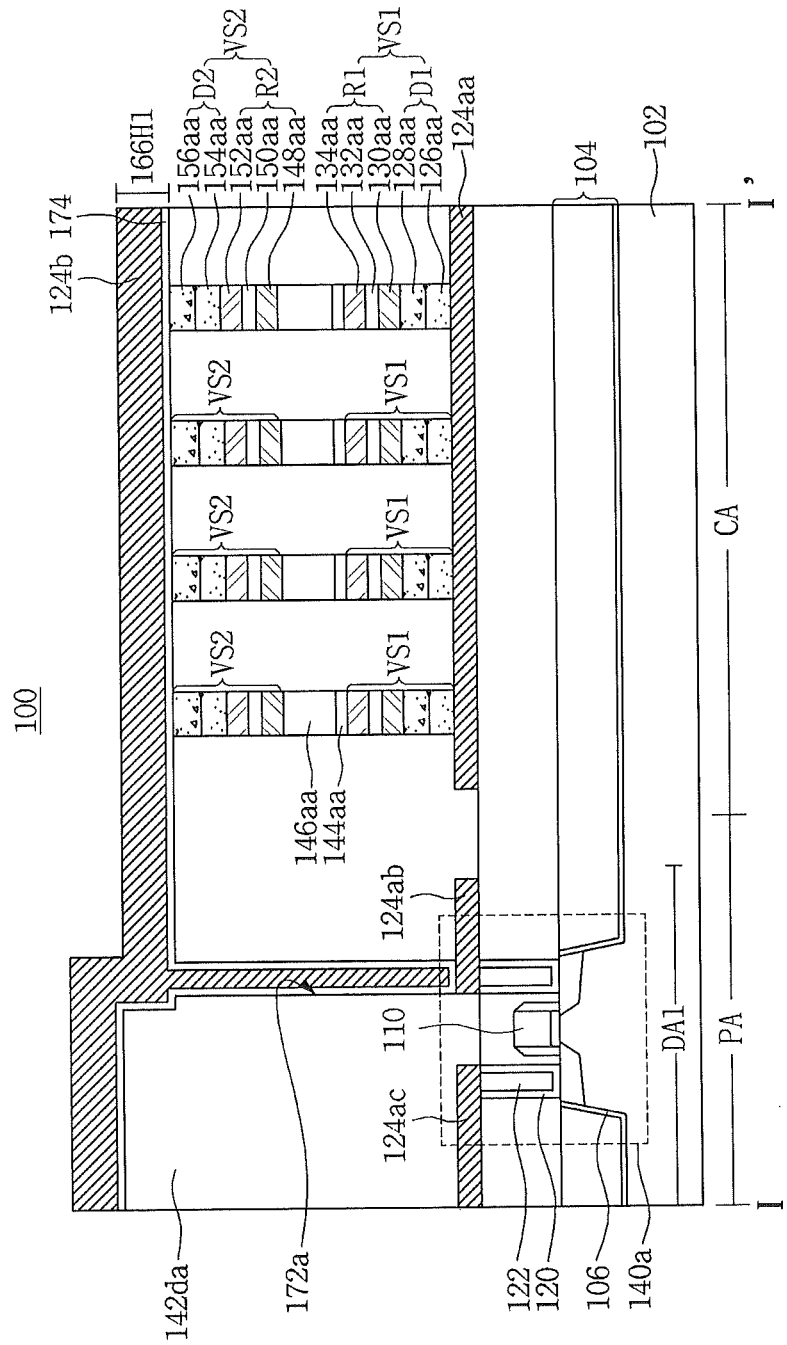
Figure 18B:
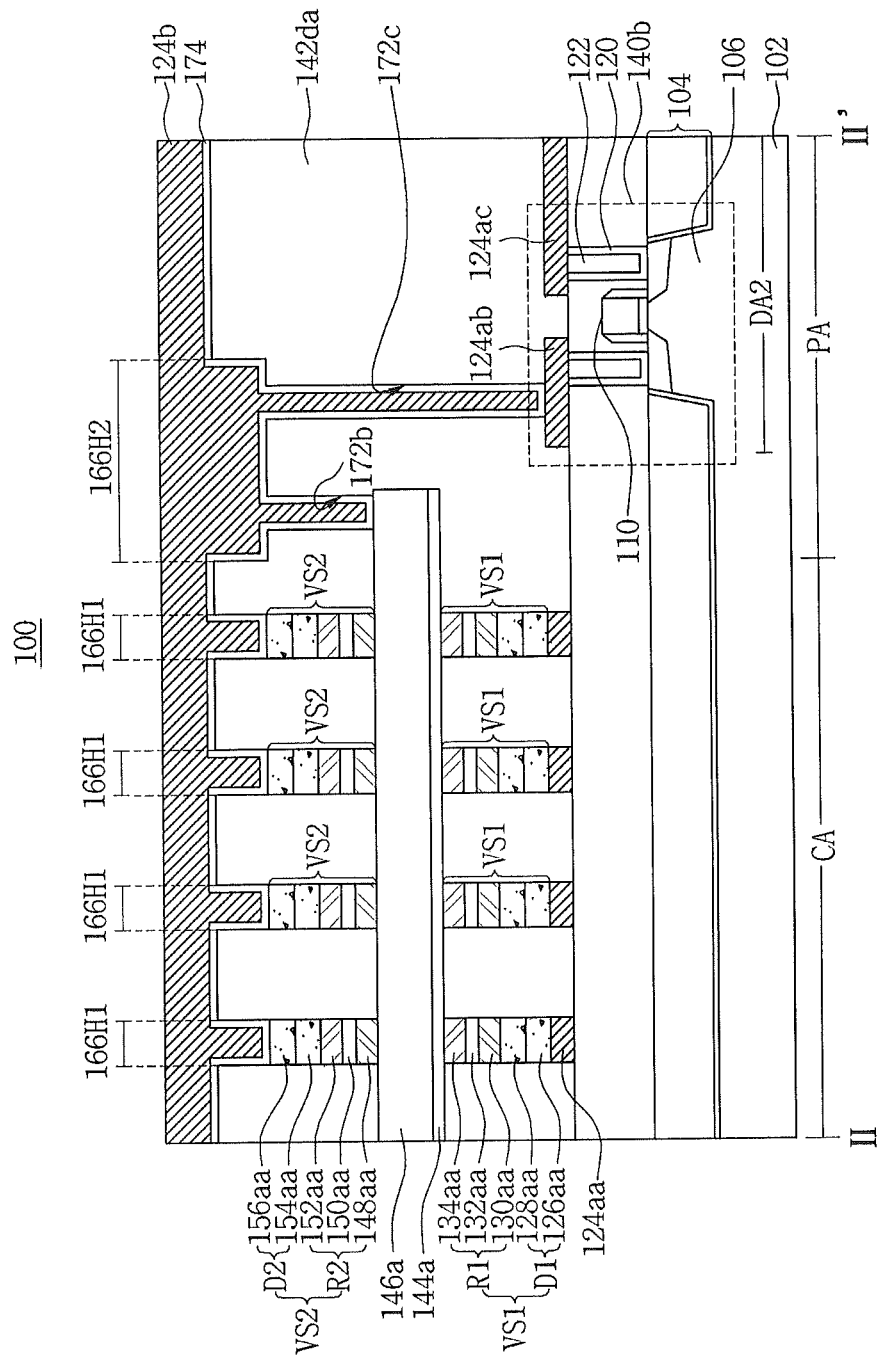
Figure 18C:
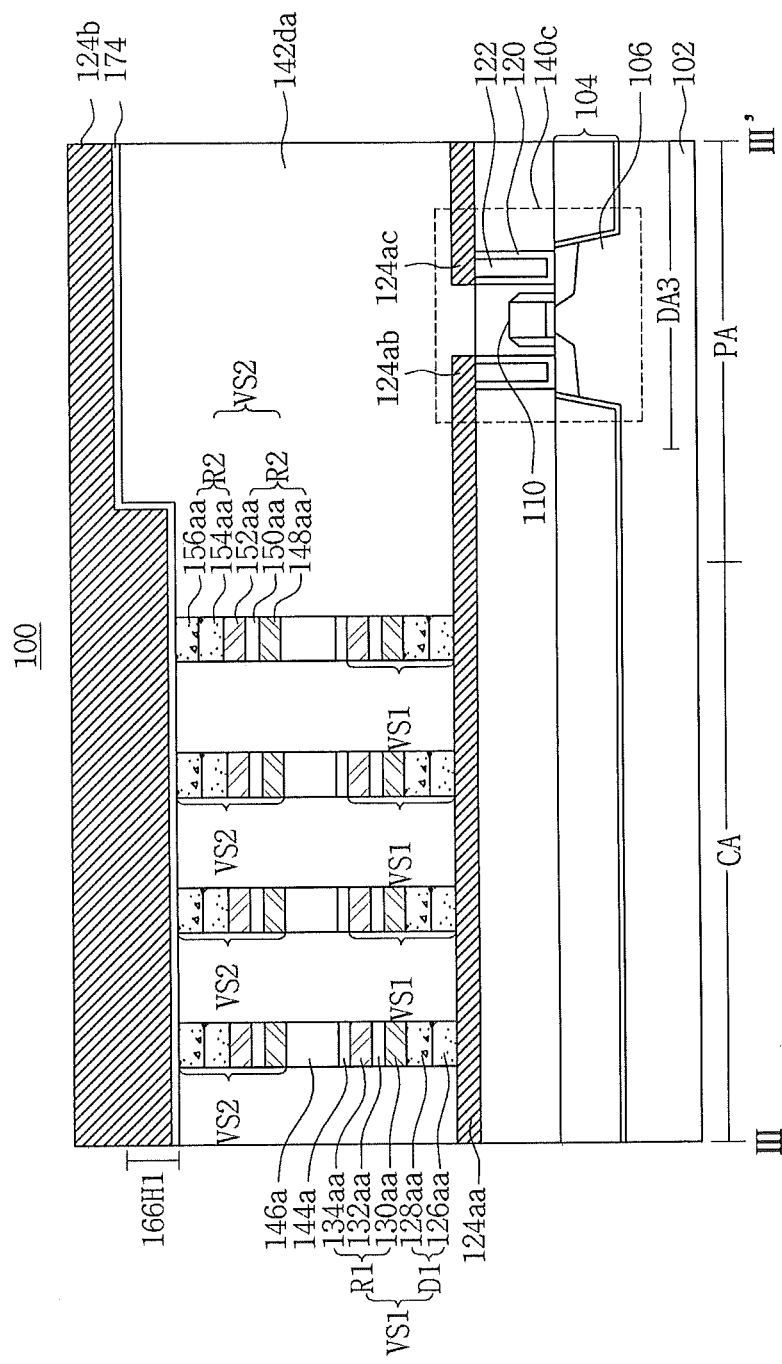
Figure 19A:
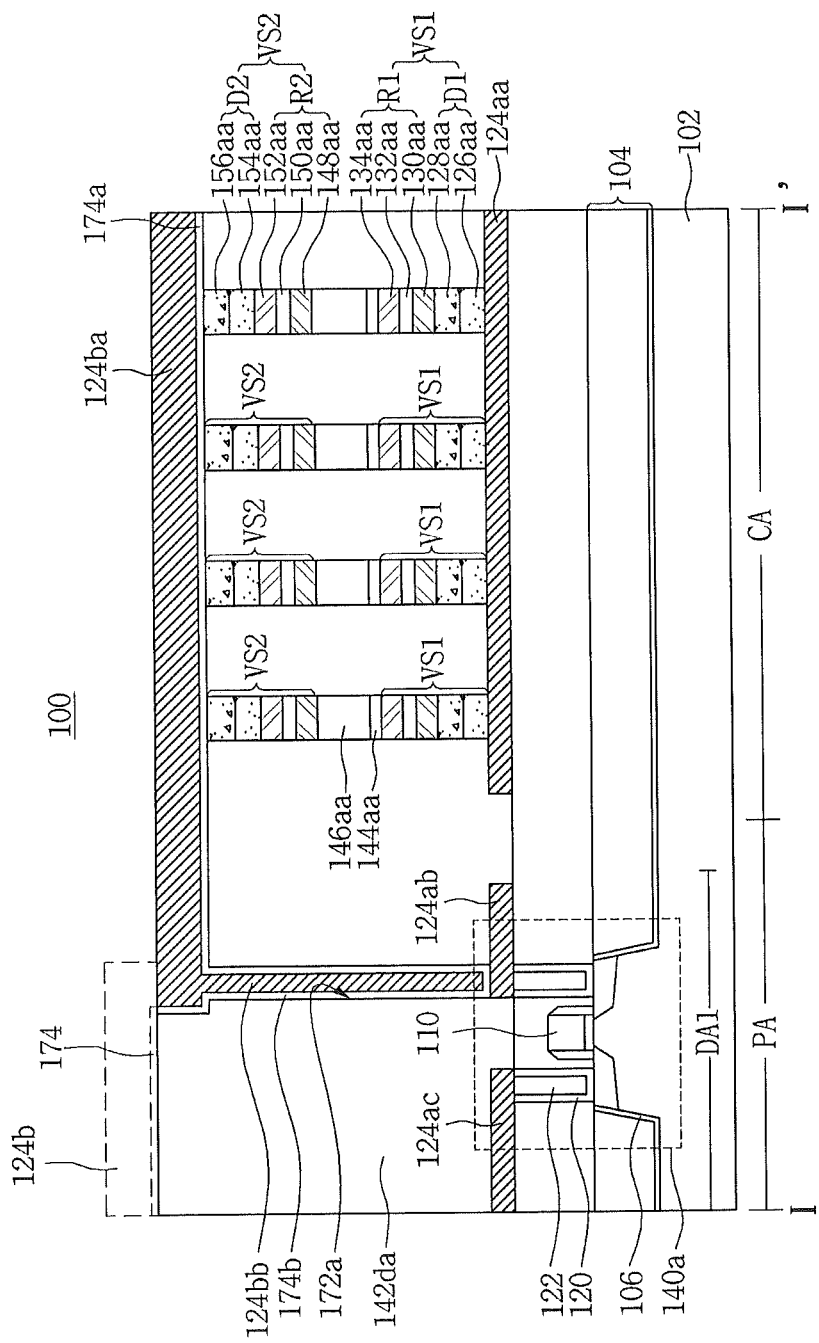
Figure 19B:
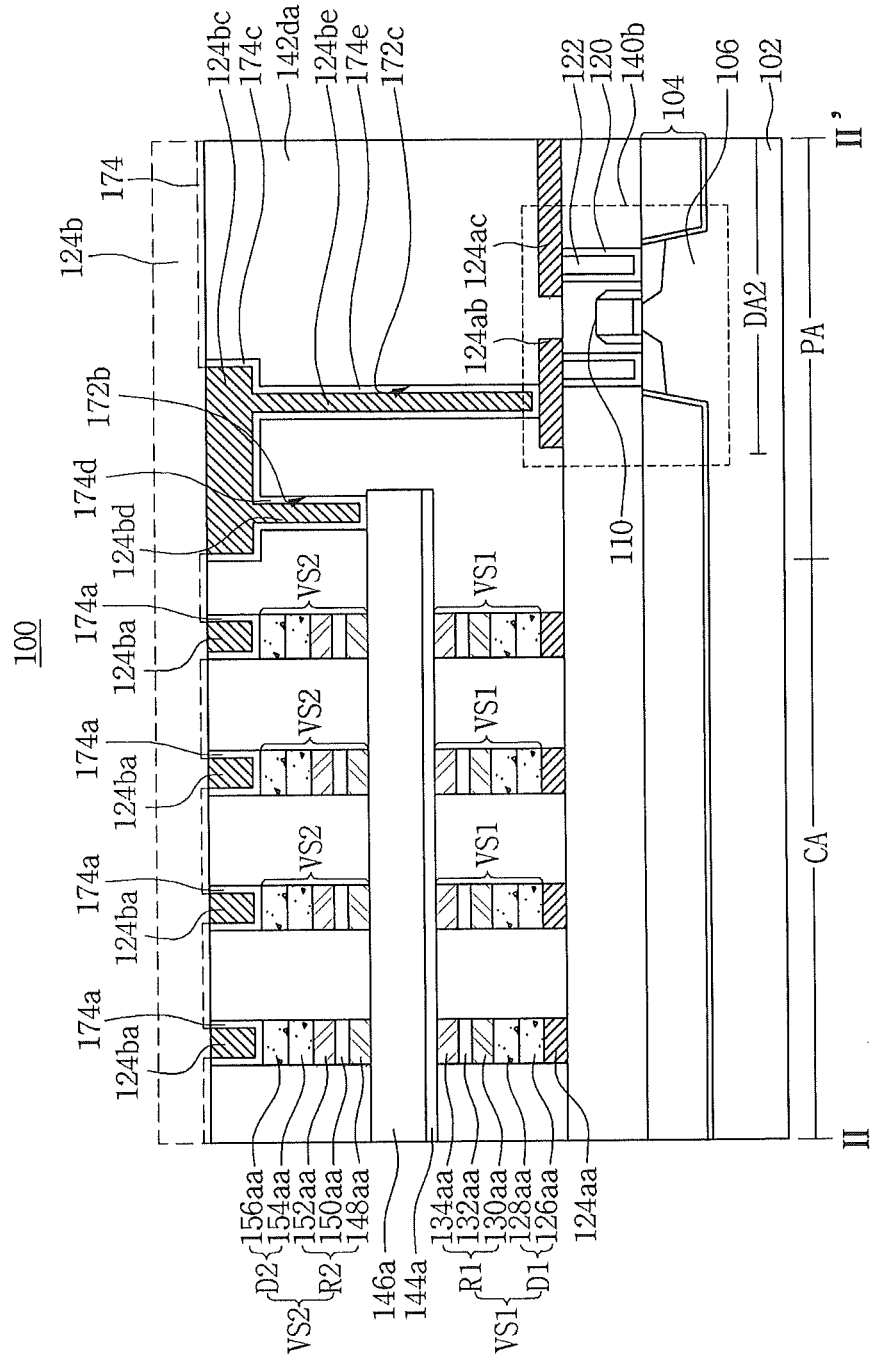
Figure 19C:
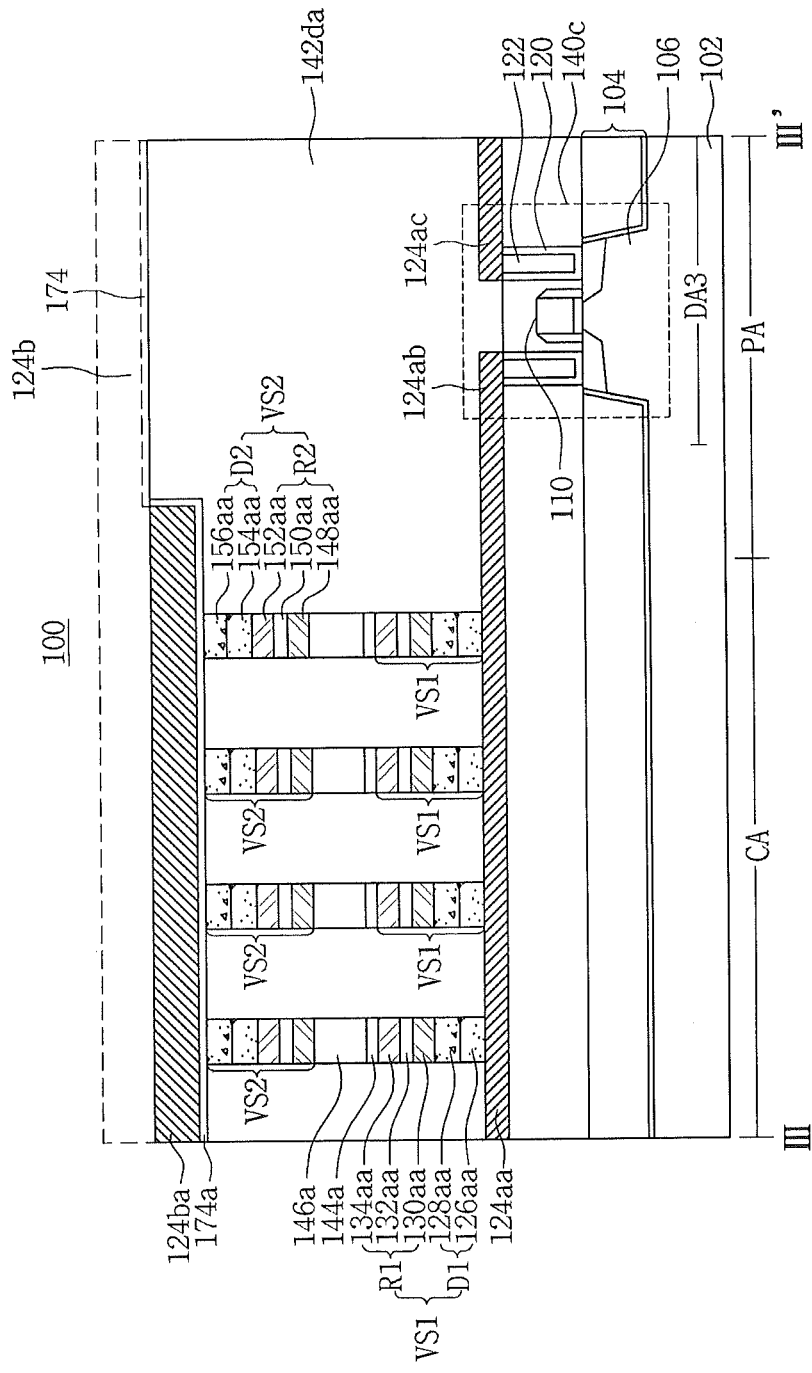

Referring to FIGS. 18A, 18B, and 18C, the method of fabricating the memory device 100 according to the embodiment of the inventive concept may include forming a second barrier layer 174 and a third metal layer 124b over the substrate 102.

The second barrier layer 174 may be in contact with the second bit line groove 166H1, the second bit line contact via 172a, the first floating electrode groove 166H2, the first floating contact via 172b, an inner wall of the second floating contact via 172c, and a surface of the fourth planarization layer 142da.

The third metal layer 124b may be formed on the second planarization layer 142da and fill the second bit line groove 166H1, the second bit line contact via 172a, the first floating electrode groove 166H2, the first floating contact via 172b, and the second floating contact via 172c.

Referring to FIGS. 19A, 19B, 19C, and 2, the method of fabricating the memory device 100 according to the embodiment of the inventive concept may include forming second bit lines 124ba, bit line contact electrodes 124bb, floating electrodes 124bc, first floating contact electrodes 124bd, second floating contact electrodes 124be, second bit line barriers 174a, bit line contact barriers 174b, floating electrode barriers 174c, first floating contact barriers 174d, and second floating contact barriers 174e.

The forming of the second bit lines 124ba, the bit line contact electrodes 124bb, the floating electrodes 124bc, the first floating contact electrodes 124bd, the second floating contact electrodes 124be, the second bit line barriers 174a, the bit line contact barriers 174b, the floating electrode barriers 174c, the first floating contact barriers 174d, and the second floating contact barriers 174e may include a dual damascene process.

More specifically, the dual damascene process may include performing a planarization process on the second barrier layer 174 and the third metal layer 124b illustrated in FIGS. 18A, 18B, and 18c.

Such as described above, using the same process, the second bit line barrier 174a and the second bit lines 124ba may be formed in the second bit line grooves 166H1, the bit line contact barriers 174b and the bit line contact electrodes 124bb may be formed in the bit line contact vias 172a, the floating electrode barrier 174c and the floating electrode 124bc may be formed in the floating electrode groove 166H2, the first floating contact barrier 174d and the first floating contact electrode 124bd may be formed in each of the first floating contact vias 172b, and the second floating contact barriers 174e and the second floating contact electrodes 124be may be formed in each of the second floating contact vias 172c.

The second bit line 124ba and the bit line contact electrode 124bb may be formed as one body. The second bit line barrier 174a and the bit line contact barrier 174b may be formed as one body.

The floating electrode 124bc, the first floating contact electrode 174d, and the second floating contact electrode 124bd may be formed as one body. The floating electrode barrier 174c, first floating contact barrier 174d, and the second floating contact barrier 174e may be formed as one body.

The second bit line 124ba may be electrically connected to the first source/drain electrode 124ab of the first driving transistor 140a through the bit line contact electrode 124bb.

The word line 146a may be electrically connected to the first source/drain electrode 124ab of the second driving transistor 140b through the floating electrode 124bc, and the first and second floating contact electrodes 124bd and 124be.

The memory device in accordance of an embodiment of the inventive concept may be fabricated by the above-described processes.

Figure 20:
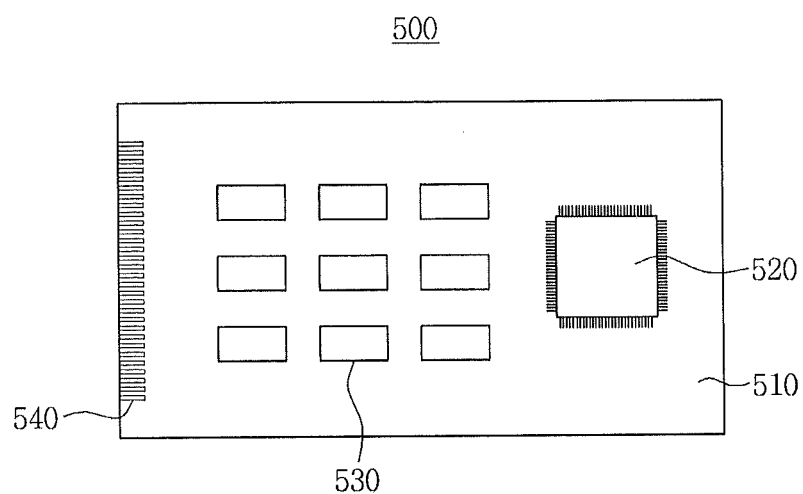
FIG. 20 is a view conceptually illustrating a semiconductor module including a memory device fabricated in accordance with an embodiment of the inventive concept.

FIG. 20 is a view conceptually illustrating a semiconductor module including a memory device fabricated in accordance with an embodiment of the inventive concept.

Referring to FIG. 20, a semiconductor module 500 according to the embodiment of the inventive concept may include memory chips 530 disposed on a semiconductor module substrate 510, and the memory chips 530 may include a memory device 100 according to the embodiment of the inventive concept. The semiconductor module 500 may further include a microprocessor 520 mounted on the module substrate 510. Input/output terminals 54Q may be disposed on at least one side of the module substrate 510. The semiconductor module 500 may include a memory card or a solid state drive (SSD).

Figure 21:
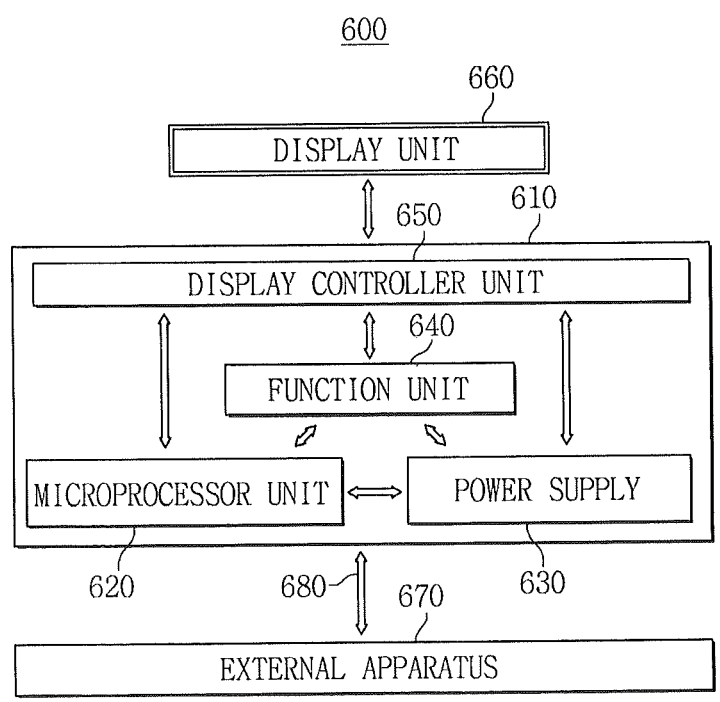
FIGS. 21 and 22 are block diagrams conceptually illustrating electronic systems including memory devices fabricated in accordance with an embodiment of the inventive concept.

FIG. 21 is a block diagram conceptually illustrating an electronic system including memory devices fabricated in accordance with an embodiment of the inventive concept.

Referring to FIG. 21, a memory device 100 according to the embodiment of the inventive concept may be applied to an electronic system 600. The electronic system 600 may include a body 610, a microprocessor 620, a power supply 630, a function unit 640, and/or display controller unit 650. The body 610 may be a system board or mother board having a printed circuit board (PCB) and the like. The microprocessor unit 616, the power supply 630, the function unit 640, and the display controller 650 may be installed or mounted on the body 610. The display unit 660 may be disposed on an upper surface of the body 610 or outside the body 610. For example, the display unit 660 may be disposed on a surface of the body 610 and display an image processed by the display controller 650. The power supply 630 may receive a certain voltage from an external power source and divide the certain voltage into various voltage levels, and then supply the various voltage levels to the microprocessor 620, the function unit 640, the display controller 650 and the like. The microprocessor 620 may receive a voltage from the power supply 630 to control the function unit 640 and the display unit 660. The function unit 640 may perform various functions of the electronic system 600. For example, when the electronic system 600 is a mobile electronic device such as a mobile phone, the function unit 640 may include various components which perform wireless communication functions such as output a moving picture on the display unit 660, output a voice to a speaker, and the like by dialing or communication with external apparatus 670. When a camera is included, it may serve as an image processor. In an applicable embodiment, when the electronic system 600 is connected to a memory card to expand a capacity, the function unit 640 may serve as a memory card controller. The function unit 640 may exchange signals with an external apparatus 670 through a wired or wireless communication unit 680. Further, when the electronic system 600 may require a universal serial bus (USB) to expand functions, the function unit 640 may serve as an interface controller. The semiconductor device 100 fabricated by the embodiments of the inventive concept may be included in the function unit 640.

Figure 22:
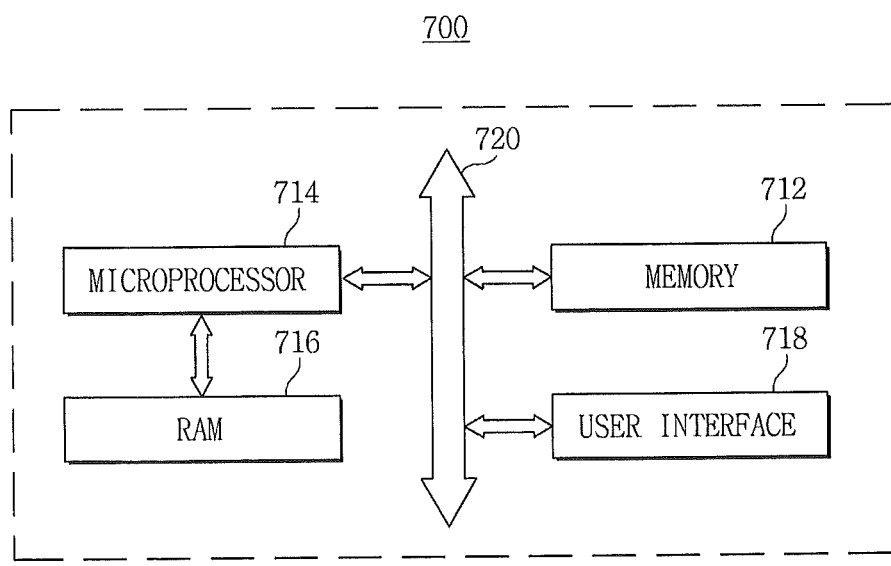

FIG. 22 is a block diagram schematically illustrating an electronic system including memory devices fabricated in accordance with an embodiment of the inventive concept.

Referring to FIG. 22, an electronic system 700 may include the memory device 100 fabricated by embodiments of the inventive concept.

The electronic system 700 may be applied to a mobile electronic device or computer. For example, the electronic system 700 may include a user interface 718 which perform data communication using a memory system 712, a microprocessor 714, a random access memory (RAM) 716, and a bus 720. The microprocessor 714 may program and control the electronic system 700. The RAM 716 may be used as an operating memory of the microprocessor 714. For example, the microprocessor 714 or the RAM 716 may include the semiconductor device 100 in according to the embodiment of the inventive concept.

The microprocessor 714, the RAM 716 and/or other components may be assembled in a single package. The user interface 718 may input data into the electronic system 700 or output data from the electronic system 700. The memory system 712 may store operating codes of the microprocessor 714, data processed by the microprocessor 714, or external input data. The memory system 712 may include a controller and a memory.

Figure 23:
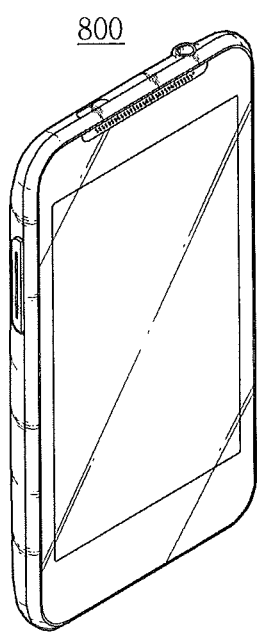
FIG. 23 is a view illustrating a mobile electronic device including a memory device fabricated in accordance with an embodiment of the inventive concept.

FIG. 23 is a schematic block diagram of a mobile electronic device including a memory device fabricated in accordance with embodiments of the inventive concept.

A mobile electronic device 800 may be understood as a tablet PC. In addition, the memory device 100 fabricated by various embodiments of the inventive concept may be used for a portable computer such as a notebook, an mpeg-1 audio layer 3 (MP3) player, an MP4 player, a navigation device, a solid state disk (SSD), a table computer, a vehicle and a home electric device in addition to the tablet PC.

A method of fabricating a memory device in accordance with embodiments of the inventive concept may form contact electrodes which electrically connect signal lines (word lines and bit lines) located at different heights from each other with driving transistors formed on the same plane, and the signal lines (word lines and bit lines) located at the uppermost layer of a substrate between the signal lines as a single process.

Since the signal lines and the contact electrodes are formed as a single process, thereby reducing the number of mask processes.

Since the number of mask processes can be reduced, thereby reducing a process time for fabricating a memory device, and improving a yield.

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A method of fabricating a memory device, comprising:
   forming driving transistors in a driving region within a substrate;
   forming a first bit line in a cell region of the substrate, a first unit memory cell on an upper surface of the first bit line, a word line on upper surfaces of the first unit memory cell, and a second unit memory cell on an upper surface of the word line;
   forming a planarization layer that fills a space between the second unit memory cells, and including second bit line grooves on the first bit lines, bit line contact vias in the second bit line grooves, floating electrode grooves on ends of the word lines, and a first floating contact via and a second floating contact via in each of the floating electrode grooves; and
   forming second bit lines in the second bit line grooves, bit line contact electrodes in the bit line contact vias, floating electrodes in the floating electrode grooves, first floating contact electrodes in the first floating contact vias, and second floating contact electrodes in the second floating contact vias.

2. The method of claim 1, wherein said forming driving transistors comprises forming first driving transistors spaced from an end of the second bit line, forming second driving transistors spaced from an end of the word lines, and forming third driving transistors spaced from the first driving transistors in a horizontal direction and adjacent to an end of the first bit lines.

3. The method of claim 2, wherein each of the first driving transistor, the second driving transistor, and the third driving transistor comprises an active pattern, a gate electrode, a first source/drain electrode, and a second source/drain electrode.

4. The method of claim 3, wherein the bit line contact electrode is formed to connect the second bit line with the first source/drain electrode of the first driving transistor, the first floating contact electrode is formed to connect the floating electrode with the word line, and the second floating contact electrode is formed to connect the floating electrode with the first source/drain electrode of the second driving transistor.

5. The method of claim 1, wherein the forming of the first unit memory cell comprises forming a first diode and a first variable resistance device connected in series between the first bit line and the word line, and the forming of the second unit memory cell comprises forming a second variable resistance device and a second diode connected in series between the word line and the second bit line.

6. The method of claim 5, wherein the forming of the first bit lines, the first diodes, the first variable resistance devices, and the word lines comprises:
   stacking a first metal layer, a first impurity layer, a second impurity layer, a first electrode layer, a first resistance layer, and a second electrode layer on the substrate;
   forming the first bit lines extending in a first direction and spaced in a second direction in the cell region by patterning the first metal layer;
   forming first preliminary vertical structures stacked on the first bit lines, and including a first preliminary impurity pattern, a second preliminary impurity pattern, a first preliminary electrode pattern, a first preliminary variable resistance pattern, and a second preliminary electrode pattern;
   wherein the first preliminary impurity pattern, a second preliminary impurity pattern, a first preliminary electrode pattern, a first preliminary variable resistance pattern, and a second preliminary electrode pattern are formed by patterning the first impurity layer, the second impurity layer, a first electrode layer, the first resistance layer, and the second electrode layer;
   stacking a second metal layer, a third impurity layer, a fourth impurity layer, a third electrode layer, a second resistance layer, and a fourth electrode layer on upper surfaces of the first preliminary vertical structures;
   forming the word lines that vertically cross the first bit lines and the first preliminary vertical structures by patterning the second metal layer;
   forming a second preliminary vertical structures including the first preliminary impurity pattern, the second preliminary impurity pattern, a third preliminary electrode pattern, a second preliminary variable resistance pattern, and a fourth preliminary electrode pattern stacked on each of the word lines;

wherein the first preliminary impurity pattern, the second preliminary impurity pattern, a third preliminary electrode pattern, a second preliminary variable resistance pattern, and a fourth preliminary electrode pattern are formed by patterning the third impurity layer, the fourth impurity layer, the third electrode layer, the second resistance layer, and the fourth electrode layer;

exposing an end of the word line by removing a part of the second preliminary vertical structure on the end of the word line; and forming the first diode including a first impurity pattern and a second impurity pattern and the first variable resistance device including a first electrode, a first variable resistor, and a second electrode by patterning the first preliminary vertical structure.

7. The method of claim 6, wherein the forming of the second variable resistance device and the second diode comprises:

forming a first planarization layer that fills a space between the second preliminary vertical structures;

forming a second bit line mask pattern having the same shape as the first bit lines on an upper surface of the second preliminary vertical structures, and forming a floating electrode mask pattern whose part corresponds to the exposed end of the word line; and forming the second diode including a third impurity pattern and a fourth impurity pattern, and the second variable resistance device including a third electrode, a second variable resistor and a fourth electrode by patterning the second preliminary vertical structure in the same shape as the second bit line mask pattern.

8. The method of claim 7, wherein the forming of the planarization layer including the second bit line groove, the floating electrode groove, the bit line contact via, the first floating contact via, and the second floating electrode via comprises:

forming a planarization layer that fills spaces between second memory cells including the second variable resistance device and the second diode, and between the second bit line mask pattern and the floating electrode mask pattern, and has the same surface as surfaces of the bit line mask pattern and the floating electrode mask pattern;

forming the second bit line groove in the planarization layer by removing the second bit line mask pattern, and forming the floating electrode groove in the planarization layer by removing the floating electrode mask patterns; and forming a second bit line contact via that passes through the planarization layer on a bottom of the second bit line groove, and forming a first floating contact via and a second floating contact via, which pass through the planarization layer, on a bottom of the floating electrode groove.

9. The method of claim 8, wherein the second bit line mask pattern and the floating electrode mask pattern comprise silicon nitride, and the planarization layer comprises silicon oxide.

10. A method of fabricating a memory device, comprising:

defining a cell region, a driving region and a peripheral region in a substrate;

forming first driving transistors, second driving transistors and third driving transistors, each of which includes an active pattern, a gate electrode, first and second source/drain electrodes, on the same plane in the driving region;

forming first bit lines whose end is a first source/drain electrode of the first driving transistor, word lines whose end is spaced from a first source/drain electrode of the second driving transistor, the first unit memory cells between the first bit lines and the word lines, and the second unit memory cells between the word lines and second bit lines in the cell region;

forming a planarization layer configured to expose surfaces of the second unit memory cells, and including second bit line grooves corresponding to upper surfaces of the first bit lines and floating electrode grooves which covers an upper surface of an end of the word line and an upper surface of the first source/drain electrode of the second driving transistor;

forming bit line contact vias that pass through a planarization layer being bottoms of the second bit line grooves, and first floating contact vias and second floating contact vias, which pass through a planarization layer being a bottom of the floating electrode groove; and forming second bit lines that fill the second bit line grooves, bit line contacts that fill the bit line contact vias, floating electrodes that fill the floating electrode grooves, and first floating contact electrodes and second floating contact electrodes that fill the first floating electrode vias and the second floating electrode vias, respectively.

11. The method of claim 10, wherein the second bit line and a second bit line contact electrode are formed as one body, and the floating electrode, a first floating contact electrode and the second floating contact electrode are formed as one body.

12. The method of claim 11, further comprising forming a second bit line barrier under the second bit line, forming a second bit line contact barrier under the second bit line contact electrode, forming a floating electrode barrier under the floating electrode and a first floating contact barrier under the first floating contact electrode, and forming a second floating contact barrier under the second floating contact electrode.

13. The method of claim 12, wherein the floating electrode barrier, the first floating contact barrier, and the second floating contact barrier are formed as one body.

14. The method of claim 10, further comprising forming a word line barrier under the word line.

15. The method of claim 10, wherein a first source/drain electrode of the third driving transistor is an end of each of the first bit lines.

* * * * *